(12) United States Patent
Mori et al.

(10) Patent No.: US 10,217,862 B2
(45) Date of Patent: *Feb. 26, 2019

(54) SEMICONDUCTOR DEVICE AND MANUFACTURING METHOD THEREOF

(71) Applicant: Renesas Electronics Corporation, Tokyo (JP)

(72) Inventors: Takahiro Mori, Ibaraki (JP); Hiroki Fujii, Ibaraki (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/837,520

(22) Filed: Dec. 11, 2017

(65) Prior Publication Data

US 2018/0102431 A1 Apr. 12, 2018

Related U.S. Application Data

(63) Continuation of application No. 15/172,264, filed on Jun. 3, 2016, now Pat. No. 9,859,416.

(30) Foreign Application Priority Data

Jul. 23, 2015 (JP) .................................. 2015-145601

(51) Int. Cl.
*H01L 21/00* (2006.01)
*H01L 29/78* (2006.01)
(Continued)

(52) U.S. Cl.
CPC .... *H01L 29/7823* (2013.01); *H01L 21/02164* (2013.01); *H01L 21/02233* (2013.01);
(Continued)

(58) Field of Classification Search
CPC ............. H01L 29/7823; H01L 29/0611; H01L 29/0653; H01L 29/0882; H01L 29/401;
(Continued)

(56) References Cited

U.S. PATENT DOCUMENTS 6,268,243 B1 * 7/2001 Park .................. H01L 27/10885
257/E21.657
8,357,986 B2 1/2013 Wang et al.
(Continued)

FOREIGN PATENT DOCUMENTS

JP   2003-31804 A    1/2003
JP   2006-108208 A   4/2006
(Continued)

OTHER PUBLICATIONS

Japanese Office Action issued in Japanese Application No. 2015-145601 dated Dec. 11, 2018.

*Primary Examiner* — Nicholas J Tobergte
(74) *Attorney, Agent, or Firm* — Sughrue Mion, PLLC

(57) ABSTRACT

A semiconductor device including an isolation insulating film having a first thickness that is located between a drain region and a source region; a gate electrode formed over a region located between the isolation insulating film and the source region and that includes a part serving as a channel; an interlayer insulating film formed so as to cover the gate electrode; and a contact plug formed to reach the inside of the isolation insulating film while penetrating the interlayer insulating film, wherein the contact plug includes a buried part that is formed from the surface of the isolation insulating film up to a depth corresponding to a second thickness thinner than the first thickness.

20 Claims, 64 Drawing Sheets

(51) Int. Cl.
| | |
|---|---|
| *H01L 29/423* | (2006.01) |
| *H01L 29/06* | (2006.01) |
| *H01L 29/08* | (2006.01) |
| *H01L 29/66* | (2006.01) |
| *H01L 21/02* | (2006.01) |
| *H01L 21/311* | (2006.01) |
| *H01L 29/40* | (2006.01) |
| *H01L 29/10* | (2006.01) |

(52) U.S. Cl.
CPC ...... *H01L 21/02255* (2013.01); *H01L 21/311* (2013.01); *H01L 29/0611* (2013.01); *H01L 29/0653* (2013.01); *H01L 29/0692* (2013.01); *H01L 29/0882* (2013.01); *H01L 29/1083* (2013.01); *H01L 29/401* (2013.01); *H01L 29/402* (2013.01); *H01L 29/404* (2013.01); *H01L 29/407* (2013.01); *H01L 29/423* (2013.01); *H01L 29/4238* (2013.01); *H01L 29/42368* (2013.01); *H01L 29/66681* (2013.01); *H01L 29/7816* (2013.01); *H01L 29/7824* (2013.01); *H01L 29/7835* (2013.01); *H01L 29/063* (2013.01); *H01L 29/1045* (2013.01)

(58) Field of Classification Search
CPC ............. H01L 29/423; H01L 29/42368; H01L 29/66681; H01L 21/02164; H01L 21/02233; H01L 21/02255; H01L 21/311
See application file for complete search history.

(56) References Cited

U.S. PATENT DOCUMENTS

| | | | |
|---|---|---|---|
| 9,859,416 B2* | 1/2018 | Mori | ............... H01L 29/7823 |
| 2006/0071273 A1 | 4/2006 | Hiroki | |
| 2006/0278924 A1 | 12/2006 | Kao | |
| 2007/0080389 A1 | 4/2007 | Petruzzello et al. | |
| 2009/0256212 A1 | 10/2009 | Denison et al. | |
| 2009/0283825 A1 | 11/2009 | Wang et al. | |
| 2010/0163992 A1 | 7/2010 | Kim | |
| 2013/0175615 A1 | 7/2013 | Uhlig et al. | |
| 2013/0277742 A1 | 10/2013 | Lee et al. | |
| 2014/0339632 A1 | 11/2014 | Yu | |
| 2015/0364598 A1 | 12/2015 | Jung et al. | |
| 2016/0064552 A1 | 3/2016 | Cheng et al. | |

FOREIGN PATENT DOCUMENTS

| | | |
|---|---|---|
| JP | 2009-278100 A | 11/2009 |
| JP | 2010-80892 A | 4/2010 |
| JP | 2013-115166 A | 6/2013 |
| JP | 2014-107302 A | 6/2014 |

* cited by examiner

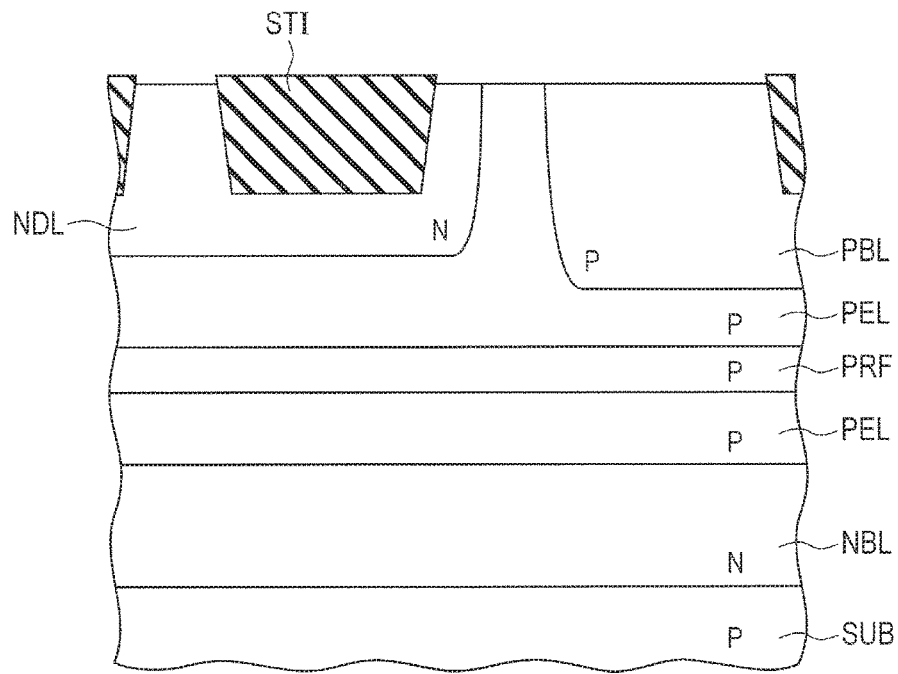
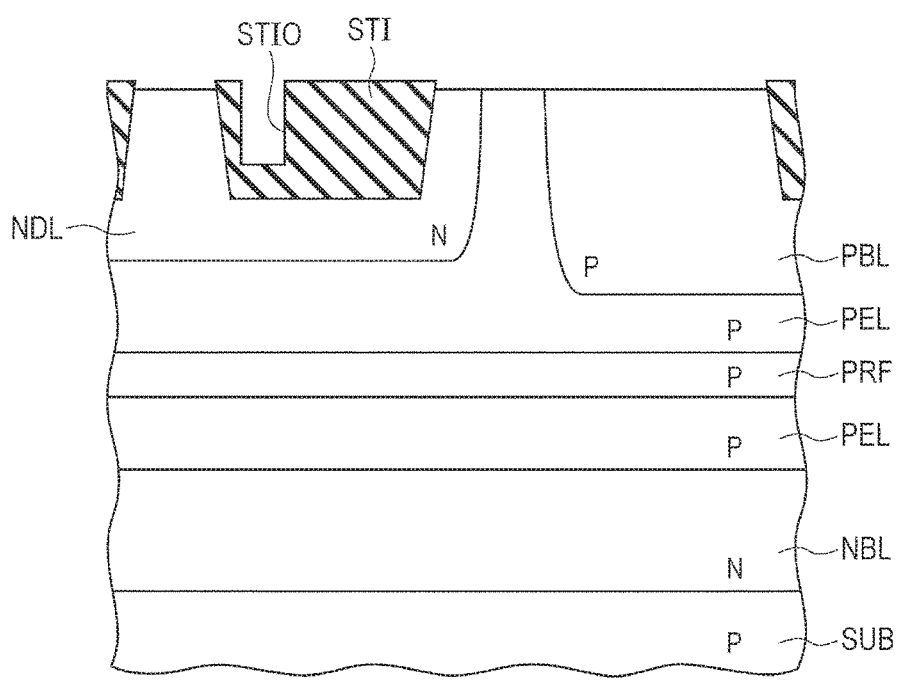

SEMICONDUCTOR DEVICE AND MANUFACTURING METHOD THEREOF

CROSS-REFERENCE TO RELATED APPLICATIONS

This application is a Continuation of U.S. application Ser. No. 15/172,264, filed Jun. 3, 2016, claiming priority from Japanese Patent Application No. 2015-145601, filed on Jul. 23, 2015, which are incorporated herein by reference in their entirety.

BACKGROUND

The present invention relates to a semiconductor device and a manufacturing method thereof, and can be preferably used in a semiconductor device having, for example, an LDMOSFET.

A semiconductor device having an LDMOSFET (Laterally Diffused Metal-Oxide-Semiconductor Field Effect Transistor: hereinafter, referred to as a "lateral MOS transistor") is one of those for electric power for which high pressure resistance is required. For example, in a semiconductor device disclosed in Japanese Unexamined Patent Application Publication No. 2006-108208, an electric field control electrode is formed on a part of a field oxide film located between a gate electrode and a drain electrode. A voltage controlled independently from the gate electrode is applied to the electric field control electrode. An electron accumulation layer is formed at the interface between the field oxide film and an N-well diffusion layer by applying a high voltage to the electric field control electrode. Accordingly, ON-resistance can be reduced.

Further, in a semiconductor device disclosed in Japanese Unexamined Patent Application Publication No. 2014-107302, a p-type drift region and an insulating region are formed between a channel formation region and a drain region. A gate electrode is formed so as to extend from the channel formation region to the insulating region by interposing a gate insulating film while having an opening exposing the interface part between the channel formation region and the insulating region, and the reliability of the gate insulating film can be improved by forming the opening at the gate electrode.

Further, in a semiconductor device disclosed in Japanese Unexamined Patent Application Publication No. 2009-278100, an orthogonal gate electrode having a gate electrode folded into an STI (Shallow Trench Isolation) oxide film region is formed. The orthogonal gate electrode reduces a capacity overlapped between a gate and a drain, and the switching time can be made faster.

SUMMARY

As described above, various proposals have been made to improve electric characteristics in a traditional semiconductor device having a lateral MOS transistor. As part thereof, electric characteristics such as ON-resistance or an ON-breakdown voltage of a semiconductor device having a lateral MOS transistor are further improved.

The other objects and novel characteristics will become apparent from the description of the specification and accompanying drawings.

A semiconductor device according to an embodiment includes a semiconductor substrate, a first-conductive-type first semiconductor layer, a second-conductive-type drain region, a second-conductive-type source region, an isolation insulating film, a second-conductive-type drift layer, a gate electrode, and a buried electrode. The isolation insulating film is formed at a part of the first semiconductor layer located between the drain region and the source region, and has a first thickness. The gate electrode is formed over a region located between the isolation insulating film and the source region and including a part serving as a channel. The buried electrode is formed at a part of the isolation insulating film located between the drain region and the gate electrode at a distance away from the drain region and the gate electrode. The buried electrode includes a buried part that is formed from the surface of the isolation insulating film up to a depth corresponding to a second thickness thinner than the first thickness.

A manufacturing method of a semiconductor device according to another embodiment includes the following steps. A first-conductive-type first semiconductor layer is formed over the primary surface of a semiconductor substrate. An isolation insulating film having a first thickness is formed over the first semiconductor layer. A second-conductive-type drift layer is formed. An opening having a depth corresponding to a second thickness thinner than the first thickness is formed from the surface of the isolation insulating film. A conductive film is formed so as to fill the opening. A gate electrode is formed over the first semiconductor layer so as to extend from the isolation insulating film by etching the conductive film, and a buried electrode having a part of the conductive film located at the opening as a buried part is formed in the isolation insulating film. A second-conductive-type drain region is formed, and a second-conductive-type source region is formed.

According to a semiconductor device of an embodiment, electric characteristics such as an ON-breakdown voltage can be improved.

According to a manufacturing method of a semiconductor device of another embodiment, it is possible to obtain a semiconductor device by which electric characteristics such as an ON-breakdown voltage can be improved.

BRIEF DESCRIPTION OF THE DRAWINGS

FIG. 3 is a cross-sectional view for showing a step of a manufacturing method of the semiconductor device in the first embodiment;

FIG. 4 is a cross-sectional view for showing a step performed after the step shown in FIG. 3 in the first embodiment;

DETAILED DESCRIPTION

First Embodiment

Here, a semiconductor device having a lateral MOS transistor and a manufacturing method thereof by which an ON-breakdown voltage can be improved as one of electric characteristics will be described.
(Semiconductor Device)

Figure 1:
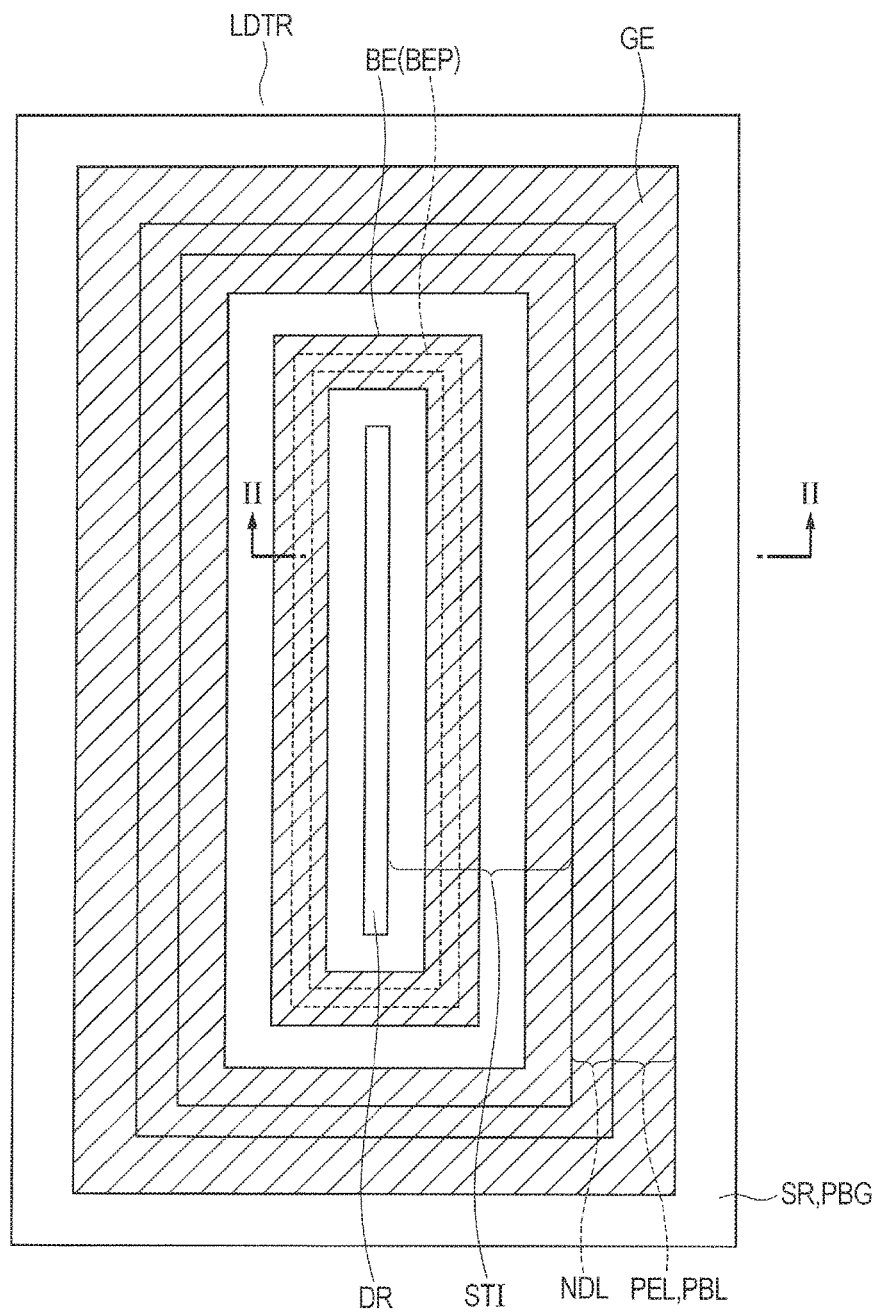
FIG. 1 is a plan view of a semiconductor device according to a first embodiment.
Figure 2:
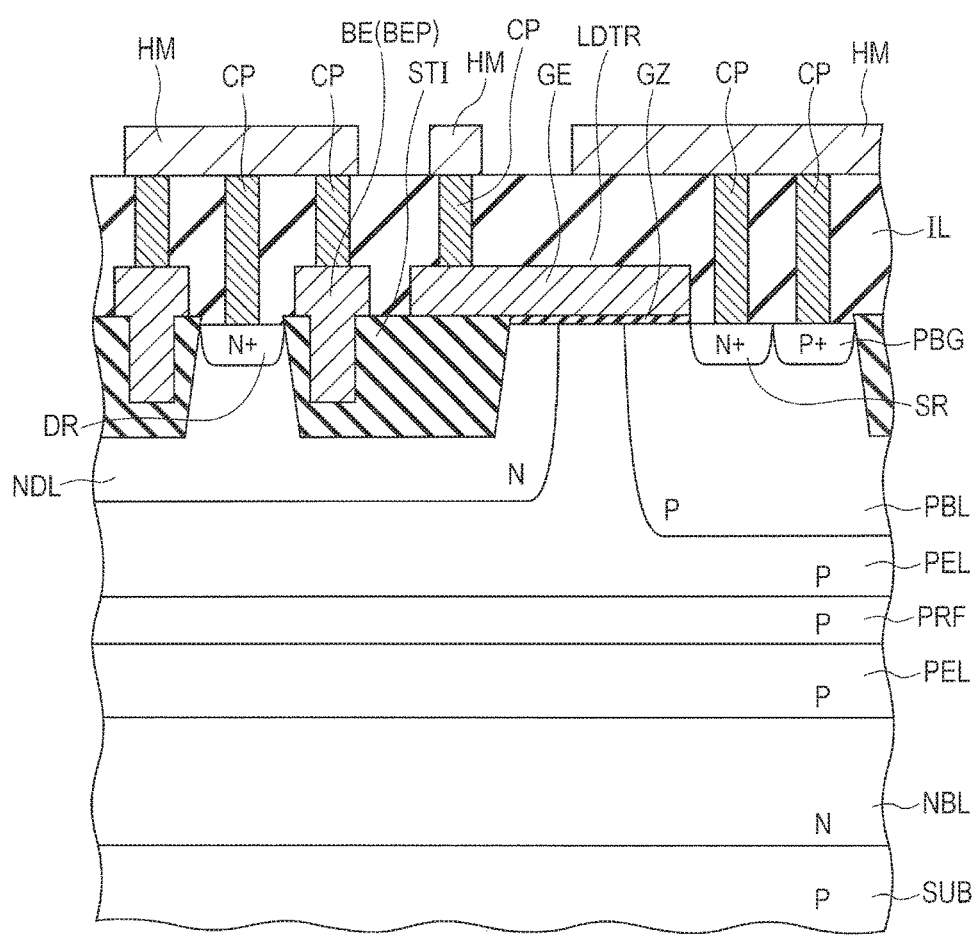
FIG. 2 is a cross-sectional view taken along the cross-sectional line II-II shown in FIG. 1 in the first embodiment.

As shown in FIG. 1 and FIG. 2, in a semiconductor device having a lateral MOS transistor LDTR, a p-type epitaxial layer PEL is formed on the surface of a p-type semiconductor substrate SUB. An n-type buried layer NBL and a p-type RESURF layer PRF are formed in the p-type epitaxial layer.

An n-type drain region DR is formed from the surface of the p-type epitaxial layer PEL up to a predetermined depth. The drain region DR is formed so as to extend in one direction on the surface of the p-type epitaxial layer PEL. An n-type source region SR is formed from the surface of the p-type epitaxial layer PEL up to a predetermined depth at a distance away from the drain region DR.

An isolation insulating film STI having a predetermined thickness (first thickness) is formed on a part of the p-type epitaxial layer PEL located between the drain region DR and the source region SR. The isolation insulating film STI is formed in a trench by the STI (Shallow Trench Isolation) method. The isolation insulating film STI is continuously formed so as to surround the drain region DR on the surface of the p-type epitaxial layer PEL.

An n-type drift layer NDL is formed from the surface of the p-type epitaxial layer PEL up to a position deeper than the bottom of the isolation insulating film STI so as to surround the drain region DR and the isolation insulating film STI from the lateral and lower sides.

A p+ layer PBG is formed from the surface of a part pf the p-type epitaxial layer PEL on the lateral side of the source region SR up to a predetermined depth. A p-type body layer PBL is formed from the surface of the p-type epitaxial layer PEL up to a predetermined depth so as to surround the source region SR and the p+ layer PBG from the lateral and lower sides.

A gate electrode GE is formed by interposing a gate insulating film GZ on a region that includes a part of the p-type epitaxial layer PEL and a part of the p-type body layer PBL serving as channels and that is located between the isolation insulating film STI and the source region SR.

A buried electrode BE is formed at a part of the isolation insulating film STI located between the drain region DR and the gate electrode GE. The buried electrode BE is provided at a distance away from each of the gate electrode GE and the drain region DR. The buried electrode BE includes a buried part BEP. The buried part BEP is formed from the surface of the isolation insulating film STI up to a depth corresponding to a thickness (second thickness) thinner than the thickness (first thickness) of the isolation insulating film STI. Further, the buried part BEP is formed so as to continuously surround the drain region DR in the isolation insulating film STI.

An interlayer insulating film IL is formed so as to cover the gate electrode GE, the buried electrode BE, and the like. A plurality of contact plugs CP penetrating the interlayer insulating film IL is formed. A plurality of wirings HM is formed on the surface of the interlayer insulating film IL. In particular, the buried electrode BE and the drain region DR are electrically coupled to each other through the contact plugs CP and the wirings HM in the semiconductor device. The voltage same as that applied to the drain region DR is applied to the buried electrode BE. The primary parts of the semiconductor device are configured as described above.
(Manufacturing Method)

Next, an example of a manufacturing method of the above-described semiconductor device will be described. First, as shown in FIG. 3, the p-type epitaxial layer PEL is formed on the surface of the p-type semiconductor substrate SUB, and the n-type buried layer NBL and the p-type RESURF layer PRF are formed in the p-type epitaxial layer PEL. Next, the isolation insulating film STI is formed in the trench of the p-type epitaxial layer PEL by the STI method. The isolation insulating film STI is formed so as to surround a region where a drain region is to be formed.

Next, the n-type drift layer NDL and the p-type body layer PBL are formed by, for example, an ion implantation method. It should be noted that the n-type drift layer NDL and the p-type body layer PBL may be formed before the isolation insulating film STI is formed. The n-type drift layer NDL is formed so as to surround the isolation insulating film STI from the lateral and lower sides. Further, the p-type body layer PBL is formed so as to surround the n-type drift layer NDL on the surface of the p-type epitaxial layer at a distance away from the n-type drift layer NDL.

Figure 5:
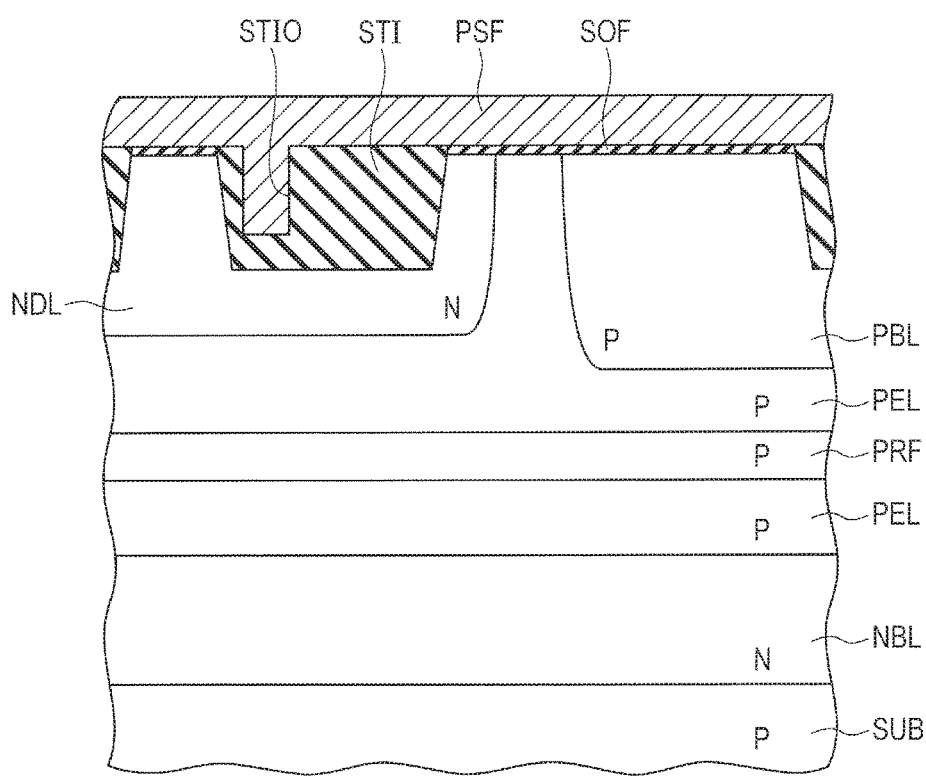
FIG. 5 is a cross-sectional view for showing a step performed after the step shown in FIG. 4 in the first embodiment.

Next, as shown in FIG. 4, an opening STIO is formed in the isolation insulating film STI by performing a predetermined photoengraving process and etching process. The opening STIO is formed in the isolation insulating film STI so as to surround a region where a drain region is to be formed. Next, as shown in FIG. 5, a silicon oxide film SOF is formed on the surfaces of the p-type epitaxial layer PEL and the like by performing a thermo-oxidative process. It should be noted that the silicon oxide film SOF may be formed before the isolation insulating film STI is formed. Next, a polysilicon film PSF is formed in such a manner that the opening STIO is filled with the polysilicon film PSF so as to cover the silicon oxide film SOF by, for example, the CVD (Chemical Vapor Deposition) method.

Figure 6:
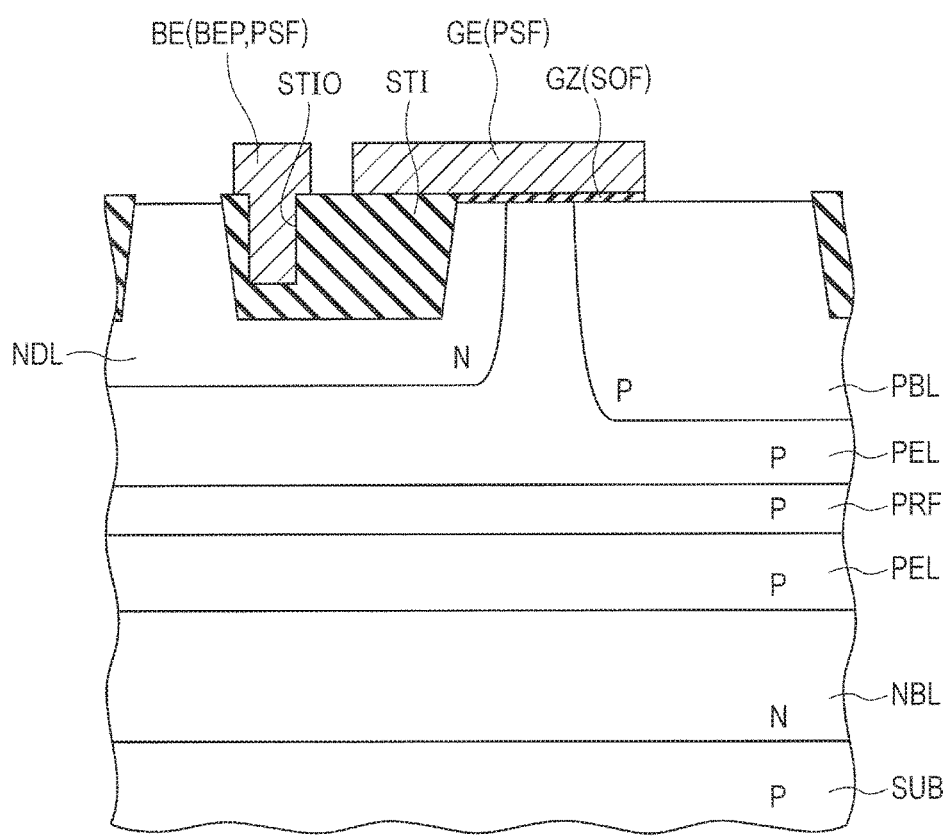
FIG. 6 is a cross-sectional view for showing a step performed after the step shown in FIG. 5 in the first embodiment.

Next, as shown in FIG. 6, the gate electrode GE and the buried electrode BE are formed by performing the predetermined photoengraving process and etching process. A part of the polysilicon film PSF filled in the opening STIO corresponds to the buried part BEP in the buried electrode BE. The buried electrode BE is formed so as to surround a region serving as a drain region, and the gate electrode GE is formed so as to surround the buried electrode BE (see FIG. 1).

Figure 7:
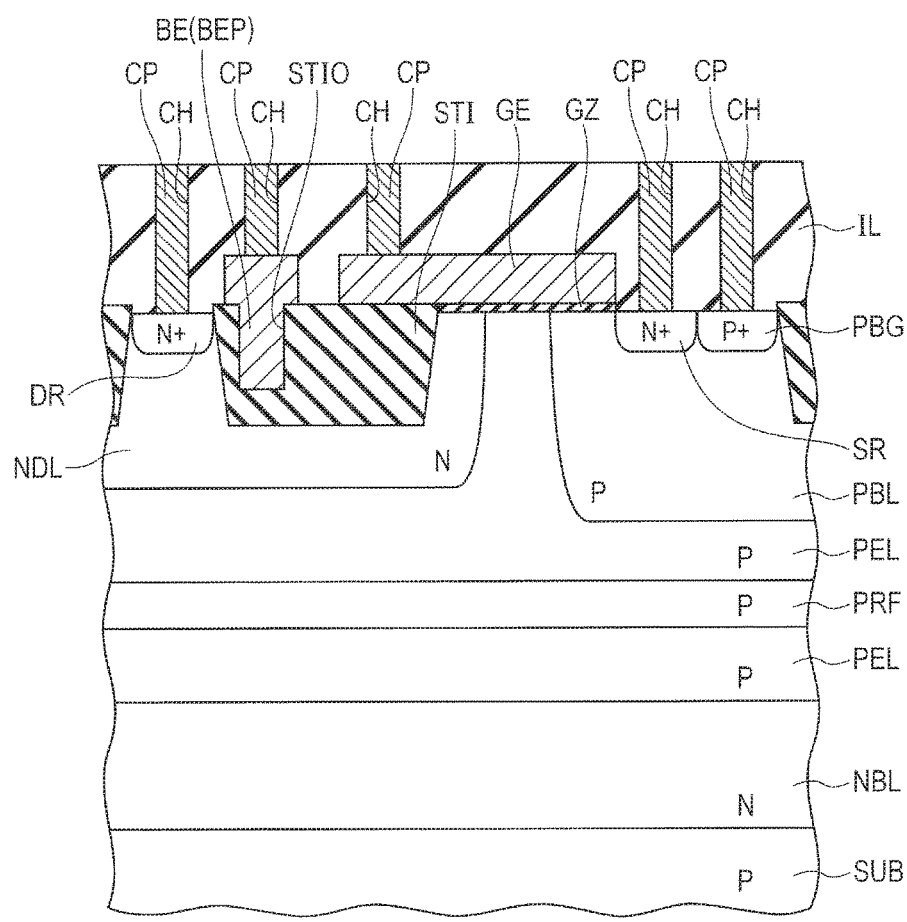
FIG. 7 is a cross-sectional view for showing a step performed after the step shown in FIG. 6 in the first embodiment.

Next, as shown in FIG. 7, the n-type drain region DR is formed in the n-type drift layer NDL by the ion implantation method, and the n-type source region SR is formed in the p-type body layer PBL. Further, the p-type p+ layer PBG is formed in the p-type body layer PBL by the ion implantation method. Next, the interlayer insulating film IL such as a silicon oxide film is formed so as to cover the buried electrode BE, the gate electrode GE, and the like by, for example, the CVD method. Next, a plurality of contact holes CH is formed so as to penetrate the interlayer insulating film IL by performing the predetermined photoengraving process and etching process.

Next, the contact plug CP is formed in each of the contact holes CH. Next, a conductive film (not shown) such as, for example, aluminum is formed so as to cover the interlayer insulating film IL. Next, the wirings HM are formed by performing the predetermined photoengraving process and etching process, and the primary parts of the semiconductor device shown in FIG. 1 and FIG. 2 are completed.

The ON-breakdown voltage can be improved by forming the buried electrode BE in the isolation insulating film STI in the above-described semiconductor device. The improvement of the ON-breakdown voltage will be described in comparison with a semiconductor device according to a comparative example.

Figure 8:
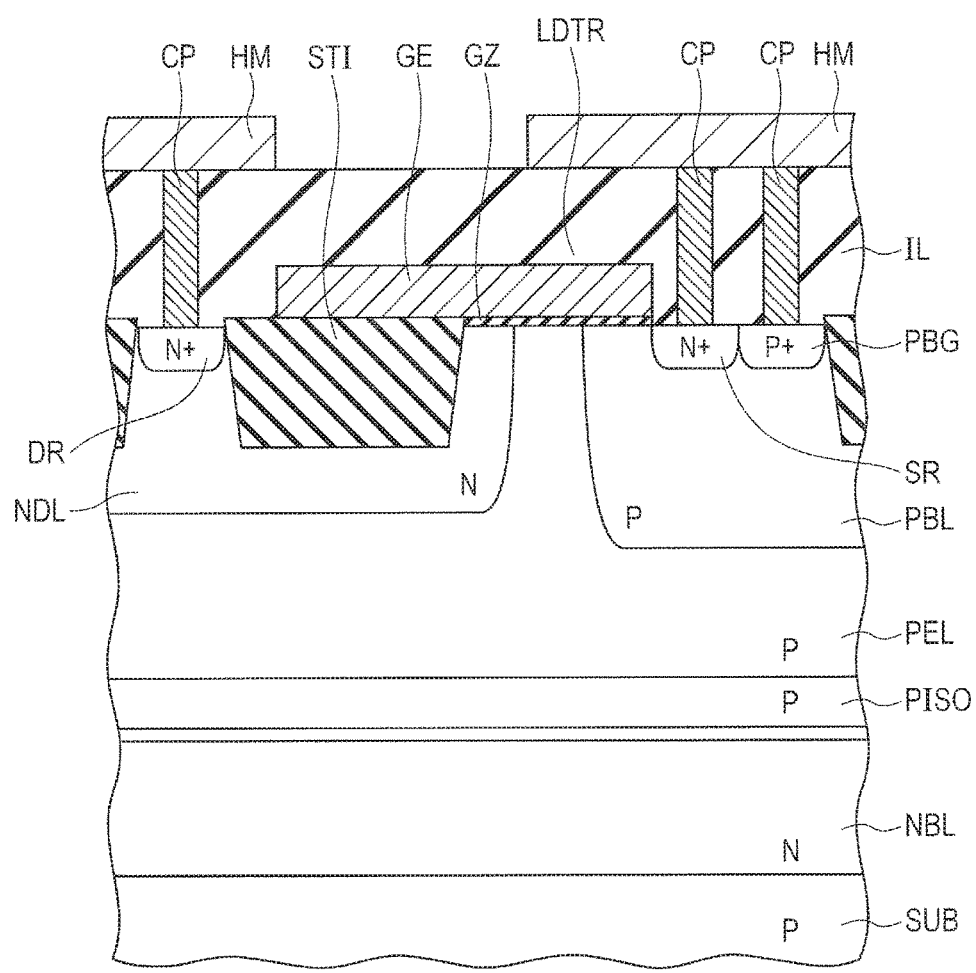
FIG. 8 is a cross-sectional view of a semiconductor device according to a comparative example.

As shown in FIG. 8, no buried electrode is formed in the semiconductor device according to the comparative example. A gate electrode GE extends immediately above an isolation insulating film STI. Further, a p-type epitaxial layer PEL is formed on the surface of a p-type semiconductor substrate SUB. An n-type buried layer NBL and a p-type isolation region PISO are formed in the p-type epitaxial layer. It should be noted that the other configurations are the same as those of the semiconductor device shown in FIG. 2. Accordingly, the same signs are given to the same members, and the explanations thereof will not be repeated except where absolutely necessary.

Next, a relation between the ON-breakdown voltage and the thickness (depth) of the buried part BEP of the buried electrode BE will be described. The inventors evaluated the dependency of the ON-breakdown voltage on the thickness (depth) of the buried part BEP by a simulation. Under the conditions where the source region SR and the p+ layer PBG (back gate) were set at 0V, the rear surface of the semiconductor substrate SUB was set at 0V, and the gate electrode GE was set at the maximum voltage allowable in the process, the voltage applied to the drain region DR was gradually increased, and the voltage when the lateral MOS transistor was destroyed was assumed as the ON-breakdown voltage.

Figure 9:
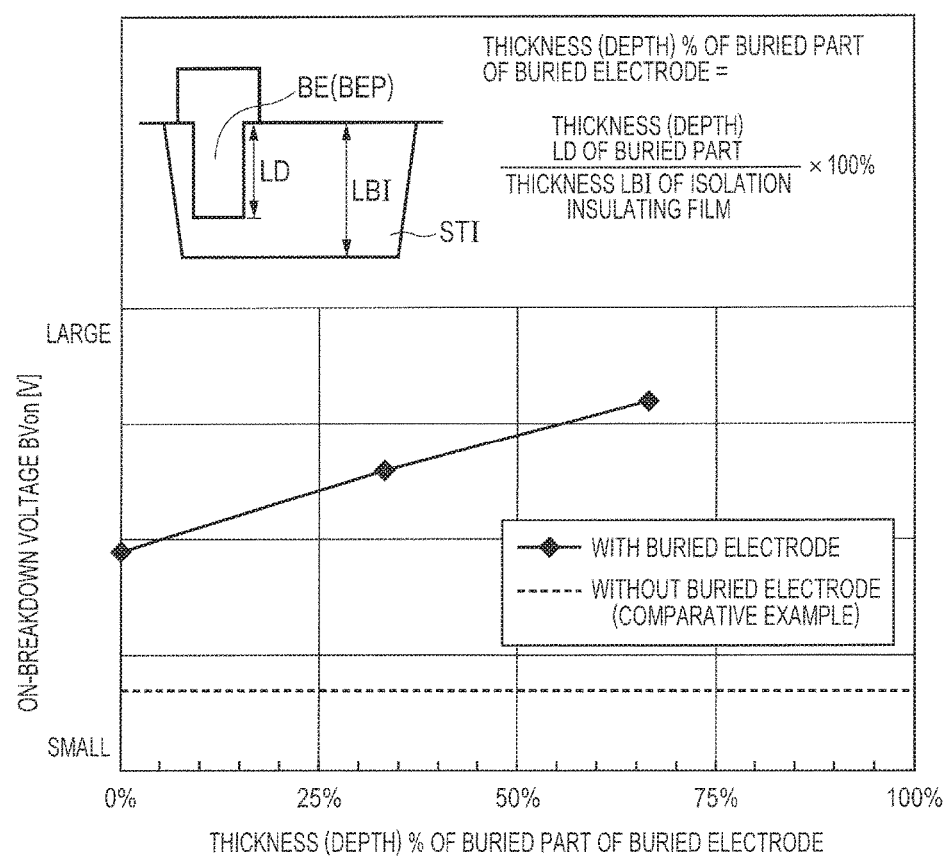
FIG. 9 is a diagram including a graph for showing a relation between an ON-breakdown voltage and the thickness of a buried part of a buried electrode by simulation in the first embodiment.

The result is shown in FIG. 9. In the graph shown in FIG. 9, the horizontal axis represents a ratio (%) of the thickness LD (depth) of the buried part BEP of the buried electrode BE to the thickness LBI of the isolation insulating film STI, and the vertical axis represents an ON-breakdown voltage (V). Further, the solid line represents a result by the semiconductor device according to the embodiment, and the dotted line represents a result by the semiconductor device having no buried electrode according to the comparative example.

As shown in the graph, it can be understood that the ON-breakdown voltage is improved in the semiconductor device having the buried electrode BE formed as compared to the semiconductor device (comparative example) having no buried electrode formed. Further, the inventors found that the ON-breakdown voltage was improved at the greater depth LD of the buried electrode BE in the semiconductor device having the buried electrode BE formed.

Next, the inventors evaluated electric potential distribution by a simulation in order to confirm the effect of the improved ON-breakdown voltage. The electric potential distribution was evaluated under the conditions where the source region SR and the p+ layer PBG (back gate) were set at 0V, the rear surface of the semiconductor substrate SUB was set at 0V, the gate electrode GE was set at the maximum voltage allowable in the process, and the voltage applied to the drain region DR was set at the maximum voltage Vd (the voltage near the ON-breakdown voltage) allowable in the process.

Figure 10:
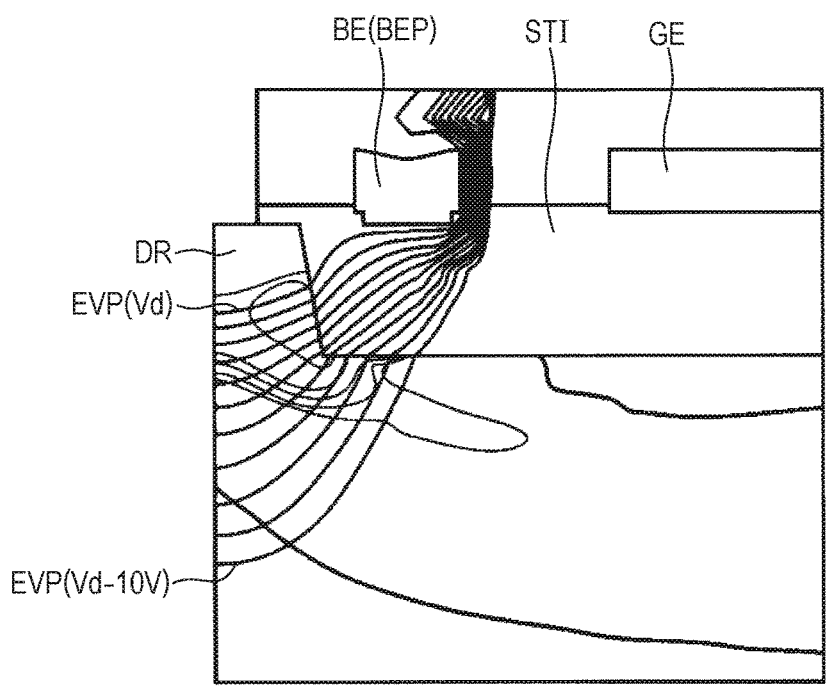
FIG. 10 is a first diagram for showing electric potential distribution by simulation in the first embodiment.
Figure 11:
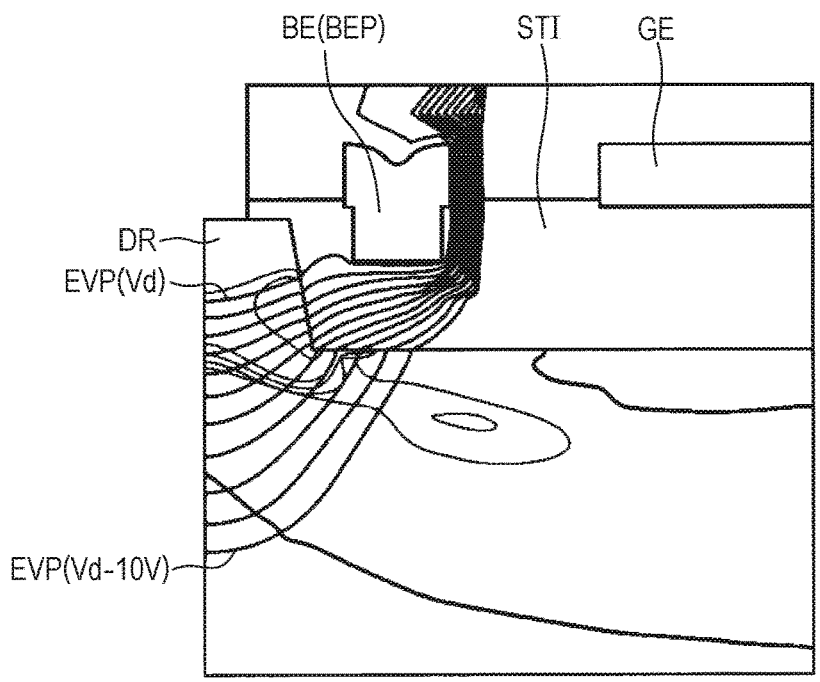
FIG. 11 is a second diagram for showing electric potential distribution by simulation in the first embodiment.
Figure 12:
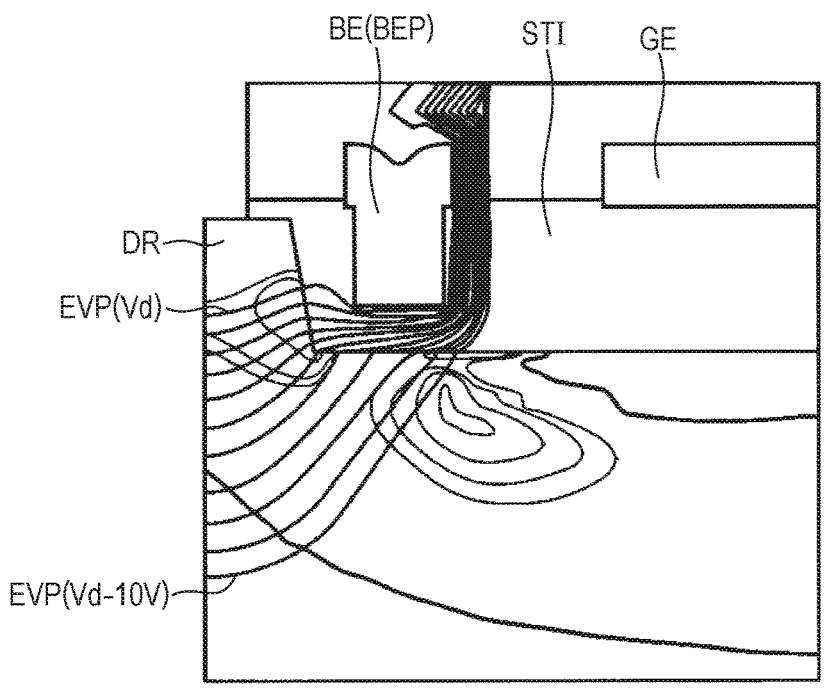
FIG. 12 is a third diagram for showing electric potential distribution by simulation in the first embodiment.
Figure 13:
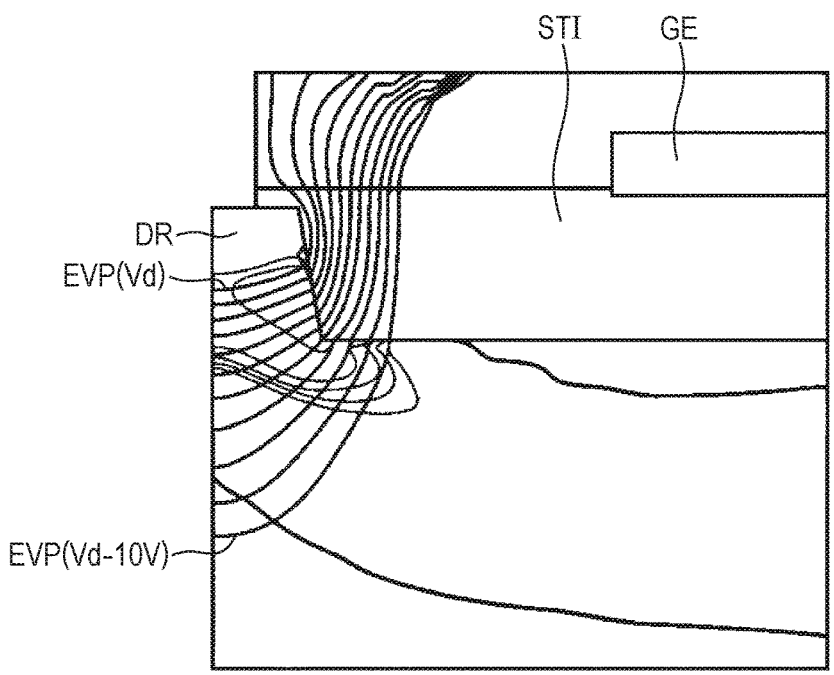
FIG. 13 is a fourth diagram for showing electric potential distribution by simulation in the first embodiment.

The result is shown in each of FIG. 10, FIG. 11, FIG. 12, and FIG. 13. Each of FIG. 10 to FIG. 13 shows equipotential lines EVP of 10V from the equipotential line EVP (Vd) of a voltage Vd (for example, 60V) to the equipotential line EVP (Vd-10V) of the voltage (Vd-10V) lower than the voltage Vd by 10V in the electric potential distribution (equipotential lines). Each of FIG. 10 to FIG. 12 shows a result by the semiconductor device according to the embodiment having the buried electrode BE. FIG. 10 shows a result in the case where the depth of the buried electrode BE is 0% (0/3), FIG. 11 shows a result in the case where the depth of the buried electrode BE is 33% (1/3), and FIG. 12 shows a result in the case where the depth of the buried electrode BE is 67% (2/3). On the other hand, FIG. 13 shows a result by the semiconductor device according to the comparative example having no buried electrode.

When paying attention to the equipotential lines EVP (the equipotential lines of 10V) of a part (region) of the n-type drift layer NDL located near a part of the isolation insulating film STI on the drain region DR side, the inventors found that the intervals between the equipotential lines EVP were widened, and the electric field was relaxed in the semiconductor device (FIG. 10 to FIG. 12) having the buried electrode BE as compared to the semiconductor device (FIG. 13) having no buried electrode.

Further, the inventors found that as the thickness (depth) of the buried part BEP was increased (deepened), the intervals between the equipotential lines EVP were gradually widened, and the electric field was gradually relaxed in the semiconductor device having the buried electrode BE. Therefore, the inventors found that the relaxing of the electric field improved the ON-breakdown voltage.

(Modified Example of Manufacturing Method)

Next, as another manufacturing method of the semiconductor device, an example of a manufacturing method in consideration of reduction in the number of steps will be described.

Figure 14:
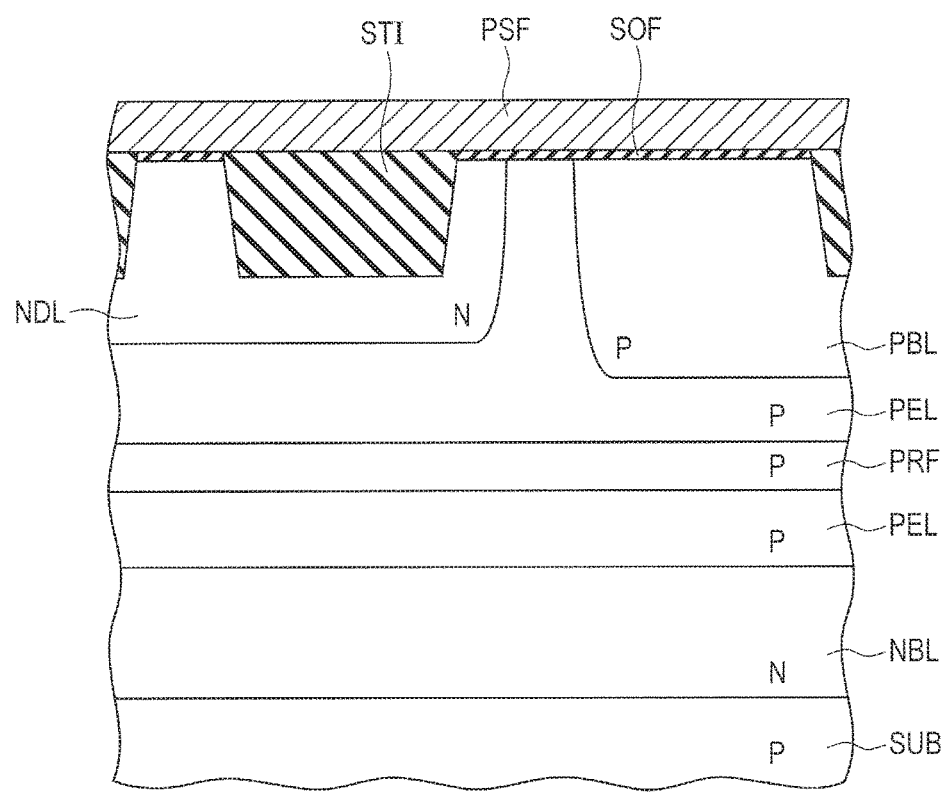
FIG. 14 is a cross-sectional view for showing a step of a manufacturing method of a semiconductor device according to a modified example in the first embodiment.
Figure 15:
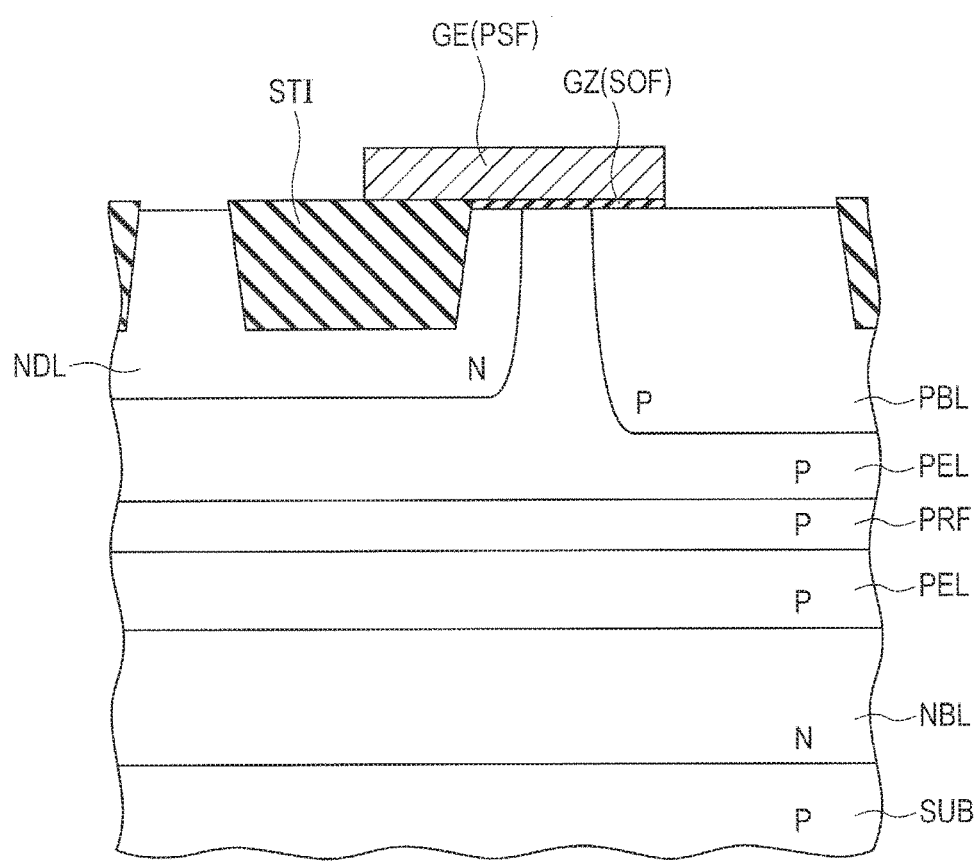
FIG. 15 is a cross-section for showing a step performed after the step shown in FIG. 14 in the first embodiment.

First, after the steps shown in FIG. 3, the silicon oxide film SOF and the polysilicon film PSF are formed as shown in FIG. 14. Next, as shown in FIG. 15, the gate electrode GE is formed by performing the predetermined photoengraving process and etching process. Next, the n-type drain region DR, the n-type source region SR, and the p-type p+ layer PBG are formed by the ion implantation method (see FIG. 16).

Figure 16:
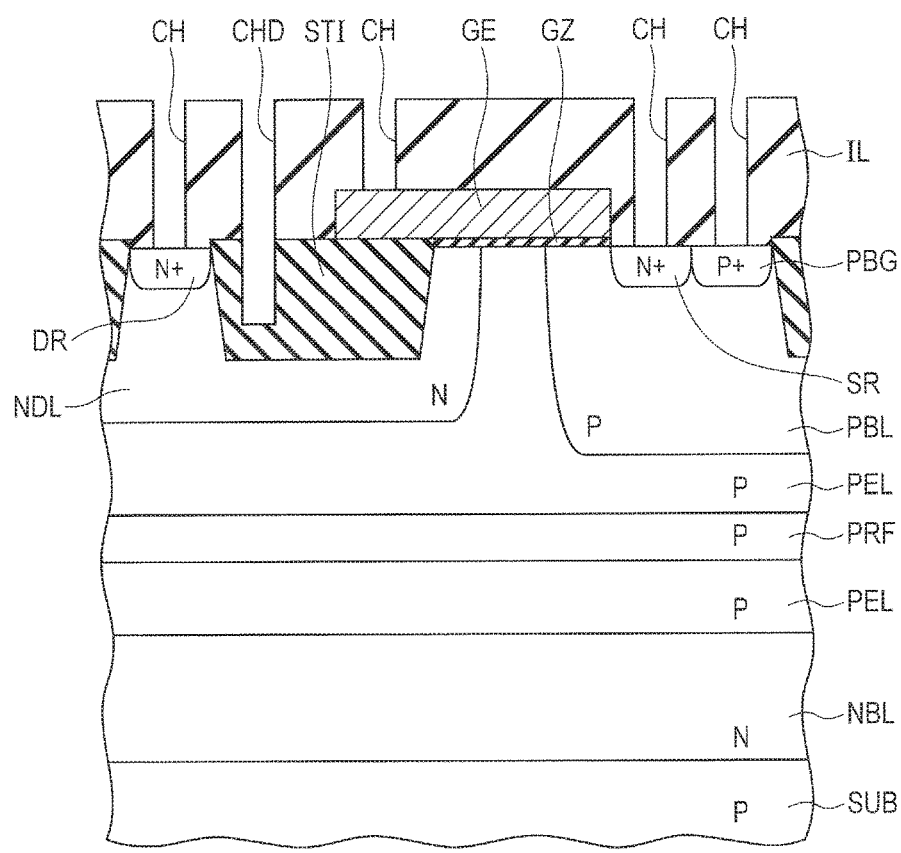
FIG. 16 is a cross-sectional view for showing a step performed after the step shown in FIG. 15 in the first embodiment.

Next, as shown in FIG. 16, the interlayer insulating film IL is formed so as to cover the gate electrode GE and the like. Next, the contact holes CH are formed so as to penetrate the interlayer insulating film IL by performing the predetermined photoengraving process and etching process. The contact holes include a contact hole CHD reaching the isolation insulating film STI. An opening having a predetermined depth is formed in the isolation insulating film STI by etching a part of the isolation insulating film STI exposed at the bottom of the contact hole CHD reaching the isolation insulating film STI. The depth of the opening corresponds to the thickness (depth) of the buried part BEP.

Figure 17:
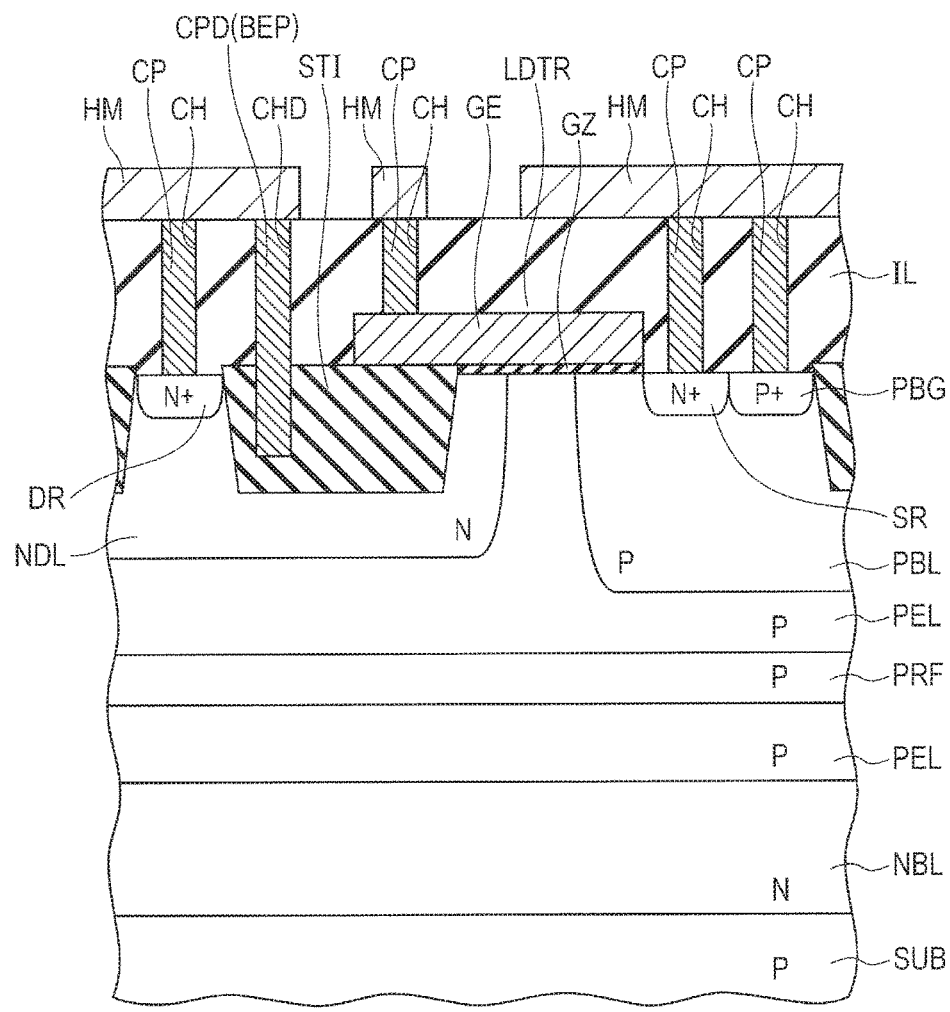
FIG. 17 is a cross-sectional view for showing a step performed after the step shown in FIG. 16 in the first embodiment.

Next, as shown in FIG. 17, a contact plug CPD is formed in the contact hole CHD, and the contact plug CP is formed in each of the other contact holes CH. Next, a conductive film (not shown) such as, for example, aluminum is formed so as to cover the interlayer insulating film IL. Next, the wirings HM are formed by performing the predetermined photoengraving process and etching process, and the primary parts of the semiconductor device are completed. In the semiconductor device, a part of the contact plug CPD buried in the isolation insulating film STI corresponds to the buried part BEP of the buried electrode.

In the above-described semiconductor device, a part of the contact plug CPD buried in the isolation insulating film STI functions as the buried electrode (buried part BEP), and thus the ON-breakdown voltage can be improved. Further, when the contact holes CH and the contact plugs CP are formed, the contact plug CPD including the buried part BEP serving as the buried electrode can be simultaneously formed without adding the step of forming the buried part, and the number of steps can be reduced in the above-described manufacturing method.

Second Embodiment

Here, a semiconductor device having a lateral MOS transistor and a manufacturing method thereof by which ON-resistance can be reduced as one of electric characteristics will be described.

(Semiconductor Device)

Figure 18:
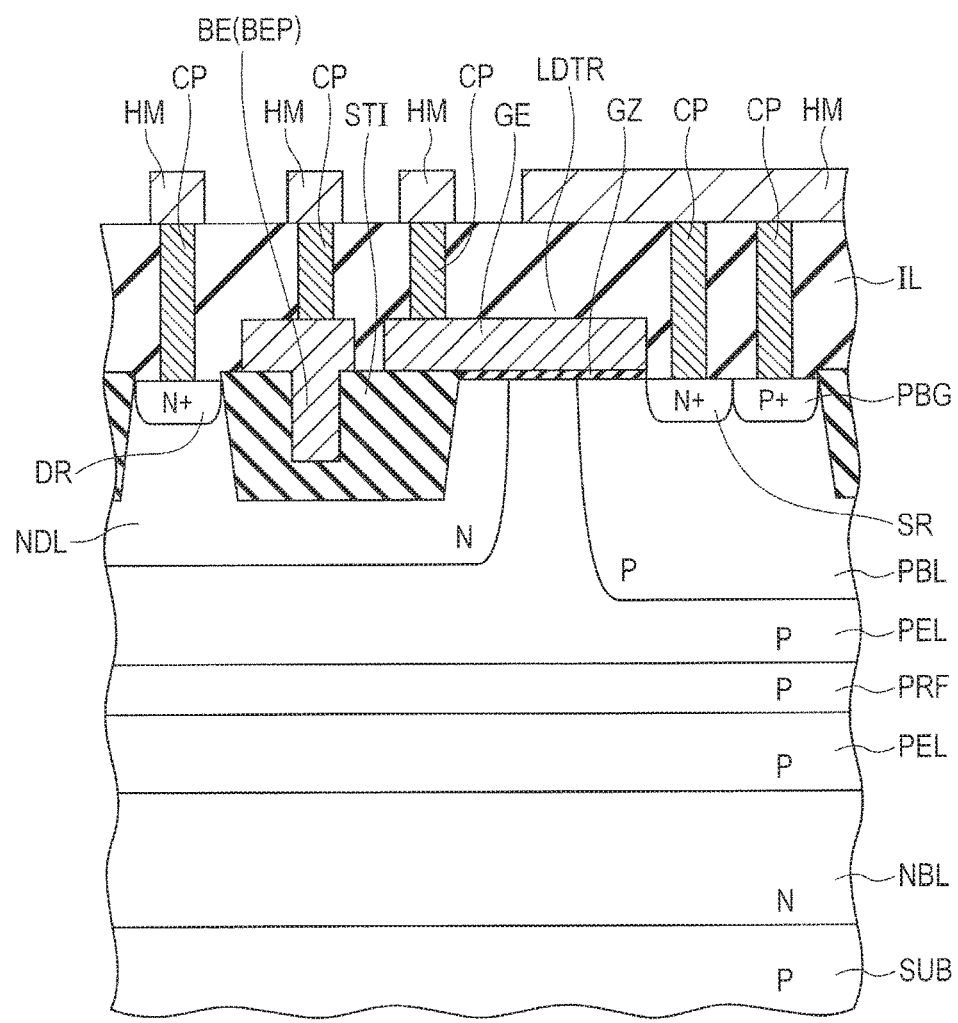
FIG. 18 is a cross-sectional view of a semiconductor device according to a second embodiment.

As shown in FIG. 18, a buried electrode BE is formed at a part of an isolation insulating film STI located between a drain region DR and a gate electrode GE. The buried electrode BE includes a buried part BEP. The buried part BEP is formed from the surface of the isolation insulating film STI up to a depth corresponding to a thickness (second thickness) thinner than the thickness (first thickness) of the isolation insulating film STI. In particular, the buried electrode BE and the drain region DR are not electrically coupled to each other in the semiconductor device, and the voltage applied to the buried electrode BE is different from that applied to the drain region DR or the gate electrode GE.

Further, the buried electrode BE is arranged closer to the channel side (gate electrode GE side) as compared to the buried electrode BE shown in FIG. 2 (first embodiment). It should be noted that the other configurations are the same as those of the semiconductor device shown in FIG. 1 and FIG. 2. Accordingly, the same signs are given to the same members, and the explanations thereof will not be repeated except where absolutely necessary.

(Manufacturing Method)

Figure 19:
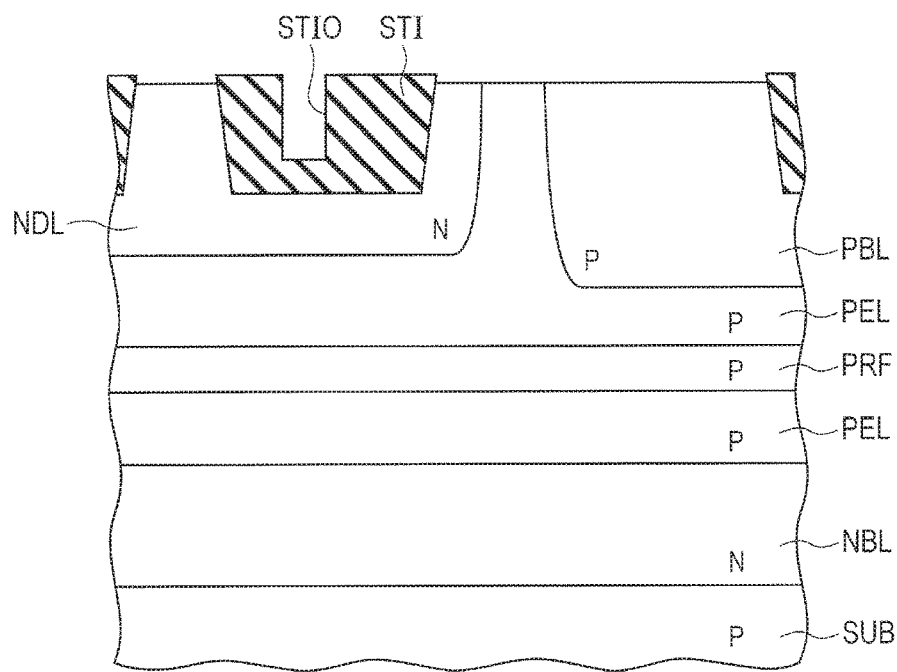
FIG. 19 is a cross-sectional view for showing a step of a manufacturing method of the semiconductor device in the second embodiment.

Next, an example of a manufacturing method of the above-described semiconductor device will be described. Through the steps same as those shown in FIG. 3 and FIG. 4, an opening STIO is formed in the isolation insulating film STI as shown in FIG. 19. The opening STIO is formed closer to the channel side as compared to the opening STIO shown in FIG. 4.

Figure 20:
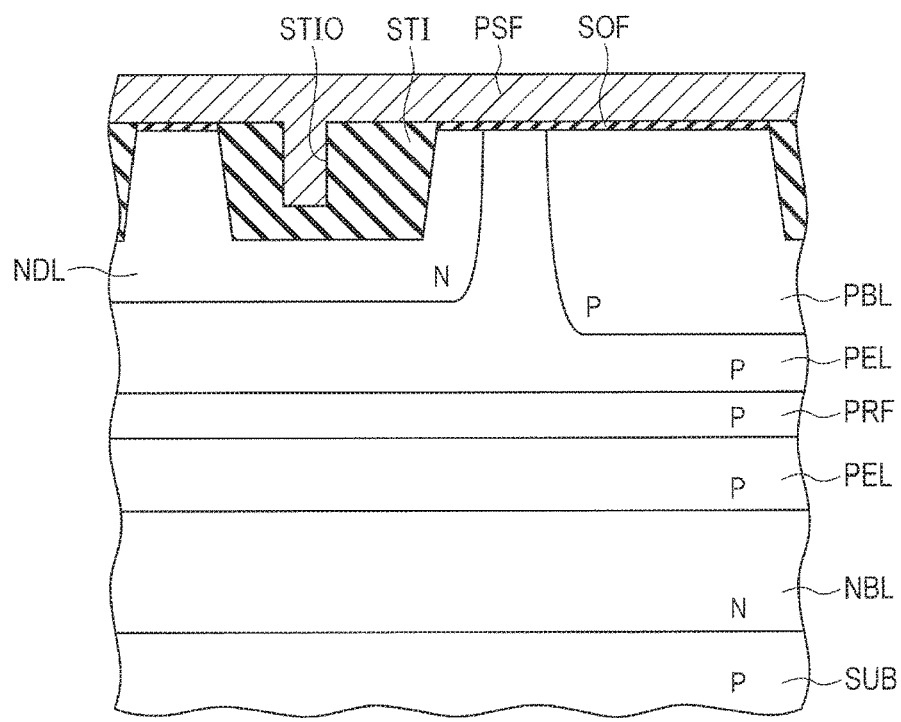
FIG. 20 is a cross-sectional view for showing a step performed after the step shown in FIG. 19 in the second embodiment.
Figure 21:
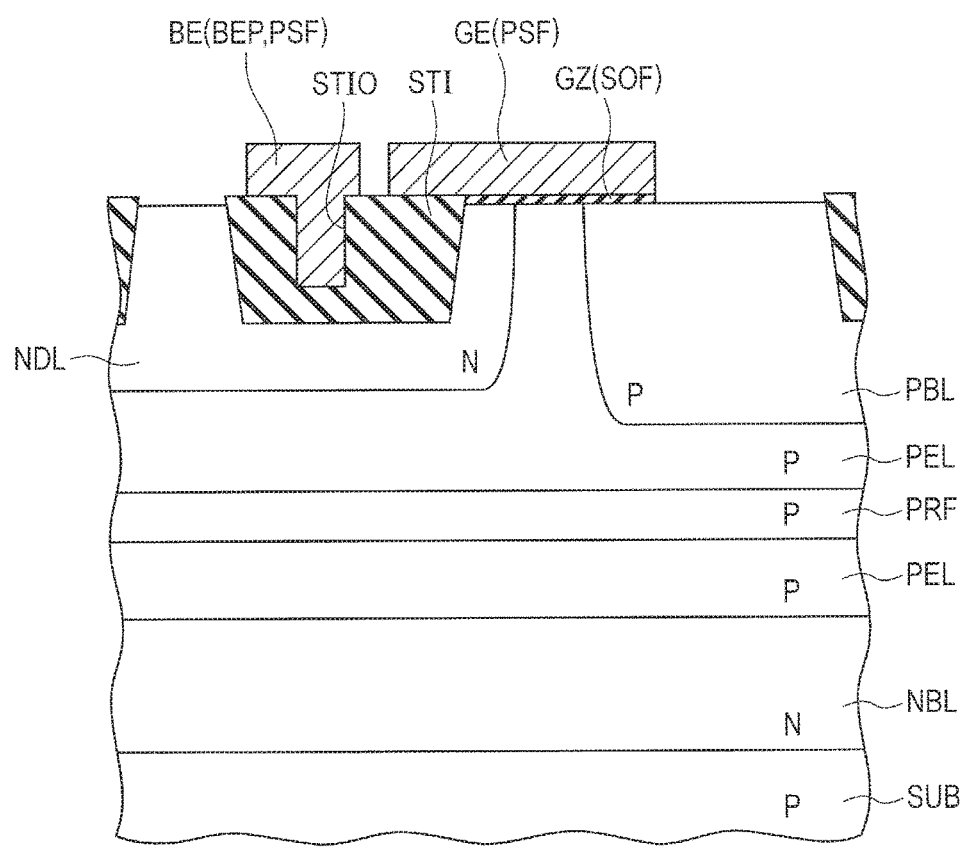
FIG. 21 is a cross-sectional view for showing a step performed after the step shown in FIG. 20 in the second embodiment.

Next, as shown in FIG. 20, a silicon oxide film SOF and a polysilicon film PSF are formed. Next, as shown in FIG. 21, the gate electrode GE and the buried electrode BE are formed by performing a predetermined photoengraving process and etching process. Next, an n-type drain region DR, an n-type source region SR, and a p-type p+ layer PBG are formed by performing an ion implantation method (see FIG. 22). Next, an interlayer insulating film IL such as a silicon oxide film is formed so as to cover the buried electrode BE, the gate electrode GE, and the like (see FIG. 22).

Figure 22:
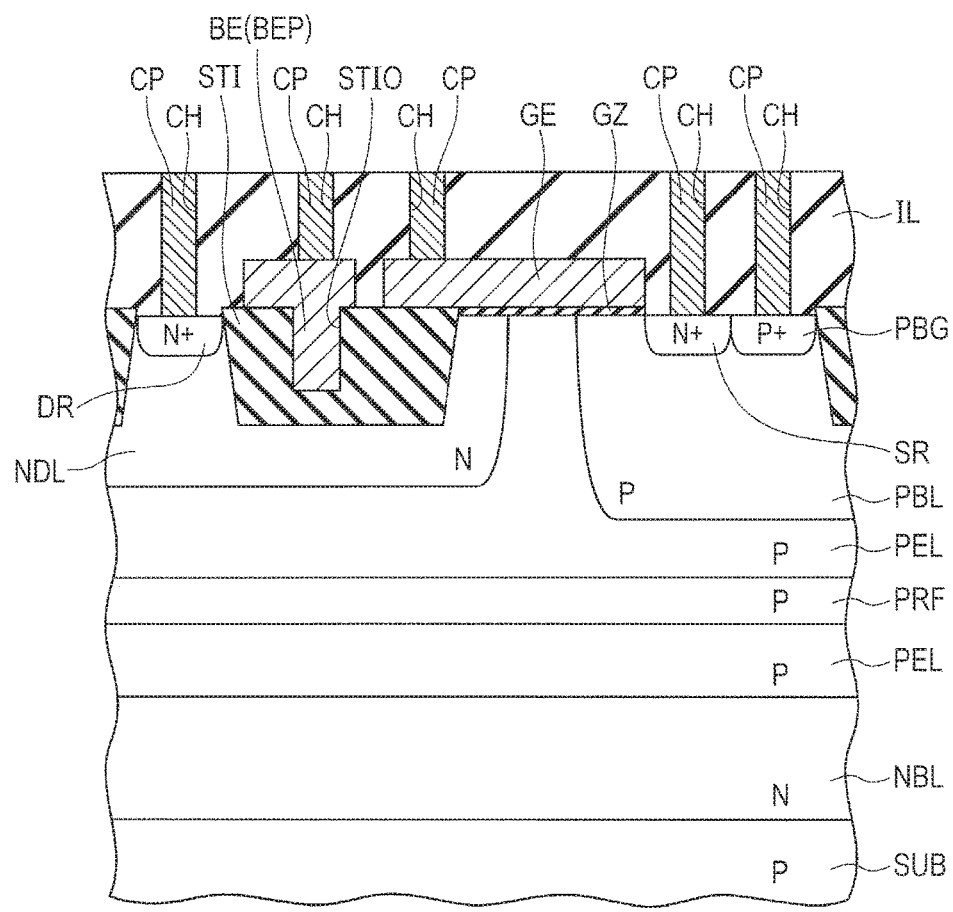
FIG. 22 is a cross-sectional view for showing a step performed after the step shown in FIG. 21 in the second embodiment.

Next, a plurality of contact holes CH is formed so as to penetrate the interlayer insulating film IL by performing the predetermined photoengraving process and etching process (see FIG. 22). Next, as shown in FIG. 22, a contact plug CP is formed in each of the contact holes CH. Next, a conductive film (not shown) is formed so as to cover the interlayer insulating film IL. Next, wirings HM are formed by performing the predetermined photoengraving process and etching process, and the primary parts of the semiconductor device shown in FIG. 18 are completed.

In the above-described semiconductor device, the ON-resistance can be reduced by applying a predetermined voltage to the buried electrode BE. The reduction of the ON-resistance will be described.

Figure 23:
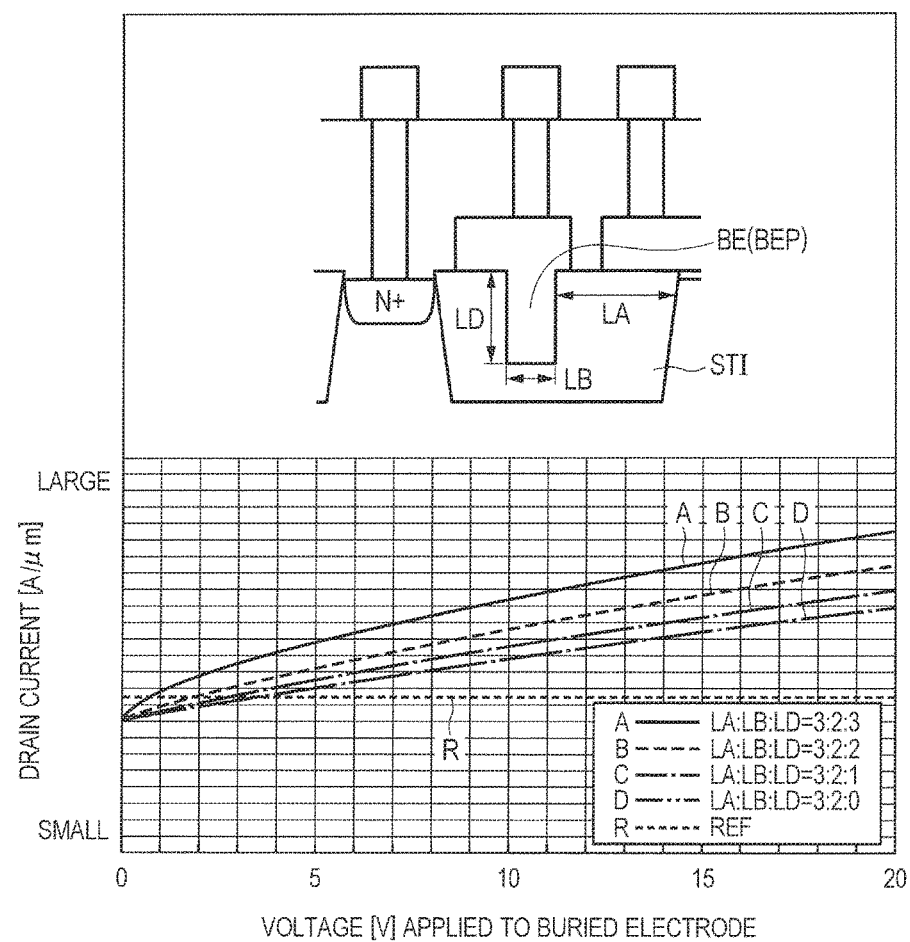
FIG. 23 is a diagram including a graph for showing a relation between a drain current and a voltage applied to a buried electrode by simulation in the second embodiment.

The inventors evaluated a relation between a drain current and a voltage applied to the buried electrode BE by a simulation. The result is shown in FIG. 23. In the graph shown in FIG. 23, the horizontal axis represents a voltage (V) applied to the buried electrode. The vertical axis represents a drain current (A/μm). A higher drain current means reduction of the ON-resistance.

Each of the graphs A, B, C, and D shows a result by the semiconductor device having the buried electrode. In the semiconductor devices each having the buried electrode formed, four kinds of thicknesses (depths) LD of the buried part BEP were set under the conditions where a distance LA from the buried part BEP of the buried electrode BE to the end of the isolation insulating film STI on the channel side and a width LB of the buried part BEP were constant. On the other hand, the graph R shows a result by a semiconductor device (REF) according to a comparative example having no buried electrode as a reference.

First, on the basis of a comparison between the semiconductor devices (graphs A to D) each having the buried electrode BE and the semiconductor device (graph R) according to the comparative example having no buried electrode, the inventors found that the drain current of each semiconductor device having the buried electrode BE exceeded that of the semiconductor device according to the comparative example after the voltage applied to the buried electrode BE was increased by 1 to 4V, and the ON-resistance was reduced.

Further, as shown in the graphs A to D, the inventors found that as the voltage applied to the buried electrode BE was increased, the drain current was gradually increased, and the ON-resistance was reduced in each semiconductor device having the buried electrode BE. Further, the inventors found that when the same voltage was applied to the buried electrode BE, the drain current was increased at the greater depth of the buried electrode BE. In addition, the ON-resistance was more effectively reduced at the greater depth of the buried electrode BE.

Figure 24:
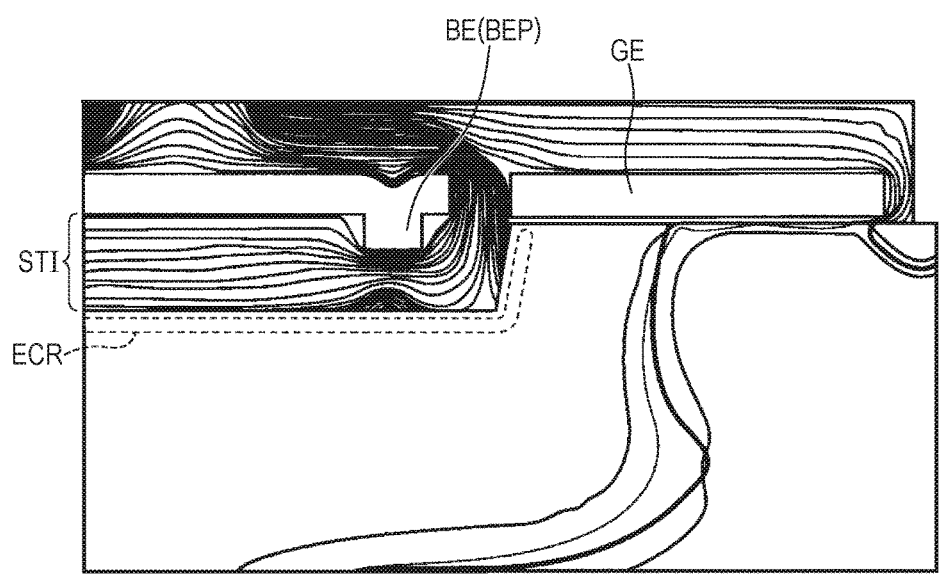
FIG. 24 is a diagram for showing electron density distribution by simulation in the second embodiment.

It is conceivable that the drain current is increased due to an accumulation layer accumulating electrons formed on the n-type drift layer NDL located near the bottom and side surfaces of the isolation insulating film STI, and the accumulation effect is enhanced as the thickness (depth) of the buried electrode is increased (deepened). As shown in FIG. 24, on the basis of an evaluation of electron density by a simulation, the inventors found that the electron accumulation layer (dotted line frame ECR) was formed on the n-type drift layer NDL located near the bottom and side surfaces of the isolation insulating film STI. It should be noted that the dimensional relation (LA:LB:LD=3:2:1) of the depth and the like of the buried electrode in the graph C was set as the condition of the simulation.

Next, the inventors indirectly evaluated the hot carriers of an LDMOS. In the LDMOS, as the intensity of an electric field near the drain region DR is increased, the hot carrier phenomenon occurs. The carriers (electrons or holes) flowing into a high electric-field region are accelerated by a high electric field to obtain high energy. In this case, some carriers become the hot carriers with energy exceeding an electric potential barrier existing between the semiconductor substrate SUB and the gate insulating film GZ. In the LDMOS, the hot carriers are mainly implanted into the lower end of the isolation insulating film STI on the channel side, and some hot carriers are implanted into the gate insulating film GZ. Some hot carriers implanted into the gate insulating film GZ are trapped in the film of the gate insulating film GZ, and the characteristics such as the current driving capability of the lateral MOS transistor LDTR are deteriorated with time.

Figure 25:
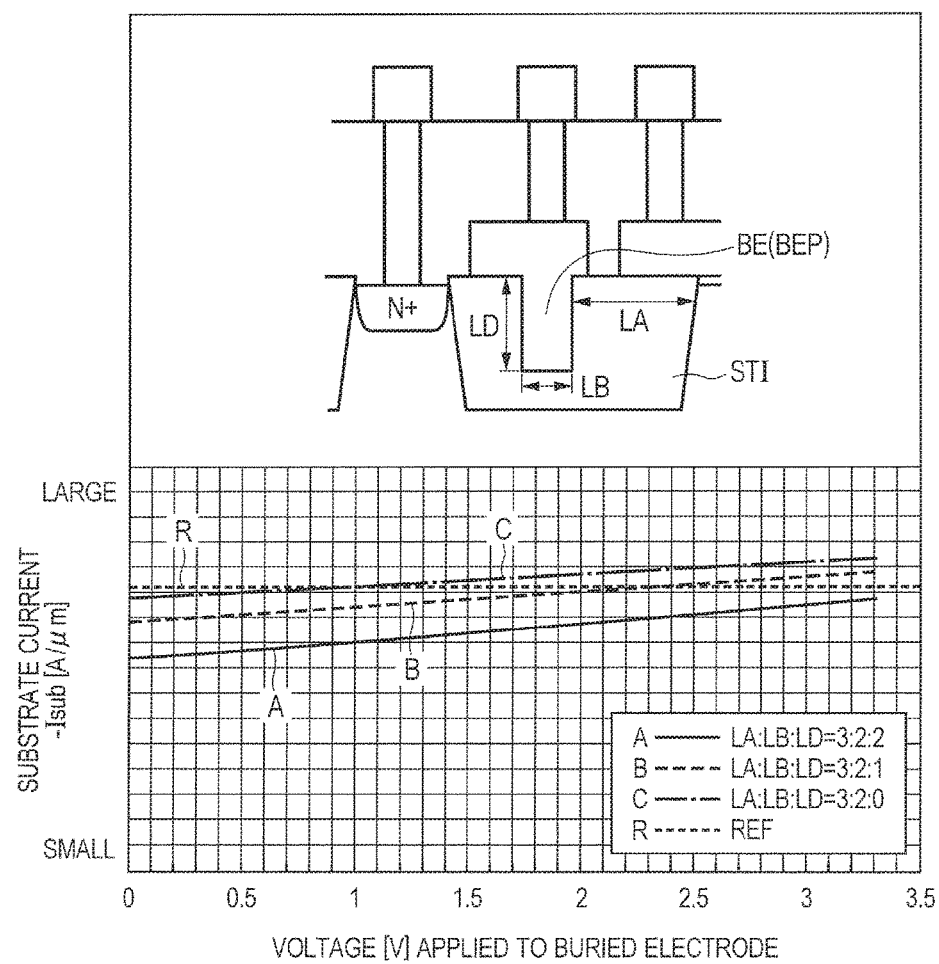
FIG. 25 is a diagram including a graph for showing a relation between a substrate current and a voltage applied to a buried electrode by simulation in the second embodiment.

On the other hand, the hot carriers that are not trapped in the gate insulating film GZ among those implanted into the gate insulating film GZ become a gate current, and the hot carriers flowing towards the semiconductor substrate SUB are observed as a substrate current. Accordingly, the inventors indirectly evaluated the hot carriers by evaluating the substrate current by a simulation. The result is shown in FIG. 25. In the graph shown in FIG. 25, the horizontal axis represents a voltage (V) applied to the buried electrode. The vertical axis represents a substrate current (A/µm), and a decrease in the substrate current means less generation of the hot carriers.

Each of the graphs A, B, and C shows a result by the semiconductor device having the buried electrode. In the semiconductor devices each having the buried electrode formed, three kinds of thicknesses (depths) LD of the buried part BEP were set under the conditions where a distance LA from the buried part BEP of the buried electrode BE to the end of the isolation insulating film STI on the channel side and a width LB of the buried part BEP were constant. On the other hand, the graph R shows a result by a semiconductor device (REF) according to a comparative example having no buried electrode as a reference.

As shown in the graphs A to C, the inventors found that as the voltage applied to the buried electrode BE was decreased, the substrate current was gradually decreased, and the hot carriers were less generated in the semiconductor devices each having the buried electrode BE. Further, the inventors found that when the same voltage was applied to the buried electrode BE, the substrate current was decreased as the thickness (depth) of the buried part BEP was increased (deepened). In addition, the inventors found that as the thickness (depth) of the buried part BEP was increased (deepened), the hot carriers were less generated, and the lateral MOS transistor LDTR was suppressed from being deteriorated.

In particular, as shown in the graph A, the inventors found that the substrate current was decreased at any voltage applied to the evaluated buried electrode BE in the semiconductor device having the largest thickness (depth) of the buried part BEP as compared to the semiconductor device according to the comparative example shown in the graph R.

Figure 26:
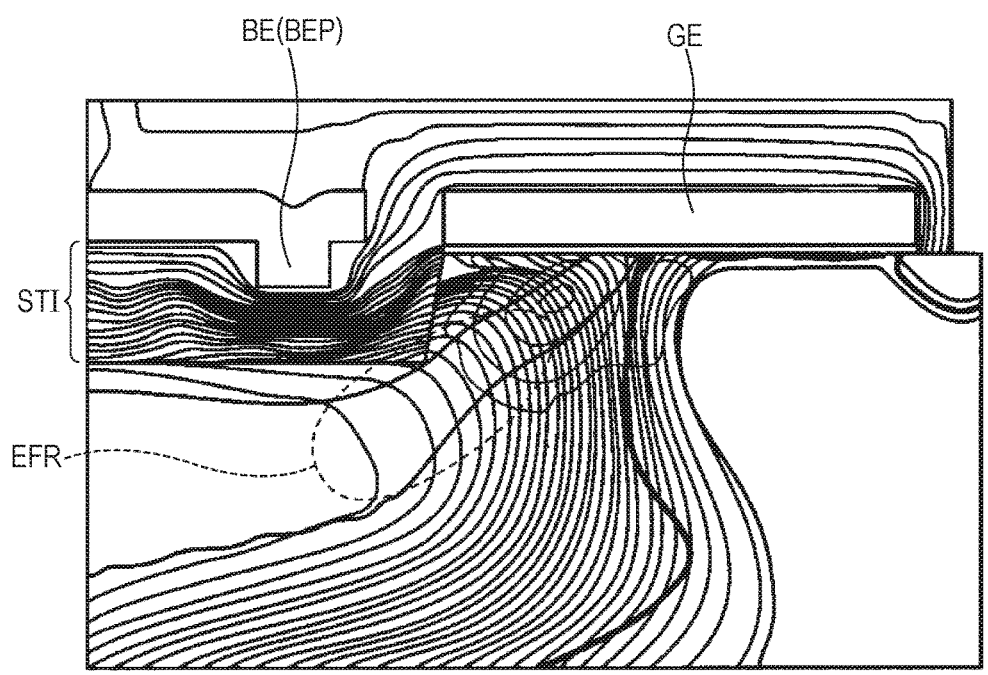
FIG. 26 is a diagram for showing electric potential distribution by simulation in the second embodiment.

It is conceivable that the substrate current is decreased due to the relaxing of the electric field from a part of the n-type drift layer located under the buried part BEP to the end of the n-type drift layer NDL on the channel side. As shown in FIG. 26, on the basis of the evaluation of the electric potential distribution and the like by a simulation, the inventors found that the electric field (dotted line frame EFR) was relaxed from a part of the n-type drift layer NDL located under the buried part BEP to the end of the n-type drift layer NDL on the channel side. It should be noted that as the conditions of the simulation, the voltage applied to the buried electrode BE was 0V and the dimensional relation (LA:LB:LD=3:2:1) of the depth and the like of the buried electrode in the graph B was set.

On the basis of the above-described evaluation, the inventors found that in order to reduce the ON-resistance, the thickness (depth) of the buried part BEP of the buried electrode BE was preferably increased (deepened) and the voltage applied to the buried electrode BE was preferably high. On the other hand, the inventors found that in order to reduce the hot carriers, the voltage applied to the buried electrode BE was preferably low.

Next, the inventors evaluated whether or not the both of the ON-resistance and the hot carriers could be reduced. On the basis of the evaluation result of the voltage of the drain current applied to the buried electrode and the evaluation result of the dependency of the substrate current on the voltage applied to the buried electrode, the inventors extracted the drain current and the substrate current, and plotted the same in a graph in the case of the same value of the voltage applied to the buried electrode. The result is shown in FIG. 27.

Figure 27:
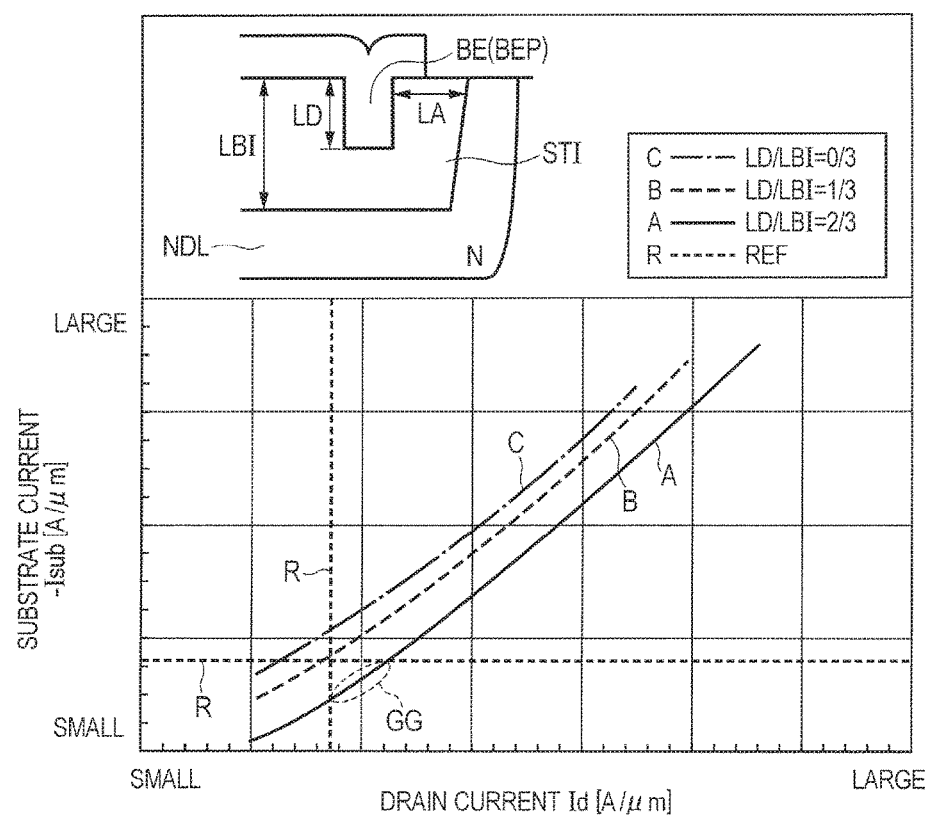
FIG. 27 is a diagram including a first graph for showing a relation between a substrate current and a drain current by simulation in the second embodiment.

In the graph shown in FIG. 27, the horizontal axis represents a drain current (A/µm), and the vertical axis represents a substrate current (A/µm). Each of the graphs A, B, and C shows a result by the semiconductor device having the buried electrode. In the semiconductor devices each having the buried electrode formed, three kinds of thicknesses (depths) LD of the buried part BEP of the buried electrode BE relative to the thickness (depth) LBI of the isolation insulating film STI were set under the conditions where a distance LA from the buried part BEP of the buried electrode BE to the end of the isolation insulating film STI on the channel side and a width LB of the buried part BEP were constant.

On the other hand, the graph R shows a result by a semiconductor device (REF) according to a comparative example having no buried electrode as a reference. A region under the graph R extending in the horizontal direction means that the substrate current is lowered, and the hot carriers are improved. Further, a region on the right side of the graph R extending in the vertical direction means that the drain current is increased, and the ON-resistance is improved. Therefore, the both of the hot carriers and the ON-resistance are reduced in the region under the graph R extending in the horizontal direction and in the region (region A) on the right side of the graph R extending in the vertical direction.

Accordingly, there is a part overlapped with the region A as represented by a dotted line frame GG in the graph A, and the inventors found that the both of the hot carriers and the ON-resistance were reduced by setting the depth and the like of the buried electrode to desired conditions. As described above, as the depth of the buried electrode BE is increased, the electric field at a part of the n-type drift layer NDL located immediately under the buried electrode BE is relaxed even in the case of the same voltage applied to the buried electrode BE as compared to the case in which the depth of the buried electrode BE is small. Thus, the both of the hot carriers and the ON-resistance can be reduced.

Next, the inventors evaluated by a simulation the dependency of the ON-resistance or the hot carriers on the distance LA from the buried electrode BE to the end of the isolation insulating film STI located on the channel side. The result is shown in each of FIG. 28 and FIG. 29.

Figure 28:
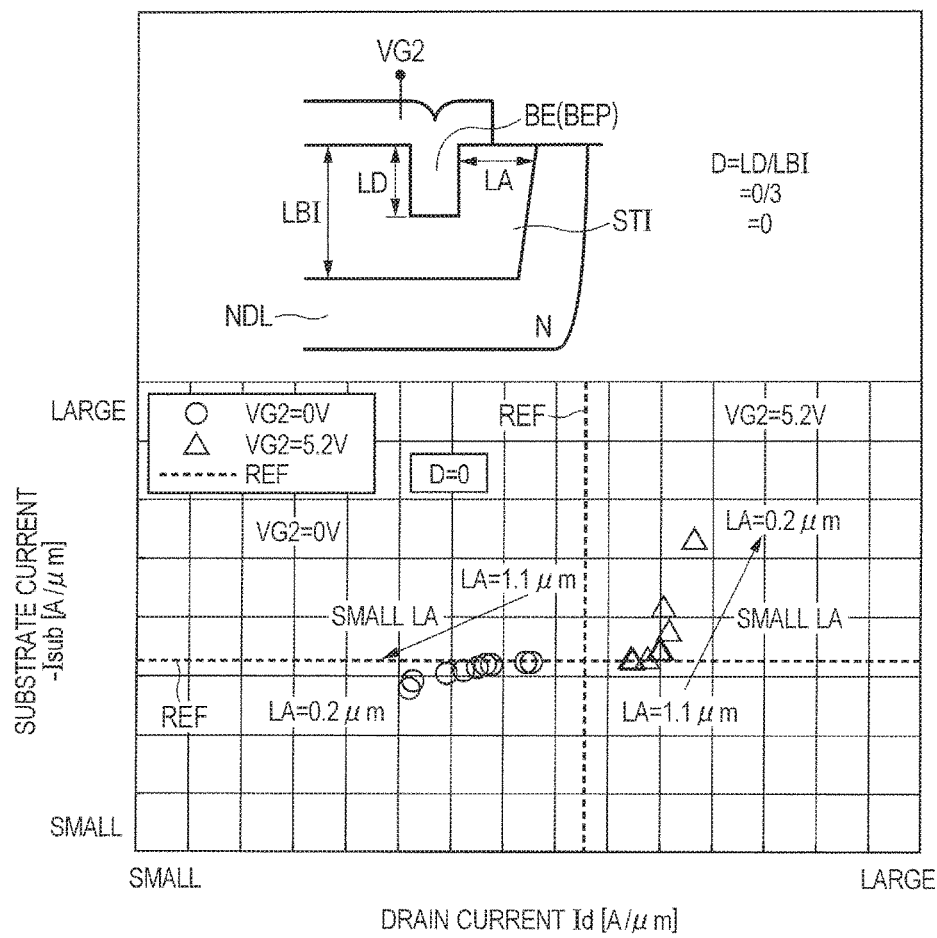
FIG. 28 is a diagram including a second graph for showing a relation between a substrate current and a drain current by simulation in the second embodiment.

In FIG. 28, a relation between the drain current and the substrate current is shown by mark "o" (plot A) in the case where the thickness (depth) LD of the buried part BEP of the buried electrode BE relative to the thickness (depth) LBI of the isolation insulating film STI is set at 0, a voltage VG2 applied to the buried electrode BE is set at 0V, and the distance LA is shortened from 1.1 µm to 0.2 µm. Further, a relation between the drain current and the substrate current is shown by mark "Δ" (plot B) in the case where the thickness (depth) LD of the buried part is set at 0, the voltage VG2 is set at 5.2V, and the distance LA is shortened from 1.1 µm to 0.2 µm.

Figure 29:
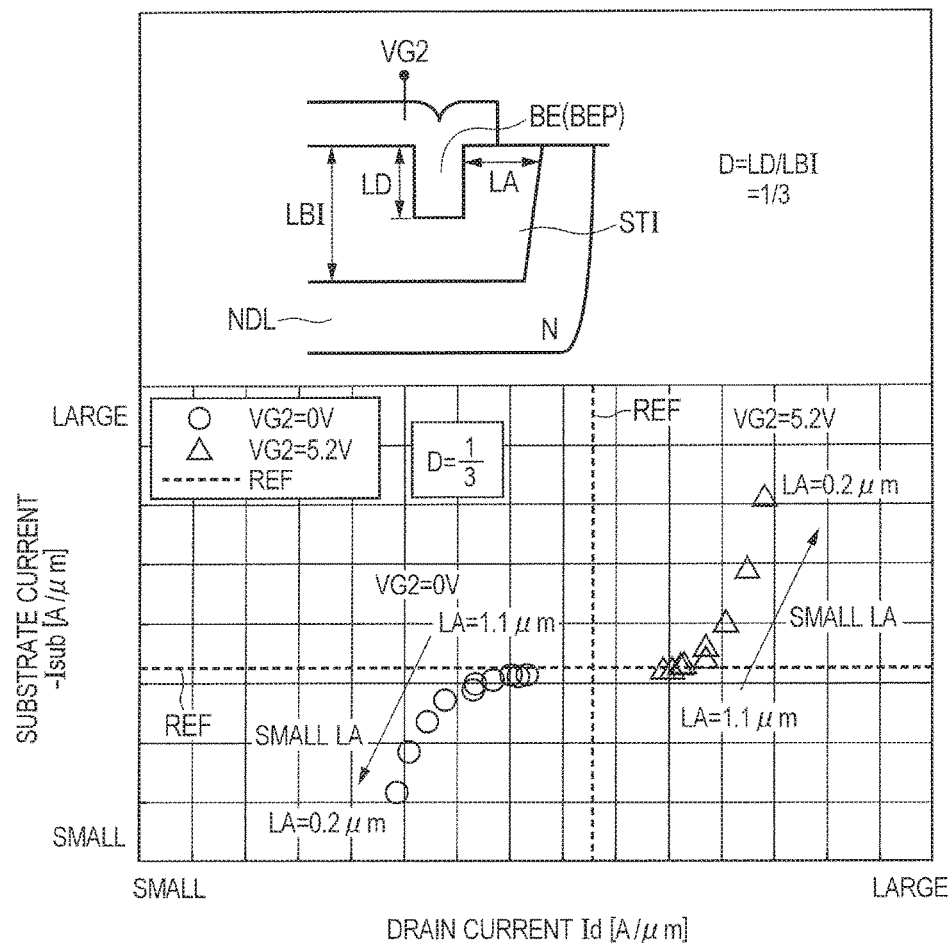
FIG. 29 is a diagram including a third graph for showing a relation between a substrate current and a drain current by simulation in the second embodiment.

In FIG. 29, a relation between the drain current and the substrate current is shown by mark "o" (plot C) in the case where the thickness (depth) LD of the buried part BEP of the buried electrode BE relative to the thickness (depth) LBI of the isolation insulating film STI is set at 1/3, the voltage VG2 applied to the buried electrode BE is set at 0V, and the distance LA is shortened from 1.1 µm to 0.2 µm. Further, a relation between the drain current and the substrate current is shown by mark "Δ" (plot D) in the case where the thickness (depth) LD of the buried part BEP is set at 1/3, the voltage VG2 is set at 5.2V, and the distance LA is shortened from 1.1 µm to 0.2 µm.

When comparing the plot A with the plot C, the inventors found that as the thickness (depth) LD of the buried part BEP was increased and the distance LA was shortened, the substrate current tended to be largely reduced, and the hot carriers were more effectively reduced. Further, when comparing the plot B with the plot D, the inventors found that even when the thickness (depth) LD of the buried part BEP was 0, the drain current was increased by shortening the distance LA, and the ON-resistance was reduced. Further, the inventors found that the drain current was further increased by increasing the thickness (depth) LD of the buried part and shortening the distance LA, and the ON-resistance was further reduced.

(Modified Example of Manufacturing Method)

Next, as another manufacturing method of the semiconductor device, an example of a manufacturing method in consideration of reduction in the number of steps will be described. The steps are the same as those in the manufacturing method according to the modified example described in the first embodiment, and the wiring patterns are mainly different from each other.

Figure 30:
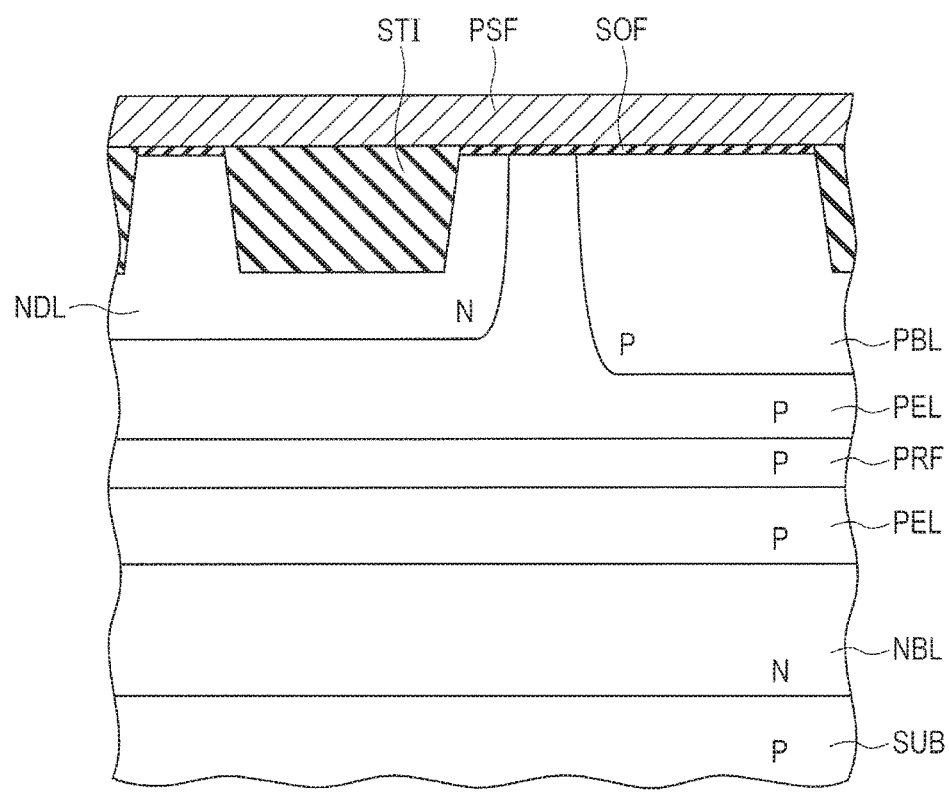
FIG. 30 is a cross-sectional view for showing a step of a manufacturing method of a semiconductor device according to a modified example in the second embodiment.
Figure 31:
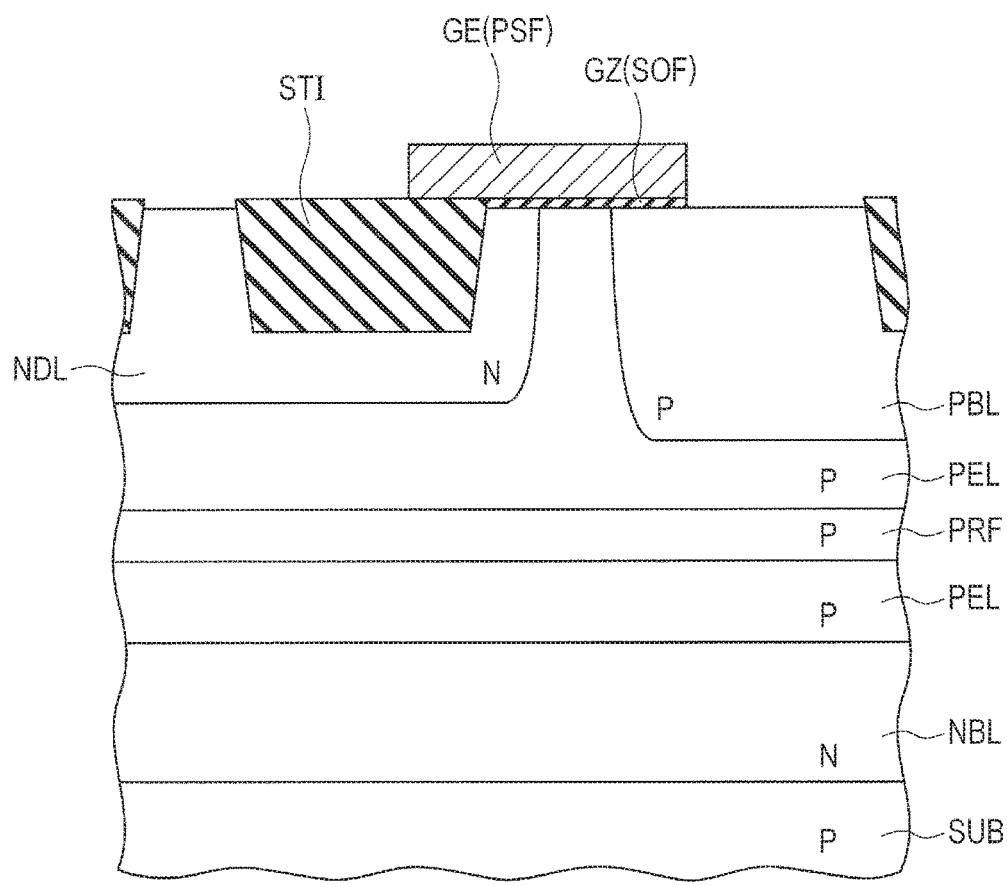
FIG. 31 is a cross-sectional view for showing a step performed after the step shown in FIG. 30 in the second embodiment.

First, through the steps same as those shown in FIG. 14, the silicon oxide film SOF and the polysilicon film PSF are formed as shown in FIG. 30. Next, as shown in FIG. 31, the gate electrode GE is formed by performing the predetermined photoengraving process and etching process. In this case, in consideration of the arrangement of the contact plugs serving as the buried electrodes, a part located immediately above the isolation insulating film STI becomes shorter than that in the case of the first embodiment. Next, the n-type drain region DR, the n-type source region SR, and the p-type p+ layer PBG are formed by the ion implantation method (see FIG. 32).

Figure 32:
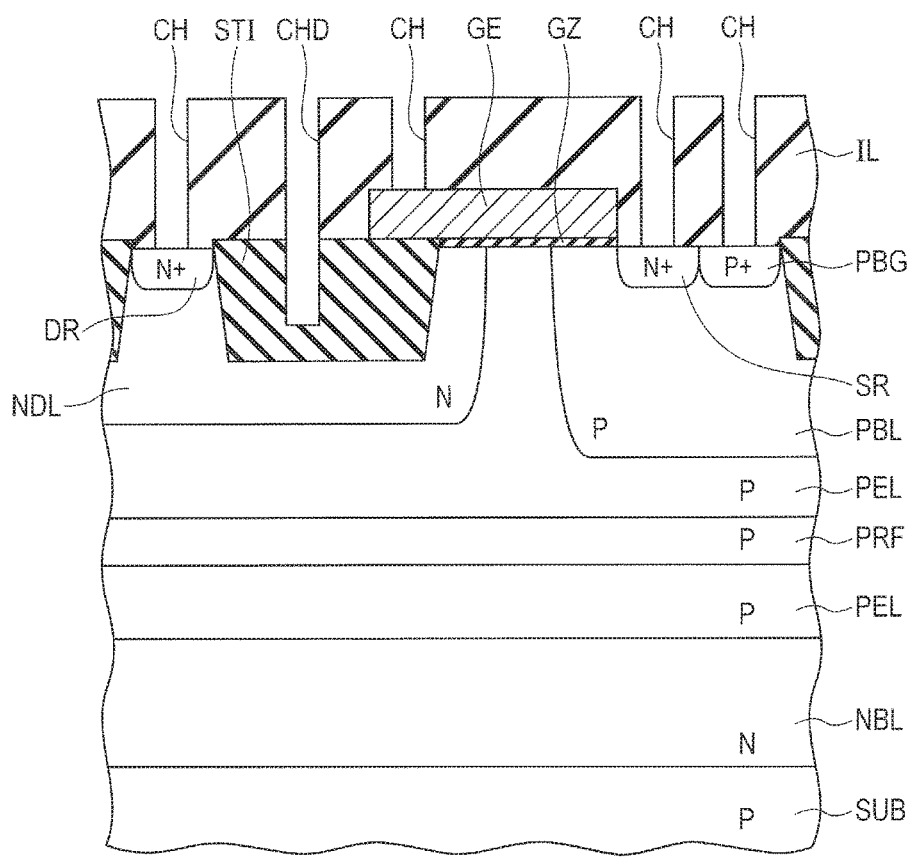
FIG. 32 is a cross-sectional view for showing a step performed after the step shown in FIG. 31 in the second embodiment.

Next, as shown in FIG. 32, the contact holes CH are formed in the interlayer insulating film IL formed so as to cover the gate electrode GE and the like by performing the predetermined photoengraving process and etching process. The contact holes include a contact hole CHD reaching the isolation insulating film STI. An opening having a predetermined depth is formed in the isolation insulating film STI by etching a part of the isolation insulating film STI exposed at the bottom of the contact hole CHD reaching the isolation insulating film STI. The depth of the opening corresponds to the thickness (depth) of the buried part BEP.

Figure 33:
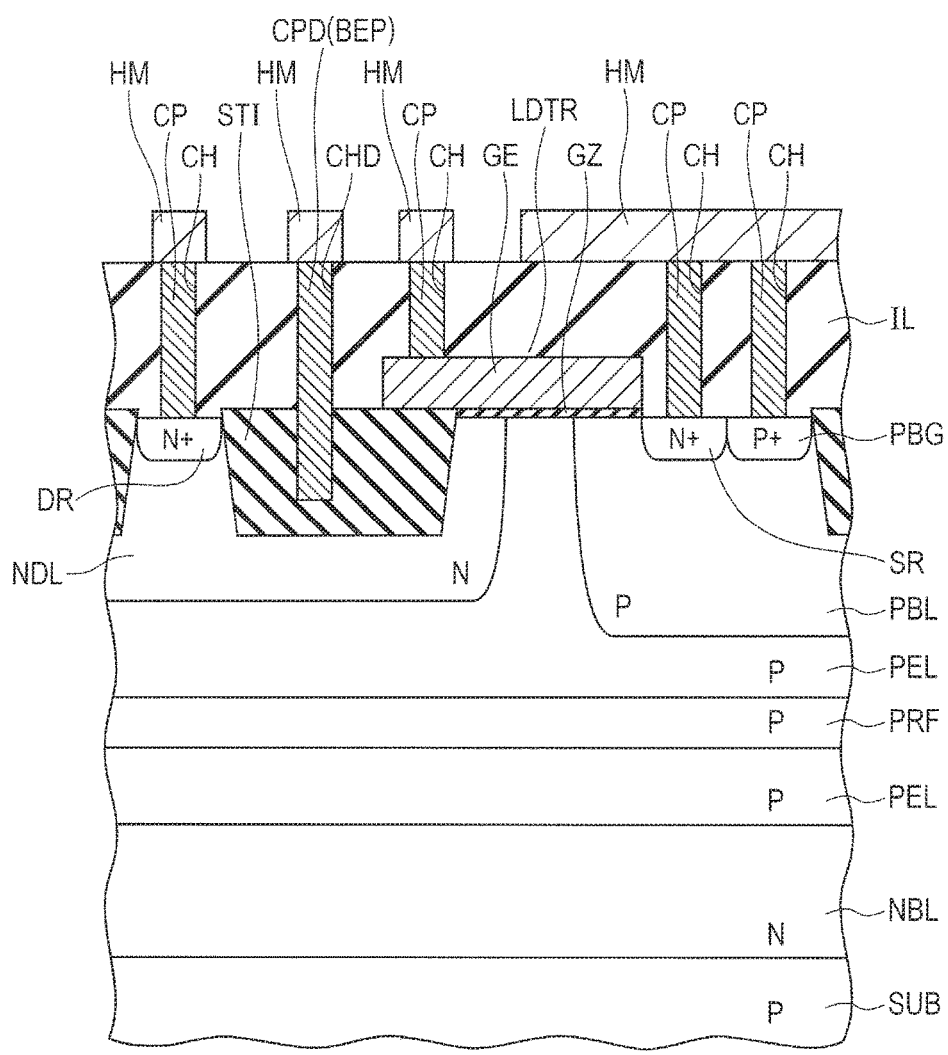
FIG. 33 is a cross-sectional view for showing a step performed after the step shown in FIG. 32 in the second embodiment.

Next, as shown in FIG. 33, a contact plug CPD is formed in the contact hole CHD, and the contact plug CP is formed in each of the other contact holes CH. Next, the wirings HM are formed by performing the predetermined photoengraving process and etching process for a conductive film (not shown) such as aluminum formed so as to cover the interlayer insulating film IL, and the primary parts of the semiconductor device are completed.

In the semiconductor device, a part of the contact plug CPD buried in the isolation insulating film STI corresponds to the buried electrode (buried part). The wiring HM coupled to the contact plug CPD is not coupled to that coupled to the drain region DR, and a voltage different from that applied to the drain region DR is applied to the contact plug CPD.

In the above-described semiconductor device, a part of the contact plug CPD buried in the isolation insulating film STI at a predetermined position functions as the buried electrode, and thus the ON-resistance or the hot carriers can be reduced. Further, in the above-described manufacturing method, when the contact holes CH and the contact plugs CP are formed, the contact plug CPD including the buried part BEP serving as the buried electrode can be simultaneously formed without adding the step of forming the buried part, and the number of steps can be reduced.

Third Embodiment

Here, a variation of a planar structure (planar pattern) of a semiconductor device will be described.

In the first embodiment, an example in which the buried part BEP of the buried electrode BE is formed in a circular pattern so as to continuously surround the drain region DR in the isolation insulating film STI has been described. As another case, even if a buried electrode having a buried part with a planar pattern shown below is formed, the ON-breakdown voltage can be improved.

Figure 34:
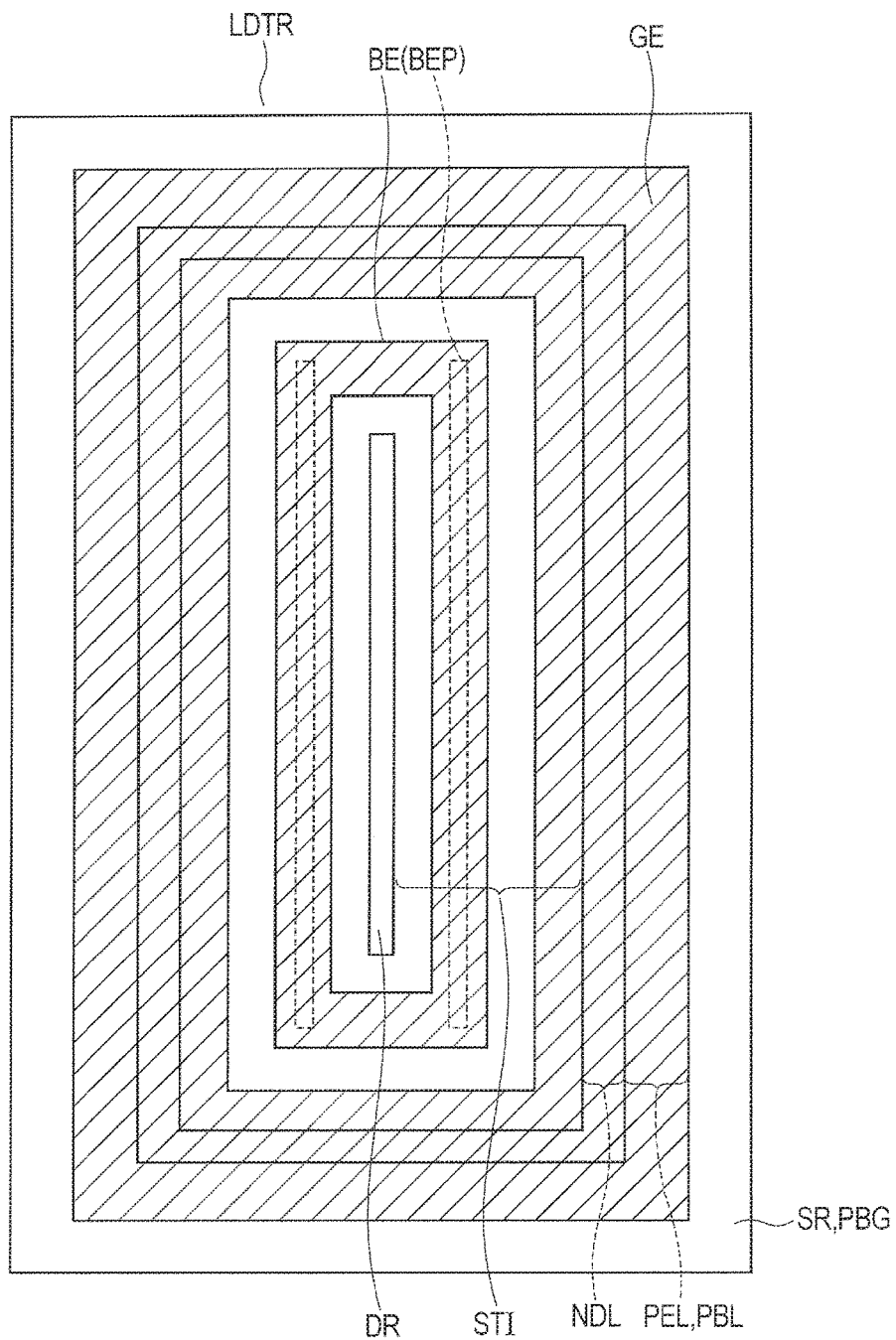
FIG. 34 is a first plan view for showing a variation of a planar structure of a semiconductor device according to a third embodiment.
Figure 35:
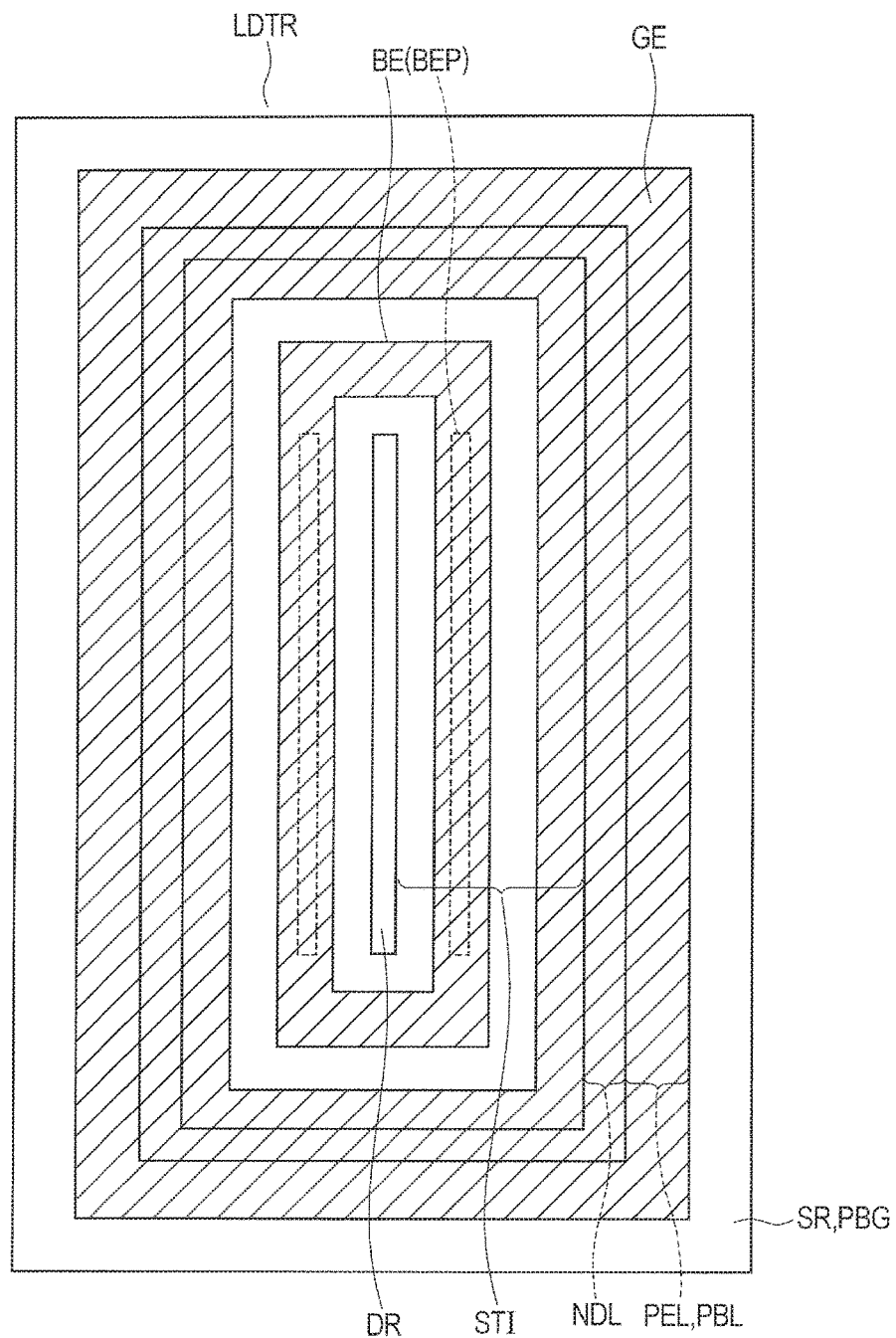
FIG. 35 is a second plan view for showing a variation of the planar structure of the semiconductor device in the third embodiment.

Buried parts BEP of buried electrodes BE located on the one end side and the other end side in the longitudinal direction of a drain region DR are formed in a concave shape depending on the width of an opening and the thickness of a polysilicon film serving as the buried electrode. Therefore, as shown in FIG. 34 or FIG. 35, a pattern having no buried parts formed on the one end side and the other end side in the longitudinal direction of the drain region DR may be employed. Almost no channels are formed between the one end side in the longitudinal direction of the drain region DR and a source region SR and between the other end side thereof and the source region SR. Thus, it is conceivable that there is a small effect due to no buried parts formed.

Figure 36:
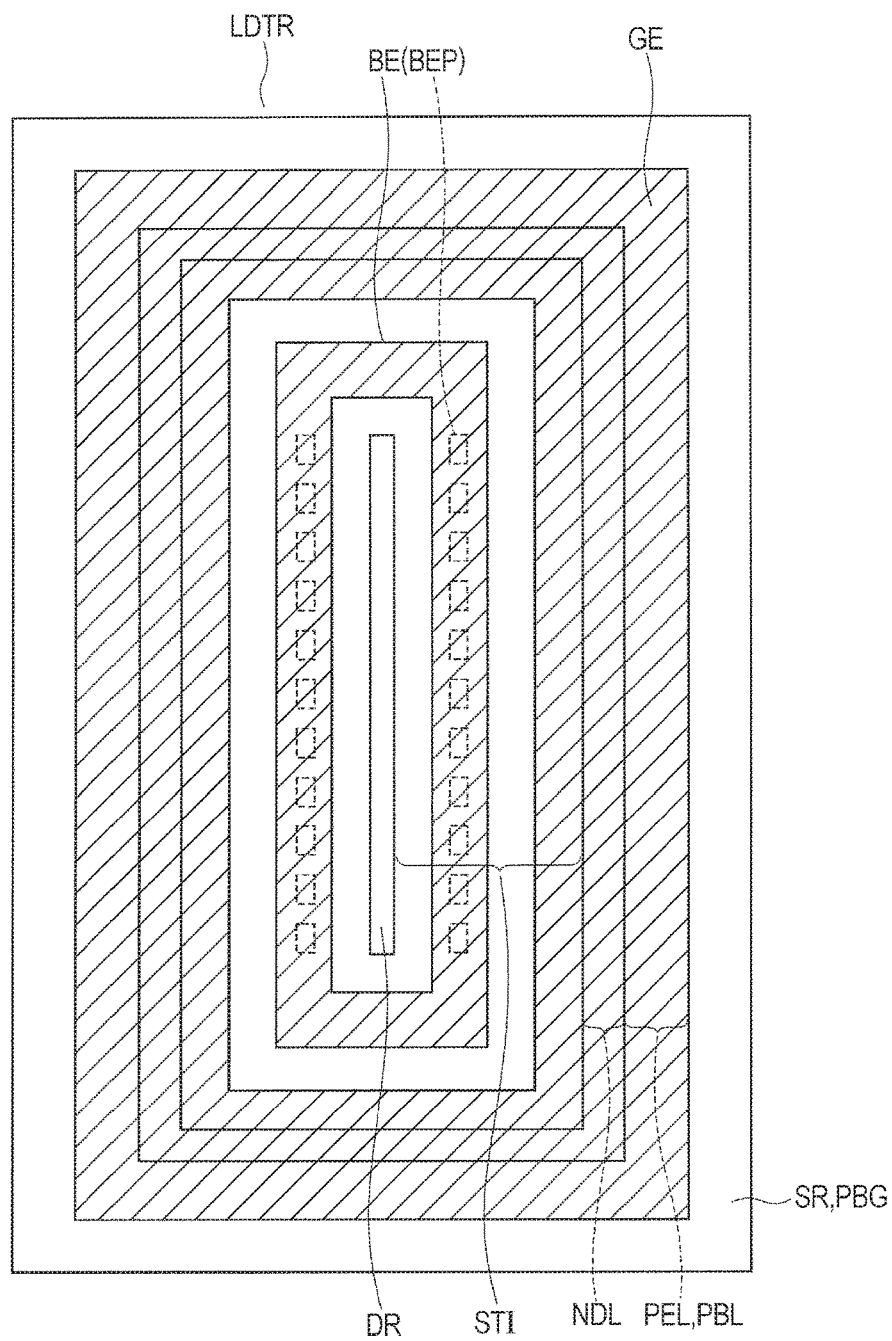
FIG. 36 is a third plan view for showing a variation of the planar structure of the semiconductor device in the third embodiment.
Figure 37:
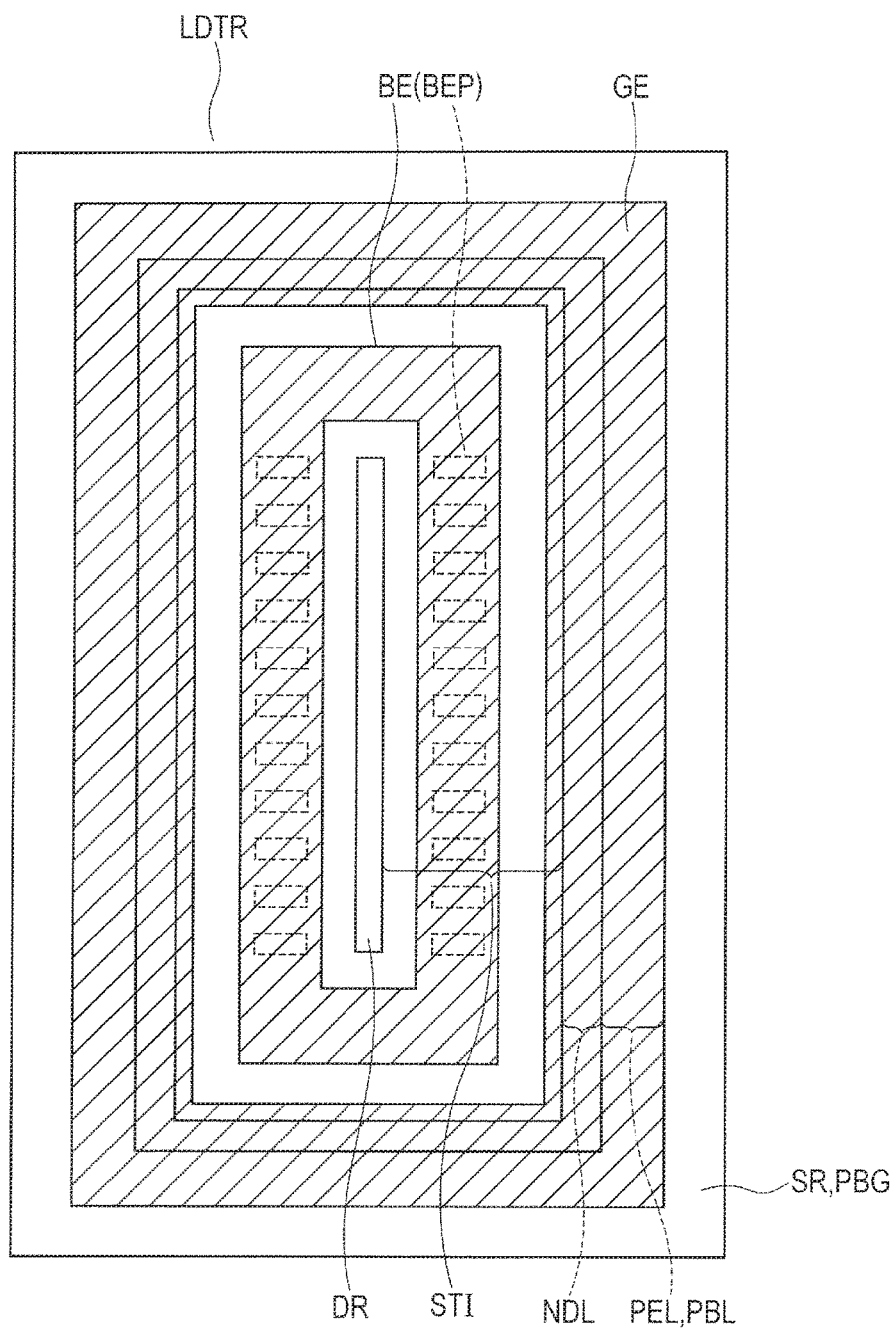
FIG. 37 is a fourth plan view for showing a variation of the planar structure of the semiconductor device in the third embodiment.
Figure 38:
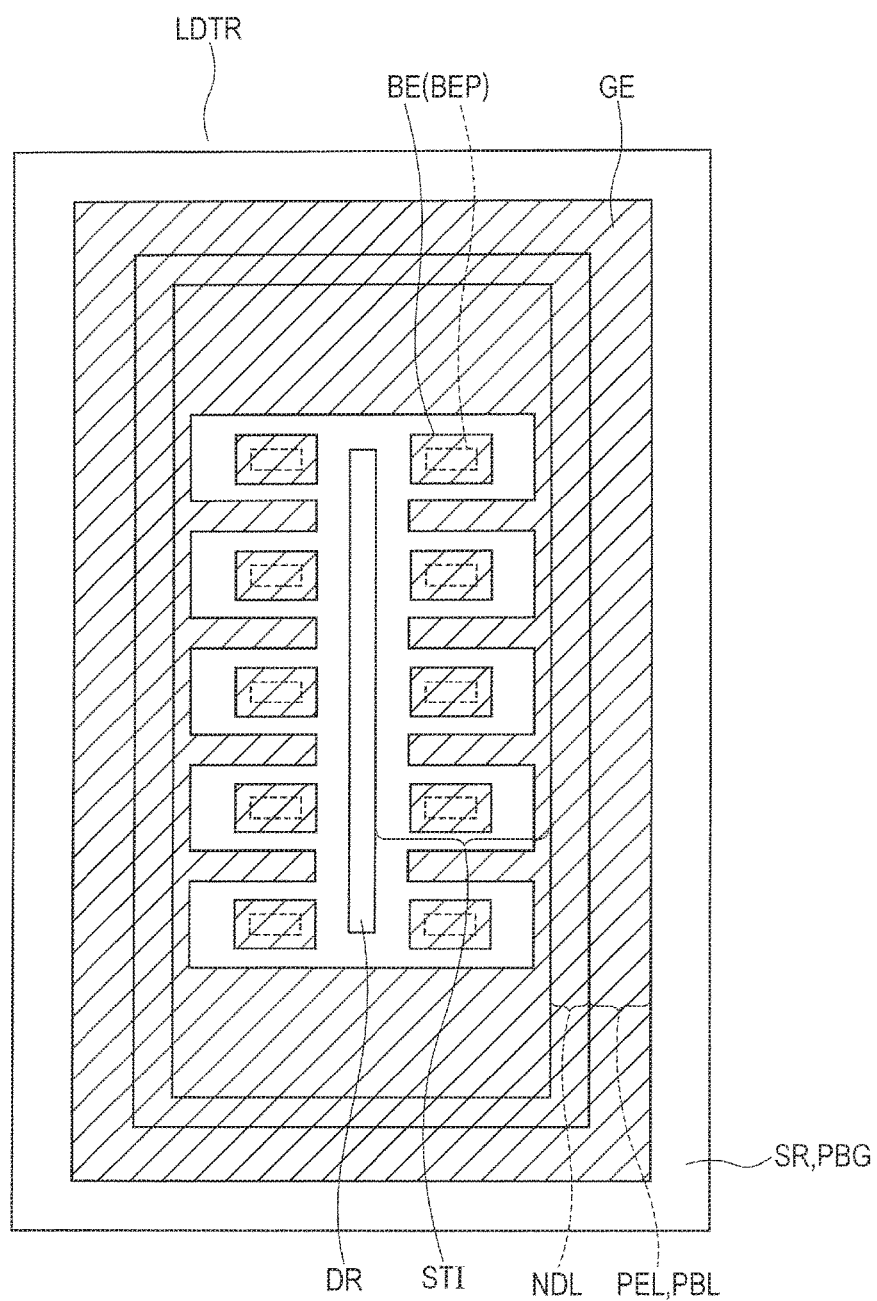
FIG. 38 is a fifth plan view for showing a variation of the planar structure of the semiconductor device in the third embodiment.

Further, in addition to the pattern in which the buried parts BEP are continuously formed along the longitudinal direction of the drain region DR, a dot or slit pattern in which the buried parts BEP are arranged in the longitudinal direction at a distance away from each other may be employed as shown in FIG. 36 or FIG. 37. Further, as shown in FIG. 38, a pattern in which a gate electrode GE is extended between the buried parts BEP arranged at a distance away from each other may be employed.

In particular, in the case where the buried parts BEP are arranged at a distance away from each other, it is assumed that an accumulation layer of electric charges is differently formed between a part (part A) of an n-type drift layer located immediately under a part of an isolation insulating film STI having no buried parts BEP arranged and a part (part B) of the n-type drift layer located immediately under a part of the isolation insulating film STI having the buried parts BEP arranged. Namely, it is assumed that in the case where the voltage applied to the buried electrode BEP is relatively low, the accumulation layer similar to that formed at the part B is hardly formed at the part A, and the ON-resistance is increased.

Accordingly, it is assumed that by disposing the gate electrode GE while extending between the buried parts BEP adjacent to each other, the level of the accumulation layer formed at the part A becomes closer to the level of that formed at the part B in the case where the voltage applied to the buried electrode BE is low, and the ON-resistance can be suppressed from being increased.

Figure 39:
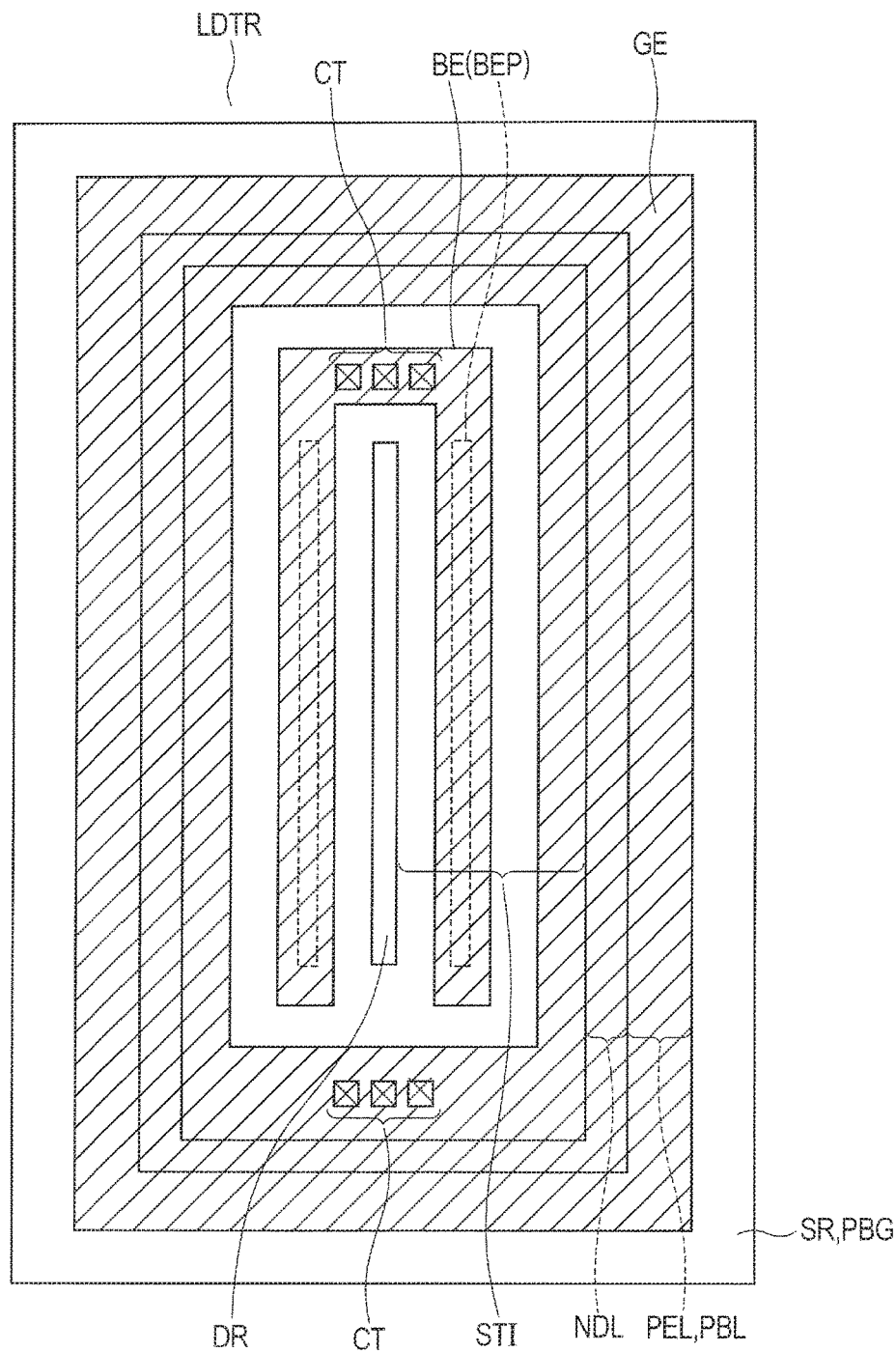
FIG. 39 is a sixth plan view for showing a variation of the planar structure of the semiconductor device in the third embodiment.
Figure 40:
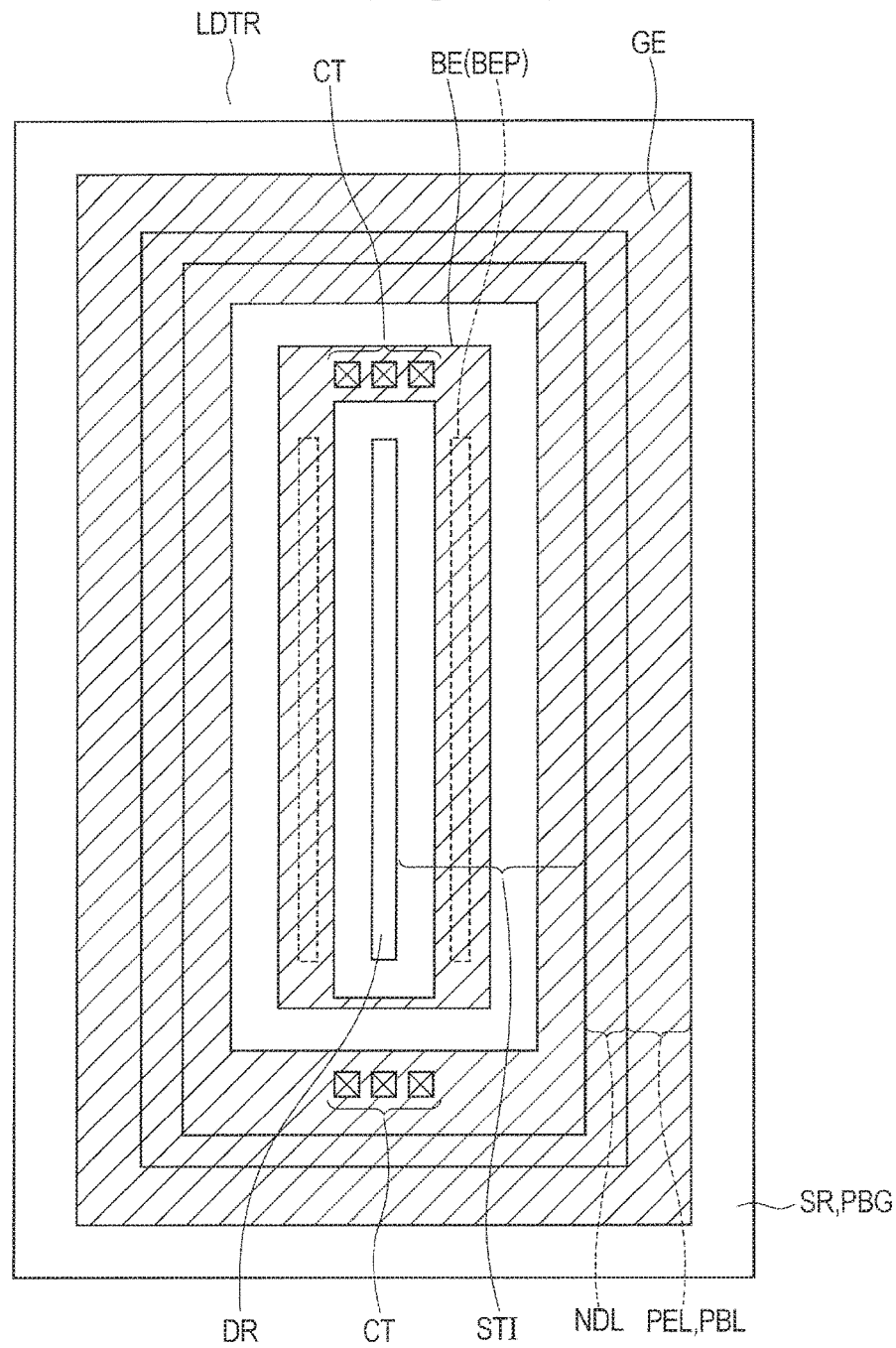
FIG. 40 is a seventh plan view for showing a variation of the planar structure of the semiconductor device in the third embodiment.
Figure 41:
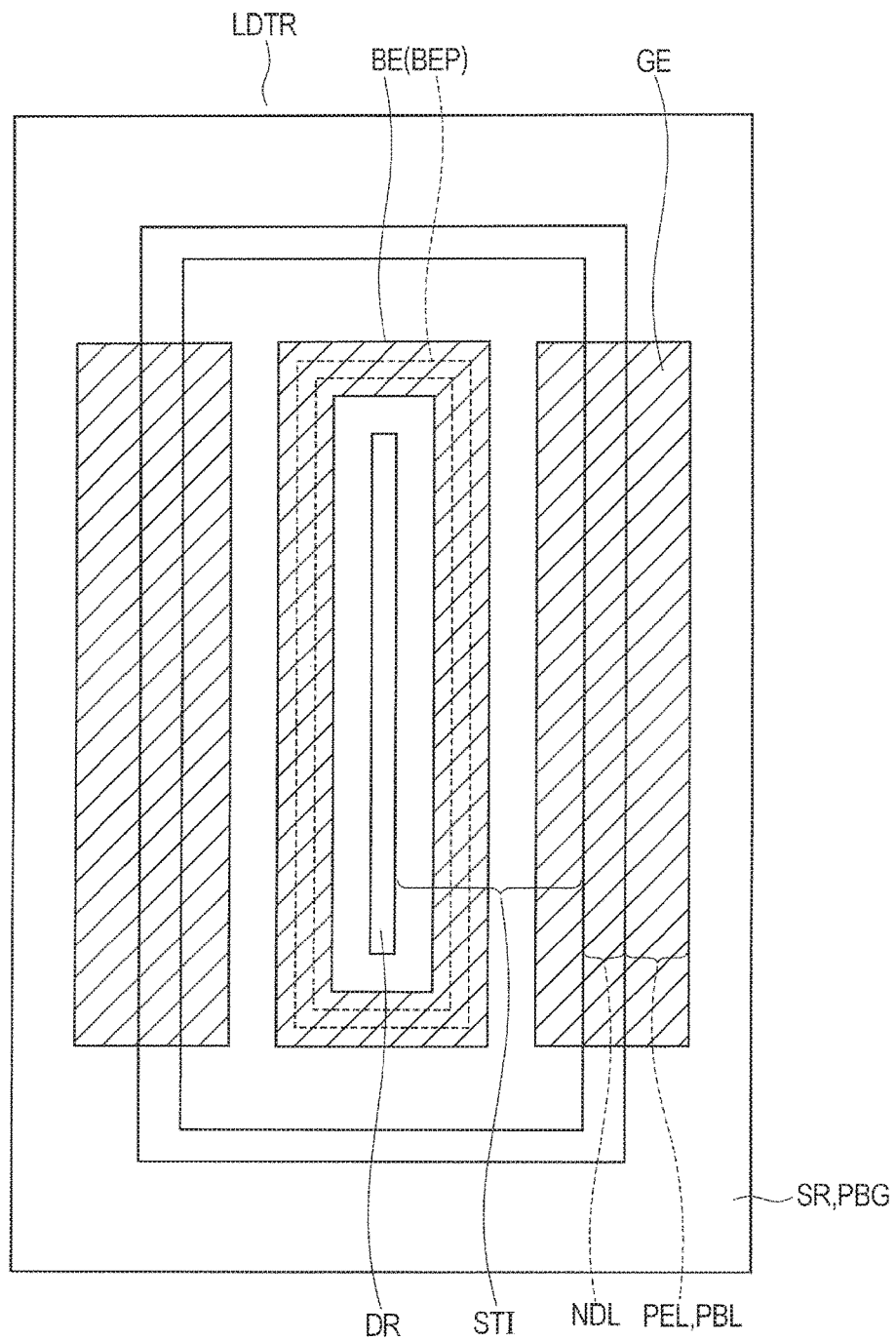
FIG. 41 is an eighth plan view for showing a variation of the planar structure of the semiconductor device in the third embodiment.
Figure 42:
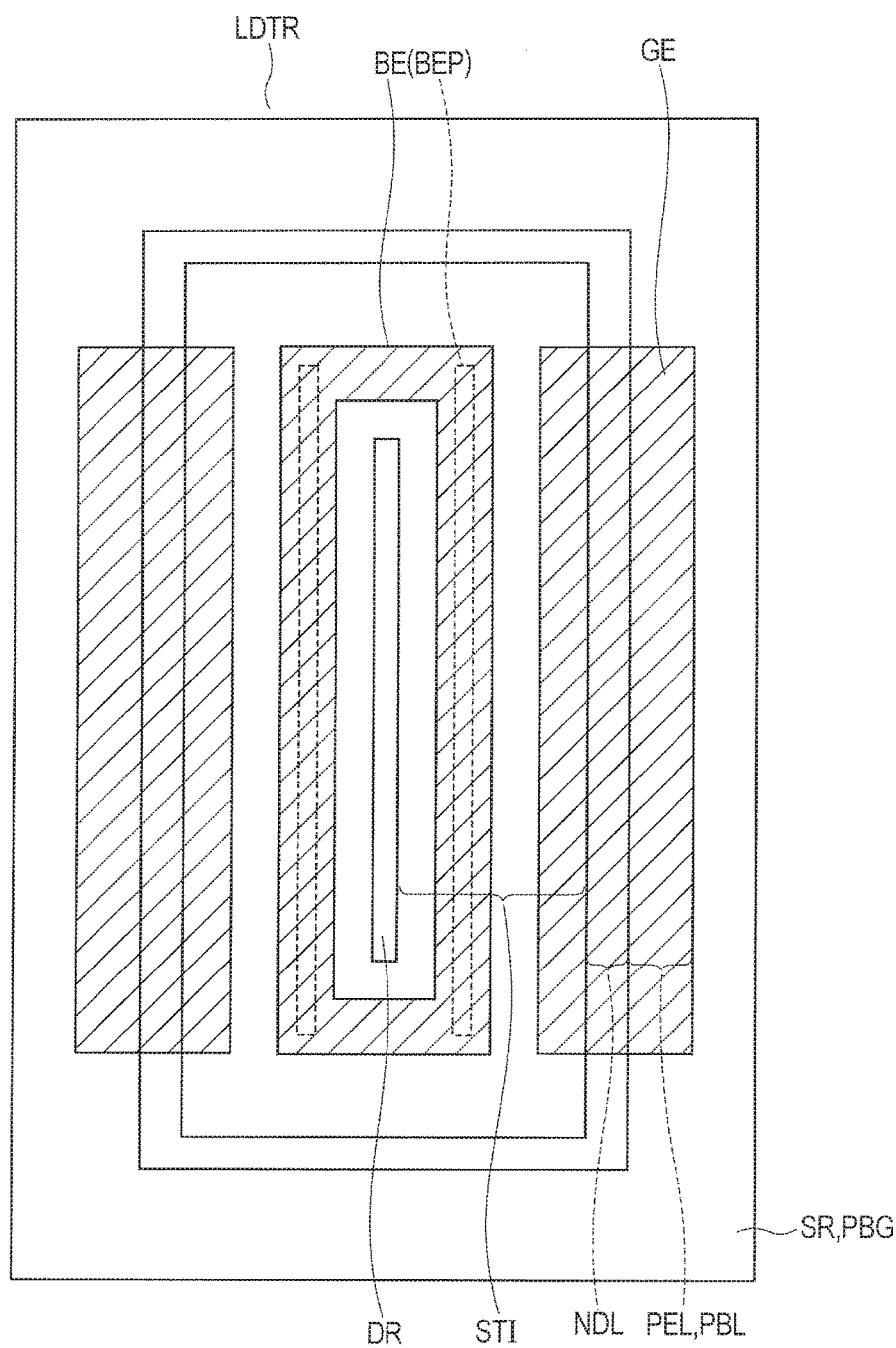
FIG. 42 is a ninth plan view for showing a variation of the planar structure of the semiconductor device in the third embodiment.
Figure 43:
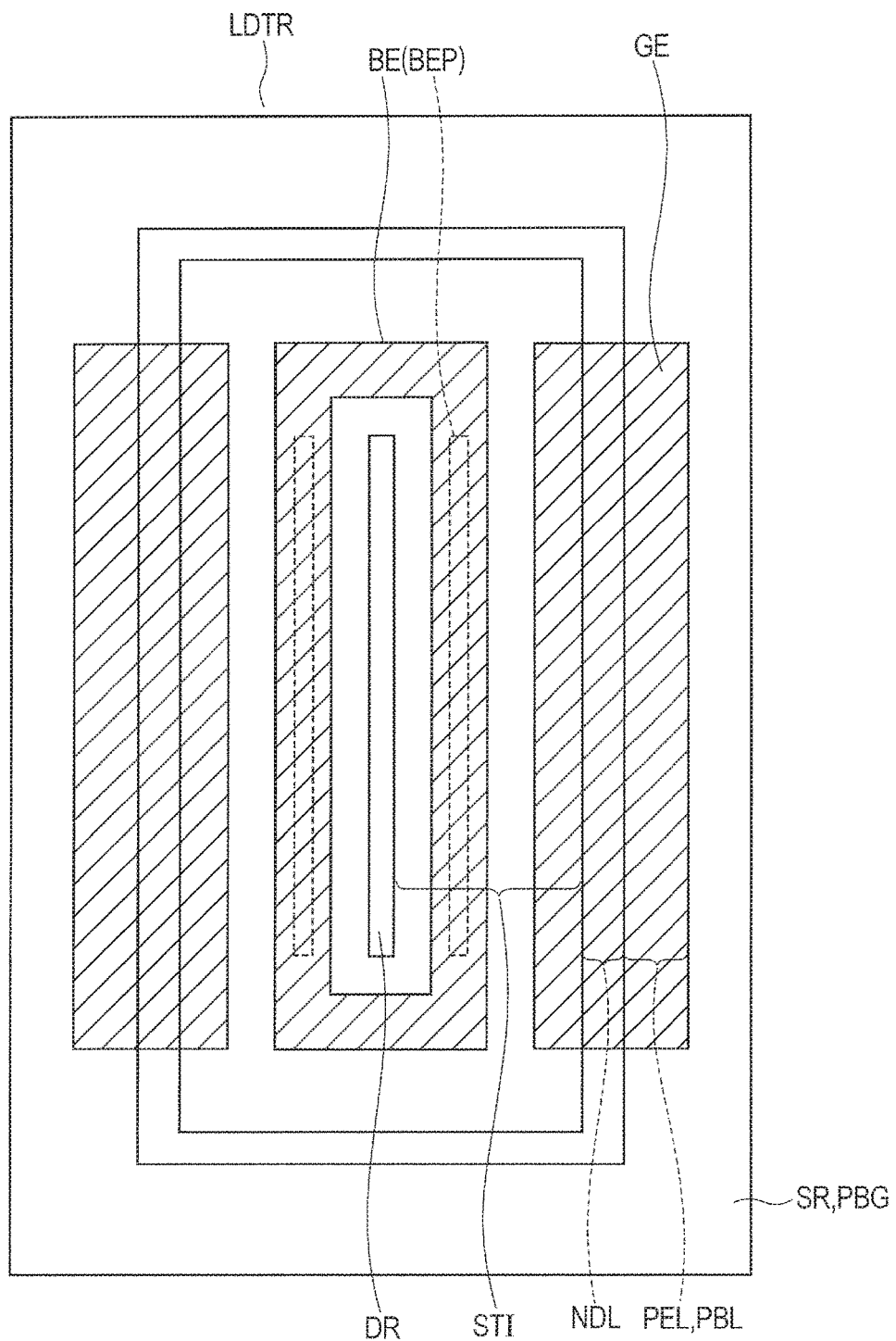
FIG. 43 is a tenth plan view for showing a variation of the planar structure of the semiconductor device in the third embodiment.
Figure 44:
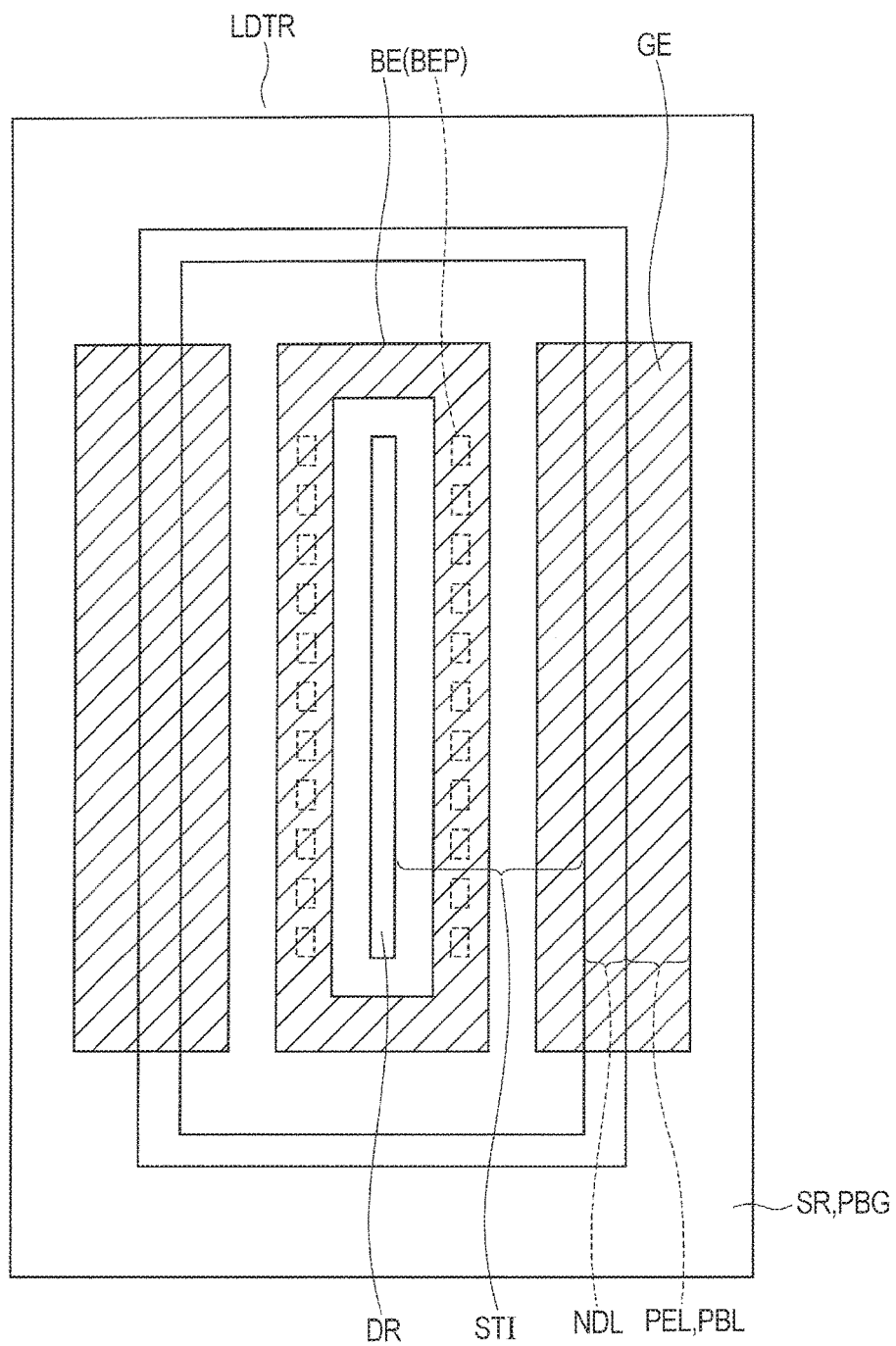
FIG. 44 is an eleventh plan view for showing a variation of the planar structure of the semiconductor device in the third embodiment.
Figure 45:
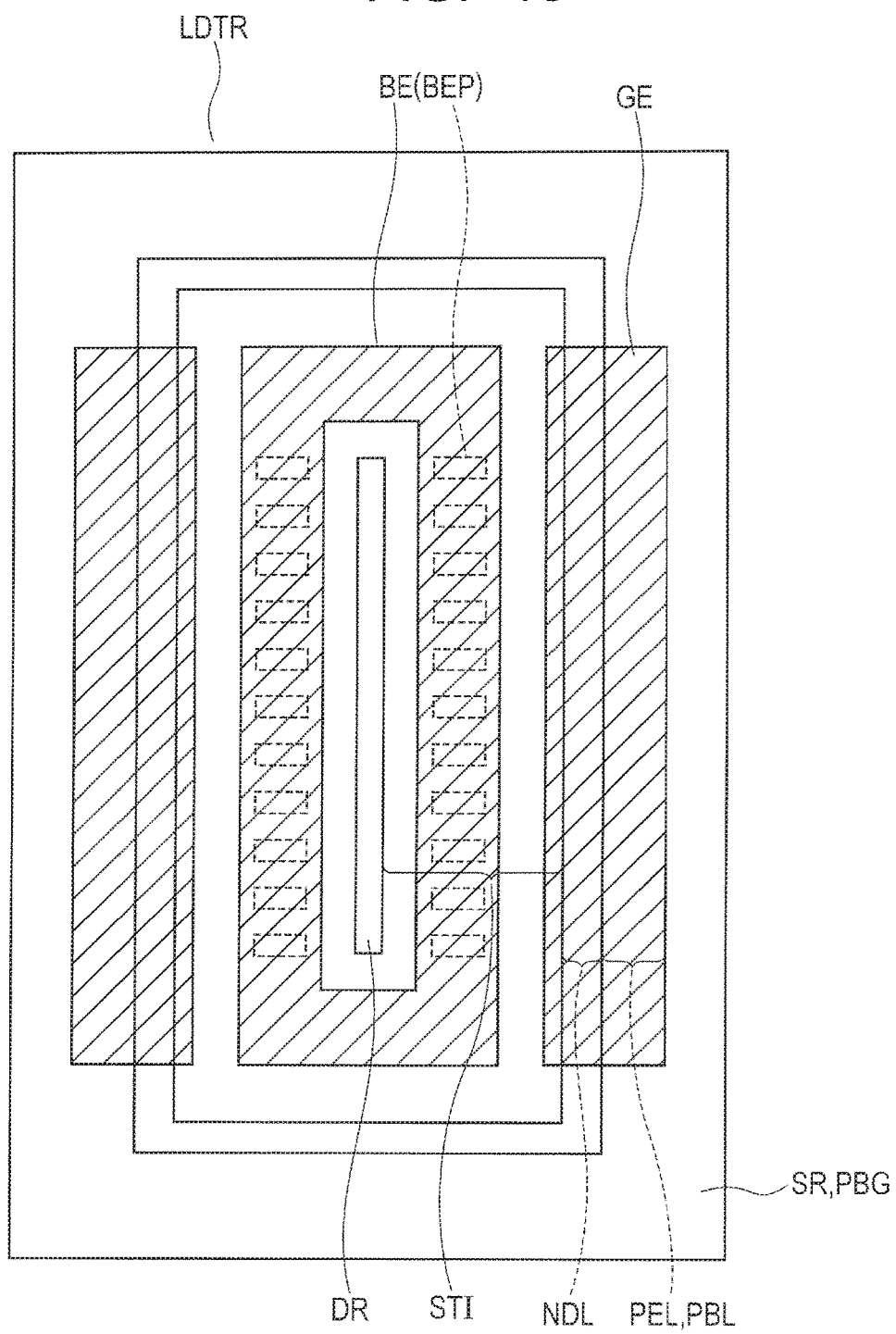
FIG. 45 is a twelfth plan view for showing a variation of the planar structure of the semiconductor device in the third embodiment.

Further, as shown in FIG. 39 or FIG. 40, contact plugs (contacts CT) coupled to the buried electrodes BE and those coupled to the gate electrode GE are arranged in the region of the isolation insulating film STI in some cases. In this case, for example, the buried electrodes BE and the gate electrode GE may be formed in an asymmetric shape relative to a bisector bisecting the drain region DR extending in one direction.

Further, as the planar pattern of the gate electrode GE, an example of the circular planar pattern (see FIG. 1, FIG. 34, FIG. 35, FIG. 36, and FIG. 37) has been given. However, the planar pattern of the gate electrode GE is not limited to the circular planar pattern. For example, a non-circular planar pattern may be formed as shown in each of FIG. 41, FIG. 42, FIG. 43, FIG. 44, and FIG. 45.

Figure 46:
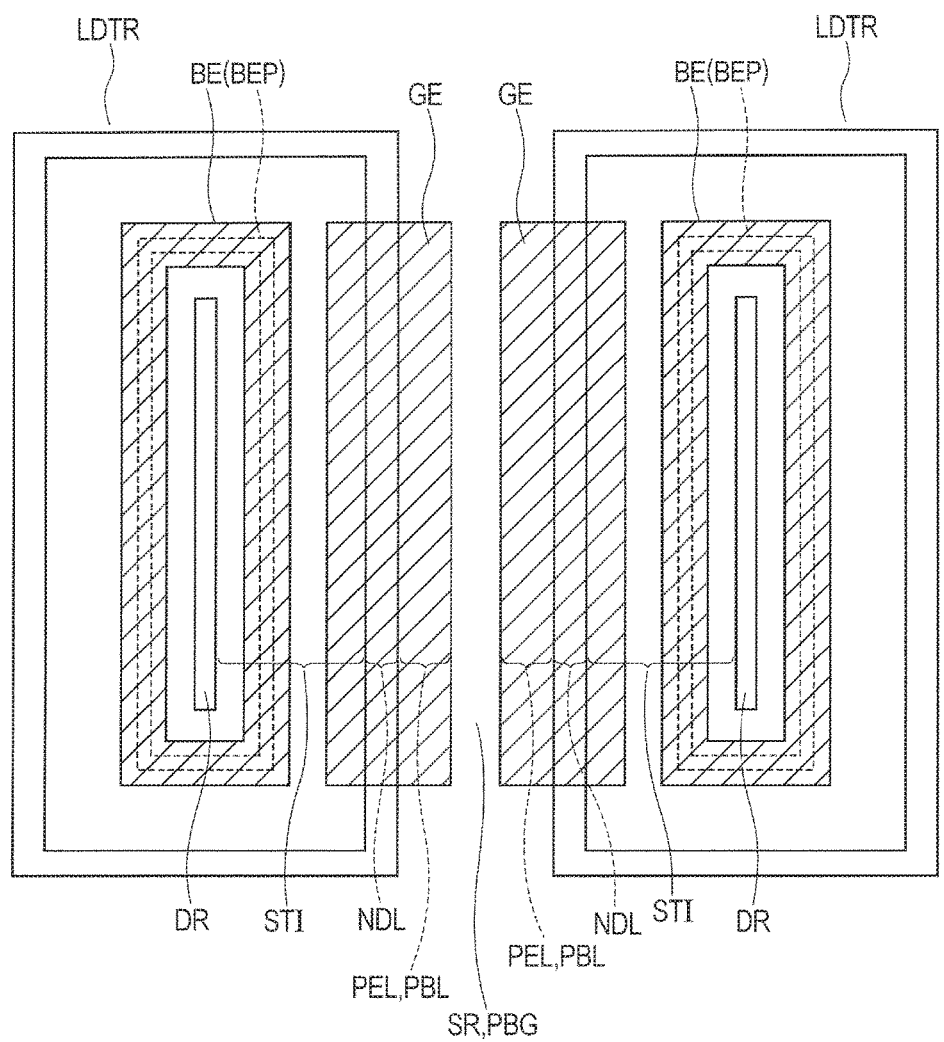
FIG. 46 is a thirteenth plan view for showing a variation of the planar structure of the semiconductor device in the third embodiment.

Further, for example, as shown in FIG. 46, in a semiconductor device in which two lateral MOS transistors LDTR having a common source region SR are arranged, the gate electrode GE may be arranged in each lateral MOS transistor LDTR in order to individually operate the two lateral MOS transistors LDTR.

Figure 47:
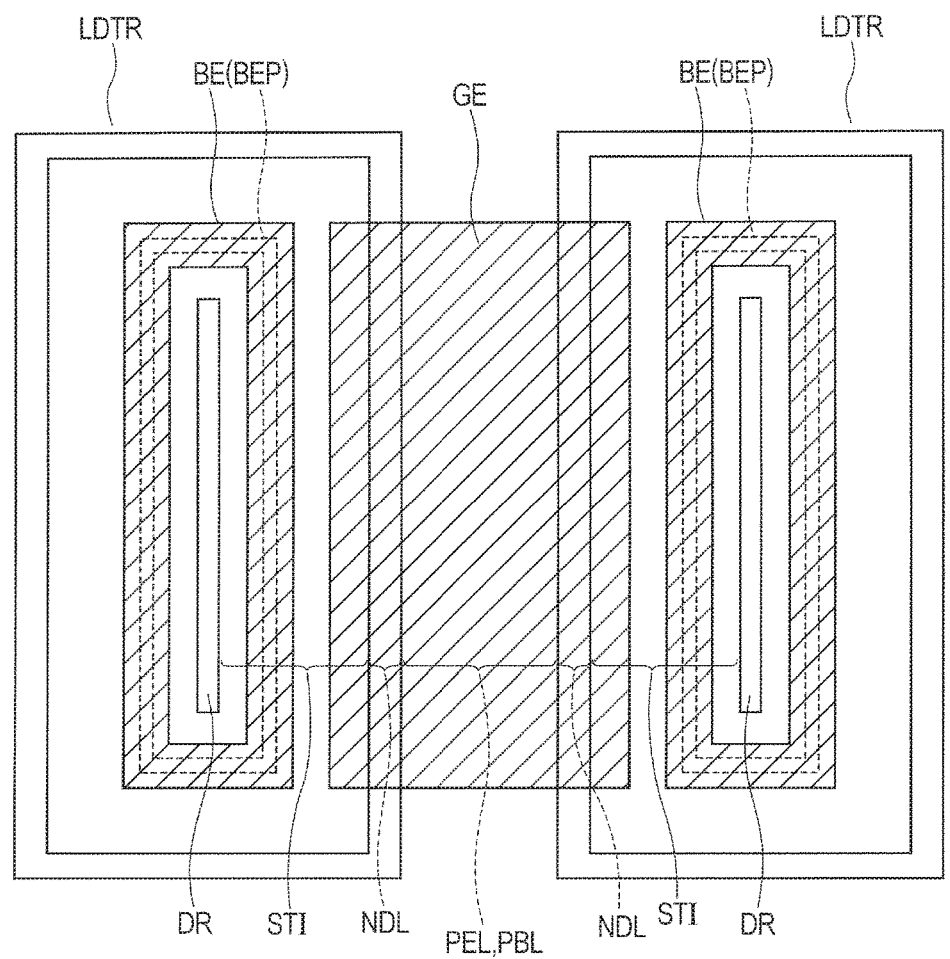
FIG. 47 is a fourteenth plan view for showing a variation of the planar structure of the semiconductor device in the third embodiment.

Further, as shown in FIG. 47, in order to operate the both of the two lateral MOS transistors, the gate electrode GE may be arranged so as to continuously cover from a part of the isolation insulating film STI of one lateral MOS transistor to a part of the isolation insulating film STI of the other lateral MOS transistor. It should be noted that as the planar pattern of the buried electrodes BE (buried parts BEP), the planar pattern shown in each of FIG. 34 to FIG. 40 may be applied even to the semiconductor device shown in FIG. 46 or FIG. 47, in addition to the planar pattern shown in FIG. 46 or FIG. 47.

Fourth Embodiment

In the first embodiment, the semiconductor device in which the buried electrode is electrically coupled to the drain region, and the voltage same as that applied to the drain region is applied to the buried electrode has been described. Further, in the second embodiment, the semiconductor device in which a desired voltage different from that applied to the drain region and the like is applied to the buried electrode has been described.

In particular, in the case where the voltage is individually applied to the buried electrode, there is one method in which a dedicated circuit is provided to apply the voltage to the buried electrode. In this case, however, the dedicated circuit needs to have a function of applying the voltage to the buried electrode only when the lateral MOS transistor is operated.

Further, there is another method in which the voltage (drain voltage) applied to the drain region or the voltage (gate voltage) applied to the gate electrode is applied by being divided by, at least, one of a resistive element and a capacitive element (resistive division or capacitive division). In the resistive division or the capacitive division, a desired resistive element or capacitive element may be arranged around a region where the lateral MOS transistor is arranged, and the configuration is simplified as compared to the case in which the dedicated circuit is provided.

Here, a semiconductor device in which a desired voltage is applied to the buried electrode using the resistive element or capacitive element will be described.

Figure 48:
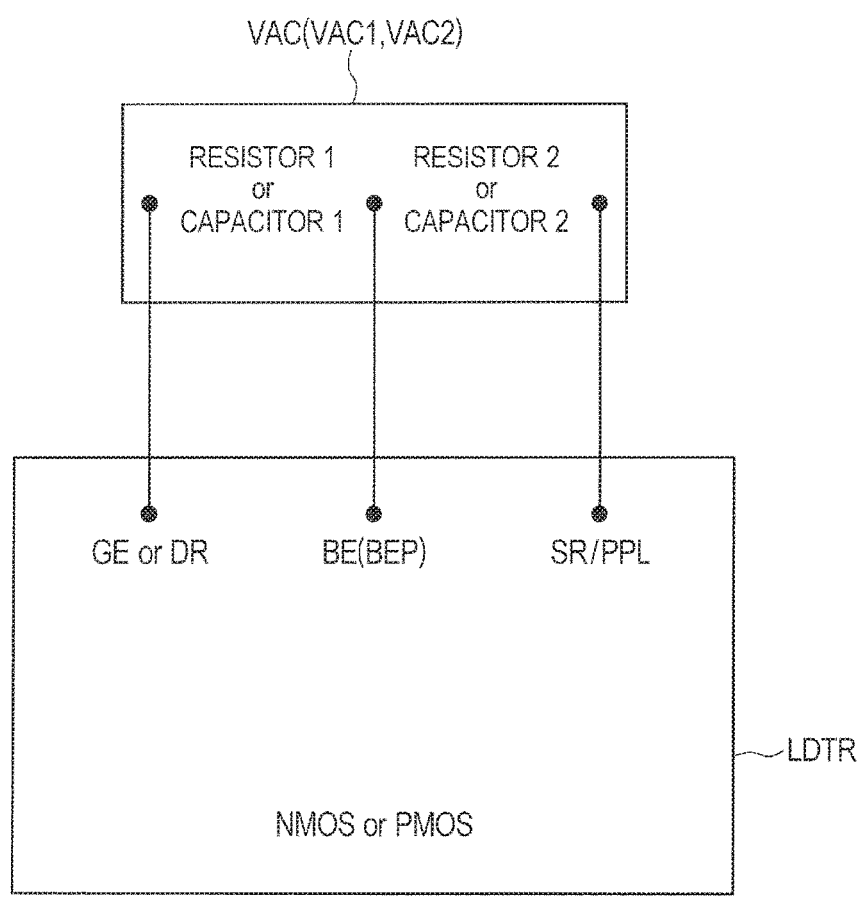
FIG. 48 is a diagram for schematically showing a planar structure of a semiconductor device according to a fourth embodiment.

First, a schematic planar structure will be described. As shown in FIG. 48, a voltage applying part VAC that applies a desired voltage to a buried electrode BE is arranged around a region where a lateral MOS transistor LDTR is formed. The voltage applying part VAC is configured using resistive elements (resistors 1 and 2) or capacitive elements (capacitors 1 and 2), and there are, for example, two coupling configurations. The first coupling configuration is a coupling configuration (first example) in which the voltage applying part VAC is electrically coupled between a drain region DR and a source region SR (p+ layer PPL (back gate)). The second coupling configuration is a coupling configuration (second example) in which the voltage applying part VAC is electrically coupled between a gate electrode GE and the source region SR (p+ layer PPL (back gate)). The first example and the second example will be described in detail.

First Example

Figure 49:
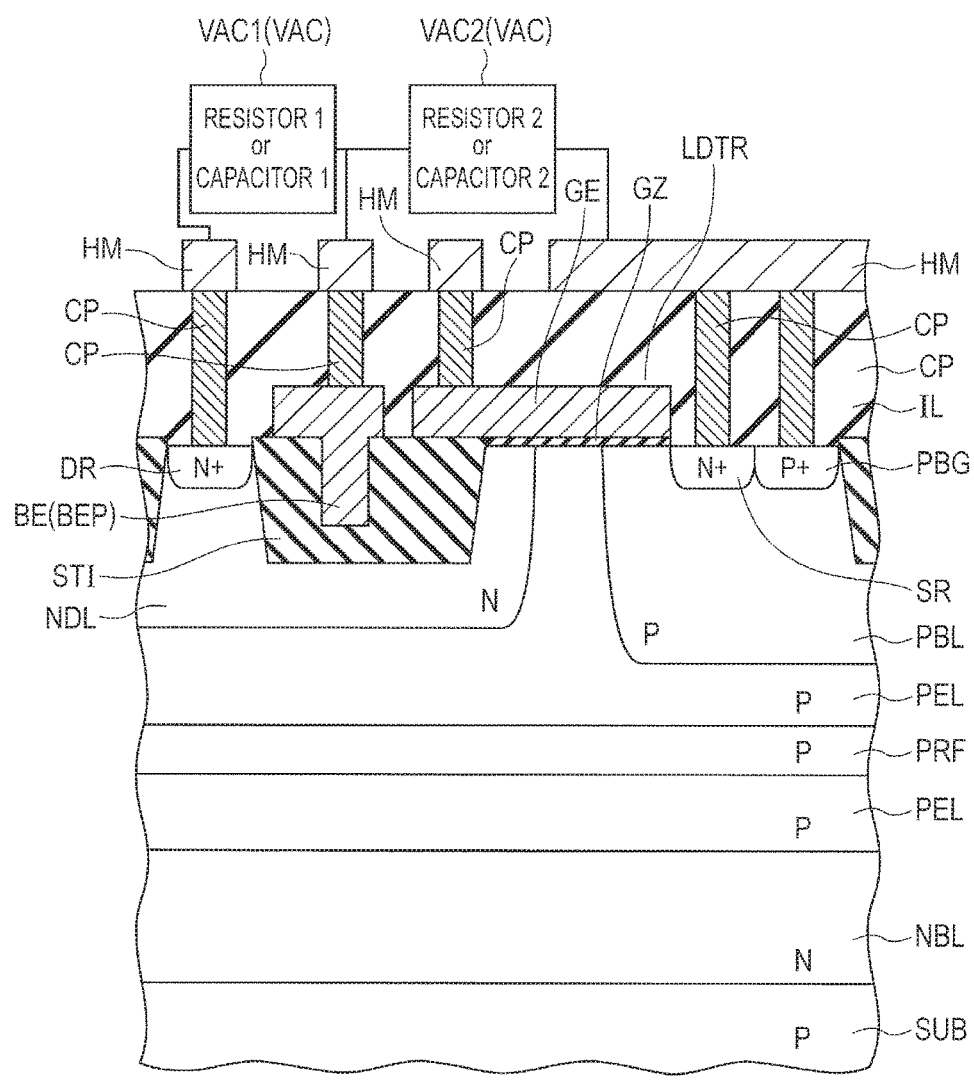
FIG. 49 is a cross-sectional view of a semiconductor device according to a first example in the fourth embodiment.

As shown in FIG. 49, in a semiconductor device according to the first example, a voltage (electric potential difference) between the drain region DR (drain voltage) and the source region SR (source voltage) is divided by a voltage applying part VAC1 (the resistor 1 or the capacitor 1) and a voltage applying part VAC2 (the resistor 2 or the capacitor 2). When the drain voltage is applied to the drain region DR to operate the lateral MOS transistor, a desired voltage lower than the drain voltage is applied to the buried electrode BE by the resistive elements or the capacitive elements.

In the semiconductor device according to the first example, as a voltage applied to the buried electrode BE, a desired voltage lower than the drain voltage can be set within the range of the voltage (electric potential difference)

between the drain voltage and the source voltage by the resistor 1 or the capacitor 1 and the resistor 2 or the capacitor 2, and it is not necessary to provide a dedicated circuit that applies a desired voltage to the buried electrode BE in accordance with the operation of the lateral MOS transistor.

Second Example

Figure 50:
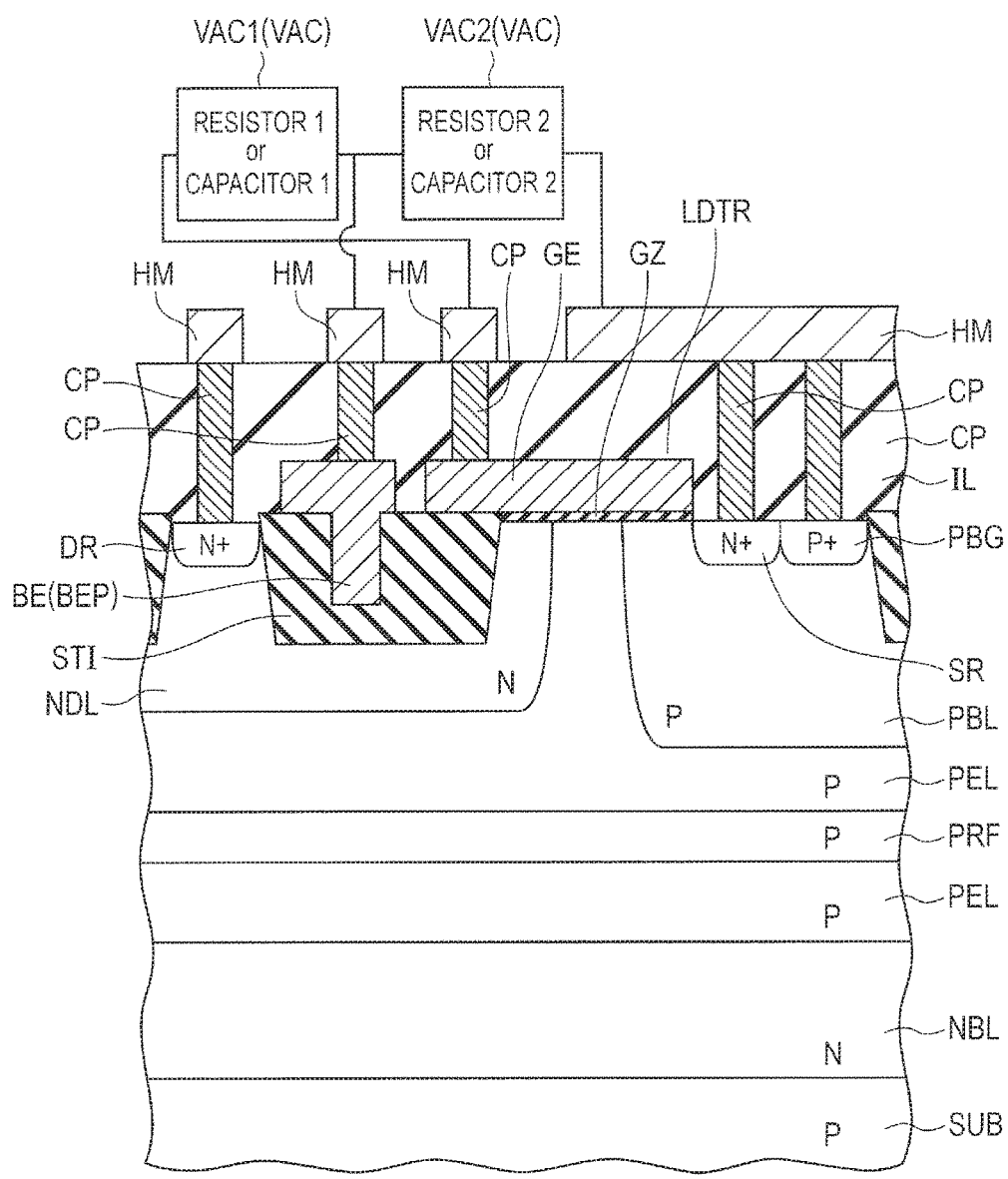
FIG. 50 is a cross-sectional view of a semiconductor device according to a second example in the fourth embodiment.

As shown in FIG. 50, in a semiconductor device according to the second example, a voltage (electric potential difference) between the gate electrode GE (gate voltage) and the source region SR (source voltage) is divided by the voltage applying part VAC1 (the resistor 1 or the capacitor 1) and the voltage applying part VAC2 (the resistor 2 or the capacitor 2). When the gate voltage is applied to the gate electrode GE to operate the lateral MOS transistor, a desired voltage lower than the gate voltage is applied to the buried electrode BE by the resistive elements or the capacitive elements.

In the lateral MOS transistor LDTR, the gate voltage applied to the gate electrode GE is lower than the drain voltage applied to the drain region DR. Therefore, in the semiconductor device according to the second example, the voltage applied to the buried electrode BE can be set within the range of a lower voltage (electric potential difference) as compared to the first example. In particular, it is possible to contribute to reduction in the substrate current and suppression in the hot carriers.

Fifth Embodiment

Here, a variation of the structures of a buried electrode and a gate electrode will be described.

First Example

Figure 51:
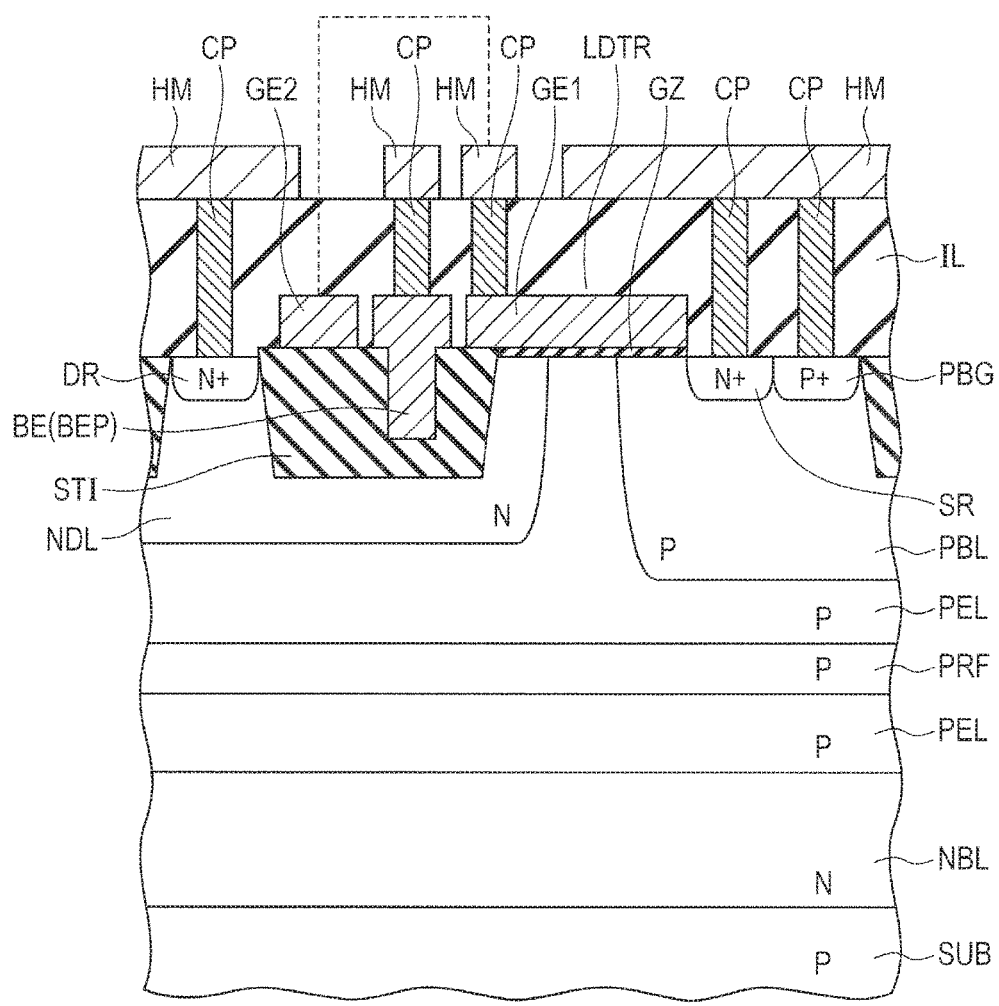
FIG. 51 is a cross-sectional view of a semiconductor device according to a first example in a fifth embodiment.

As shown in FIG. 51, in a semiconductor device according to a first example, a first gate electrode GE1 and a second gate electrode GE2 are formed as gate electrodes. The original gate electrode is the first gate electrode GE1. The second gate electrode GE2 is formed at a part of an isolation insulating film STI located between a buried electrode BE and a drain region DR. The gate electrode GE2 is electrically coupled to the gate electrode GE1 (see the dotted line). It should be noted that the other configurations are the same as those of the semiconductor device shown in FIG. 18. Accordingly, the same signs are given to the same members, and the explanations thereof will not be repeated except where absolutely necessary.

The above-described semiconductor device can be manufactured by the manufacturing method described in the second embodiment by changing the patterning shape of a polysilicon film PSF so as to form the two gate electrodes GE1 and GE2.

In the above-described semiconductor device, the gate electrode GE2 is formed at a part of the isolation insulating film STI located between the buried electrode BE and the drain region DR. Accordingly, the field plate effect by the gate electrode GE2 electrically coupled to the gate electrode GE1 can be obtained, and it is possible to contribute to improvement in the OFF-breakdown voltage as compared to the semiconductor device having no gate electrode GE2 formed.

Second Example

A semiconductor device according to a second example is obtained by combining the semiconductor device (see FIG. 2) according to the first embodiment with the semiconductor device (see FIG. 18) according to the second embodiment.

Figure 52:
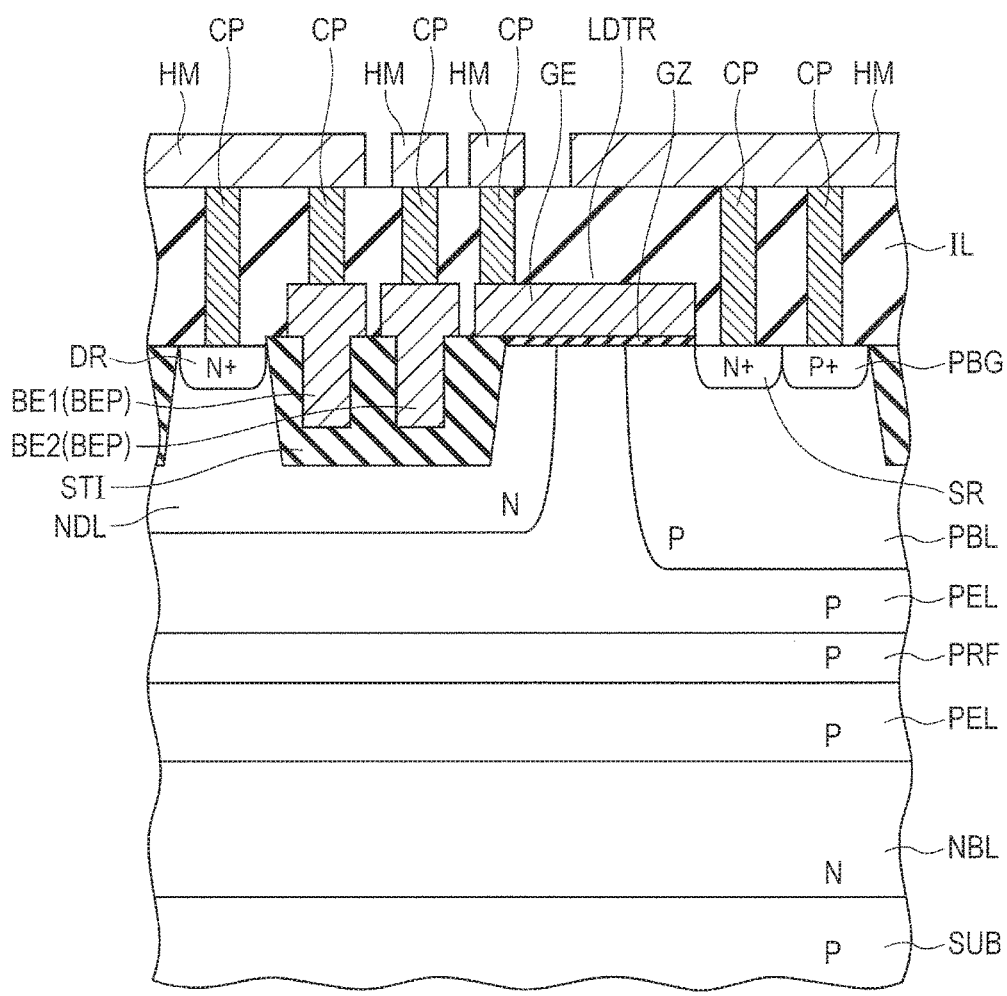
FIG. 52 is a cross-sectional view of a semiconductor device according to a second example in the fifth embodiment.

As shown in FIG. 52, a first buried electrode BE1 and a second buried electrode BE2 are formed as buried electrodes. The buried electrode BE1 is electrically coupled to a drain region DR, and the voltage same as that applied to the drain region DR is applied to the buried electrode BE1. A desired voltage different from a drain voltage or a gate voltage is applied to the buried electrode BE2. It should be noted that the other configurations are the same as those of the semiconductor device shown in FIG. 2 or FIG. 18. Accordingly, the same signs are given to the same members, and the explanations thereof will not be repeated except where absolutely necessary.

The above-described semiconductor device can be manufactured by the manufacturing method described in the first embodiment or the second embodiment by changing the patterning shape of openings formed in an isolation insulating film STI and the patterning shape of a polysilicon film PSF so as to form the two buried electrodes BE1 and BE2.

In the above-described semiconductor device, the ON-breakdown voltage can be improved by the buried electrode BE1 as described in the first embodiment. Further, it is possible to reduce the ON-resistance and to suppress the hot carriers using the buried electrode BE2 as described in the second embodiment.

Sixth Embodiment

Here, a variation of the structure of a buried electrode will be described.

First Example

Figure 53:
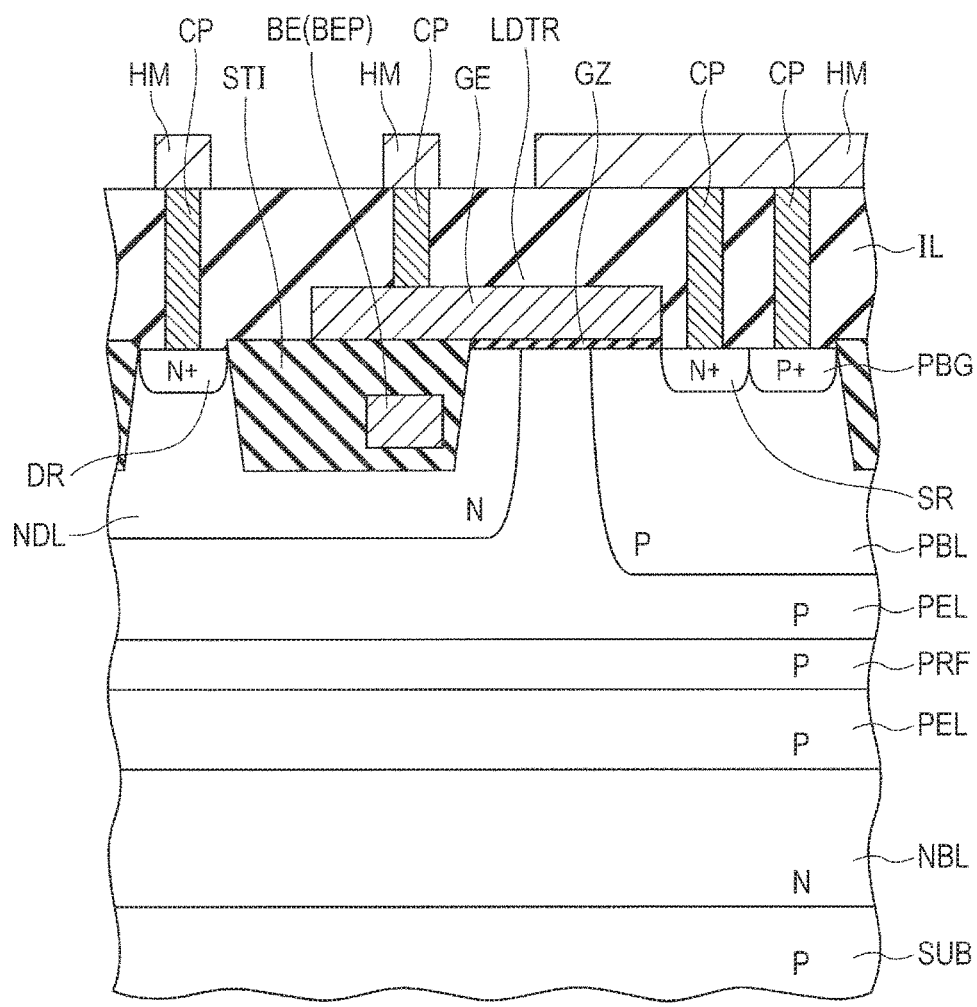
FIG. 53 is a cross-sectional view of a semiconductor device according to a first example in a sixth embodiment.

As shown in FIG. 53, in a semiconductor device according to a first example, a buried electrode BE including a buried part BEP is formed in an isolation insulating film STI. The buried electrode BE is electrically coupled to a predetermined wiring through a contact plug (not shown) and the like at a predetermined position. It should be noted that the other configurations are the same as those of the semiconductor device shown in FIG. 2 or FIG. 18. Accordingly, the same signs are given to the same members, and the explanations thereof will not be repeated except where absolutely necessary.

Figure 54:
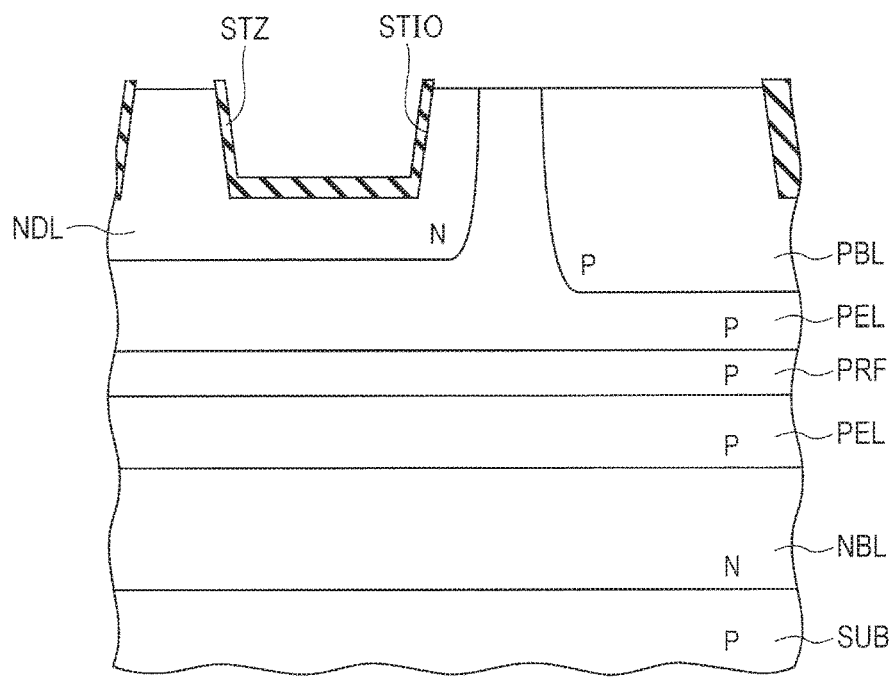
FIG. 54 is a cross-sectional view for showing a step of a manufacturing method of the semiconductor device according to the first example in the sixth embodiment.
Figure 55:
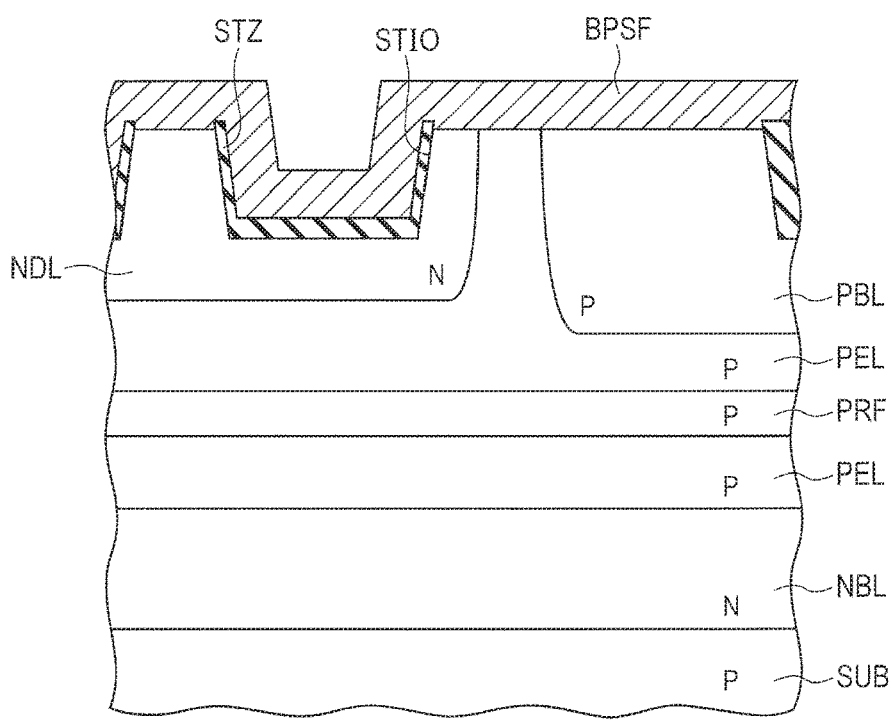
FIG. 55 is a cross-sectional view for showing a step performed after the step shown in FIG. 54 in the sixth embodiment.
Figure 56:
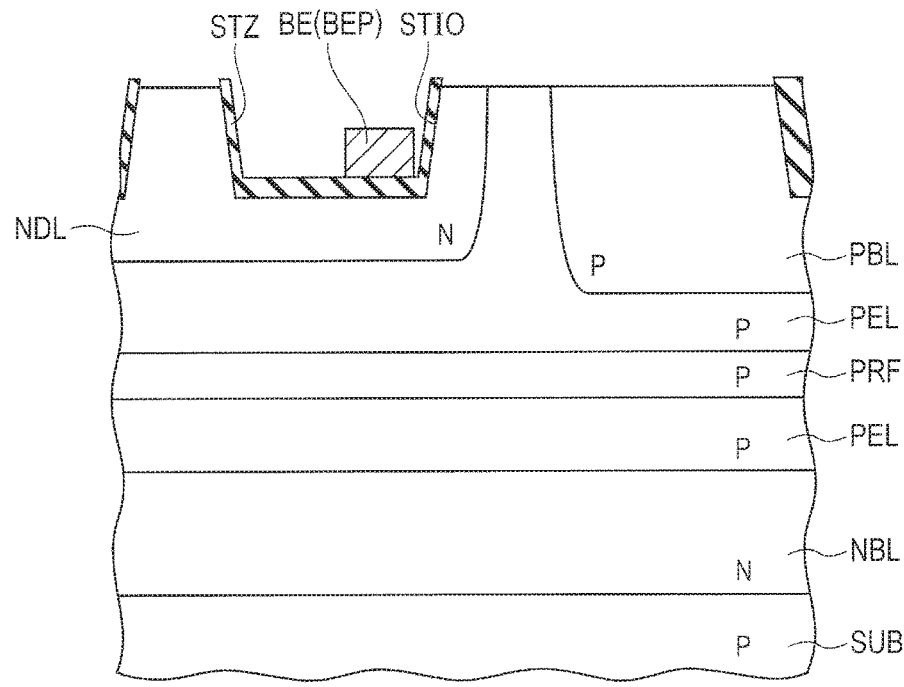
FIG. 56 is a cross-sectional view for showing a step performed after the step shown in FIG. 55 in the sixth embodiment.

Next, an example of a manufacturing method of the above-described semiconductor device will be described. After the steps same as those shown in FIG. 5, an opening STIO is formed while leaving an insulating film STZ having a predetermined thickness serving as a part of an isolation insulating film by performing a predetermined photoengraving process and etching process as shown in FIG. 54. Next, as shown in FIG. 55, a polysilicon film BPSF is formed so as to cover the side and bottom surfaces and the like of the opening STIO. Next, as shown in FIG. 56, the buried electrode BE is formed on the bottom surface of the opening STIO by performing the predetermined photoengraving process and etching process.

Figure 57:
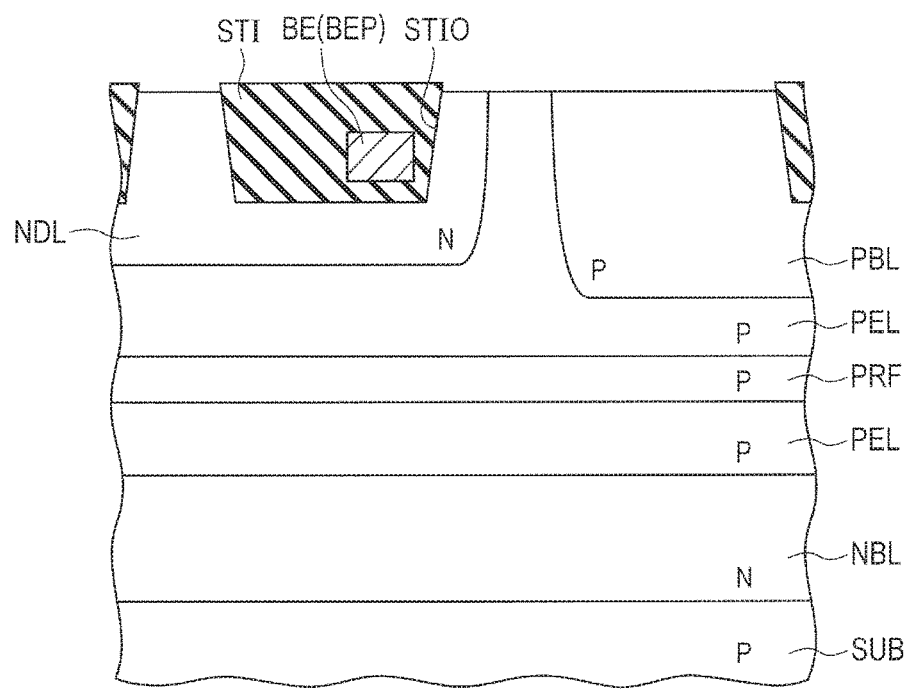
FIG. 57 is a cross-sectional view for showing a step performed after the step shown in FIG. 56 in the sixth embodiment.
Figure 58:
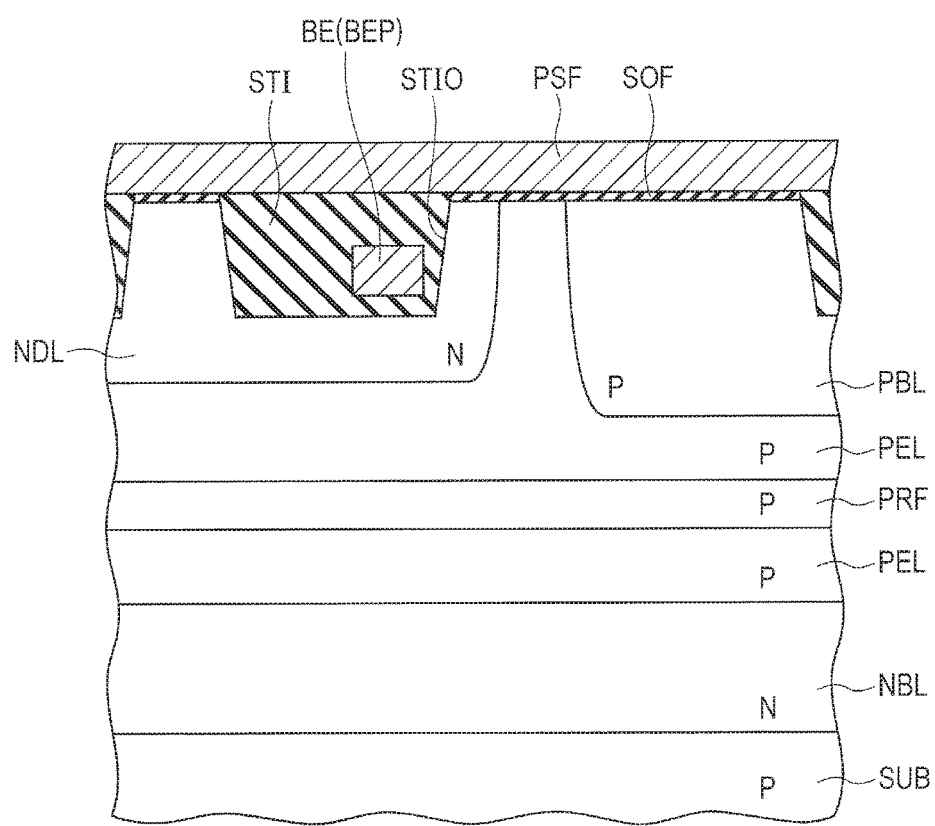
FIG. 58 is a cross-sectional view for showing a step performed after the step shown in FIG. 57 in the sixth embodiment.

Next, as shown in FIG. 57, the isolation insulating film STI is formed by forming an insulating film in the opening STIO so as to cover the buried electrode BE. Next, as shown in FIG. 58, a silicon oxide film SOF and a polysilicon film PSF are sequentially formed. Thereafter, through the steps same as those shown in FIG. 6 to FIG. 8, the primary parts of the semiconductor device shown in FIG. 53 are completed.

In the semiconductor device according to the first example, the ON-breakdown voltage can be improved as described in the first embodiment by adjusting the voltage applied to the buried electrode BE and the position in the isolation insulating film STI. Further, as described in the second embodiment, the ON-resistance can be reduced, and further it is possible to suppress deterioration of the lateral MOS transistor LDTR while suppressing the generation of the hot carriers.

Second Example

Figure 59:
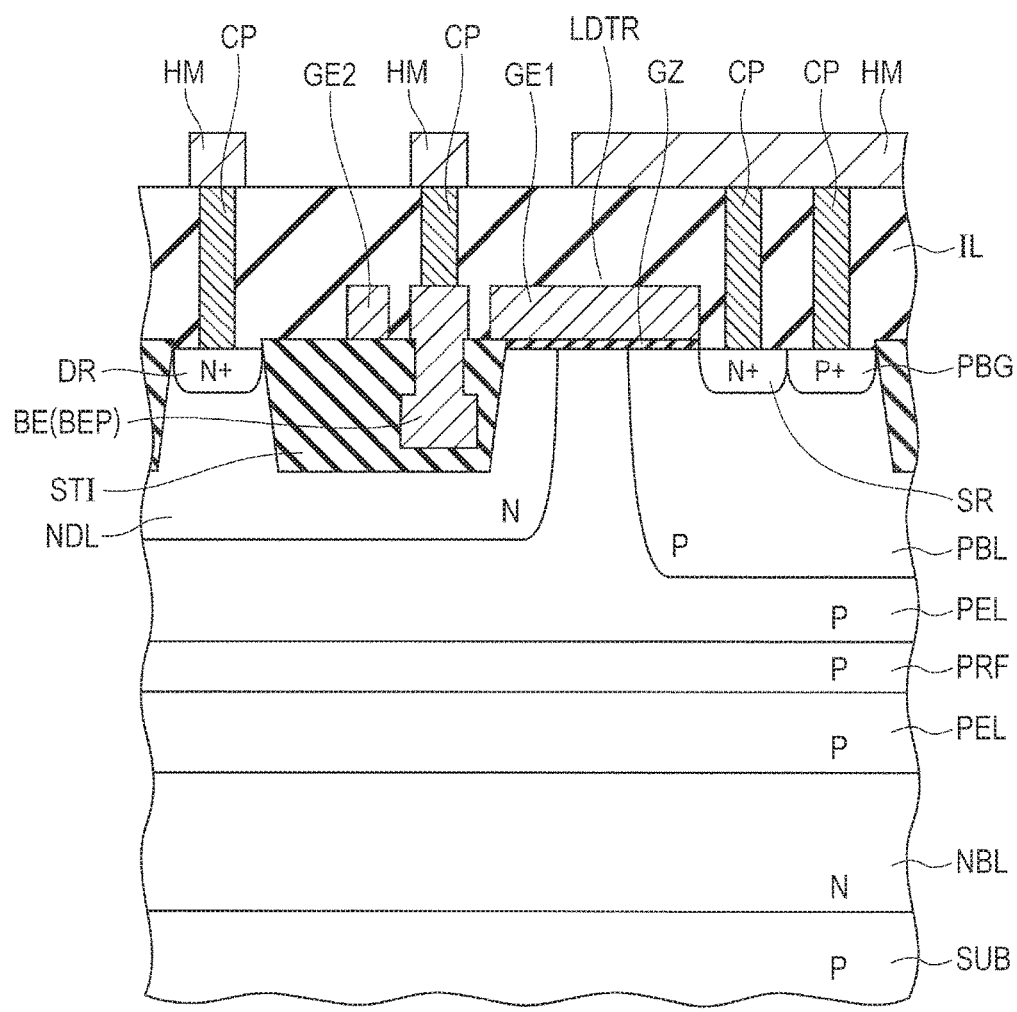
FIG. 59 is a cross-sectional view of a semiconductor device according to a second example in the sixth embodiment.

As shown in FIG. 59, a semiconductor device according to a second example is a semiconductor device having a configuration in which the semiconductor device shown in FIG. 53 is combined with the semiconductor device shown in FIG. 51. A buried electrode BE is formed in an isolation insulating film STI. As gate electrodes, a gate electrode GE1 and a gate electrode GE2 electrically coupled to the gate electrode GE1 are formed. It should be noted that the other configurations are the same as those of the semiconductor device shown in FIG. 51. Accordingly, the same signs are given to the same members, and the explanations thereof will not be repeated except where absolutely necessary.

The above-described semiconductor device can be manufactured by the manufacturing method of the semiconductor device according to the first example by mainly changing the patterning shape of the gate electrode.

In the above-described semiconductor device, the OFF-breakdown voltage can be improved by the field plate effect by the gate electrode GE2 in addition to the effect of the first example.

Third Example

Figure 60:
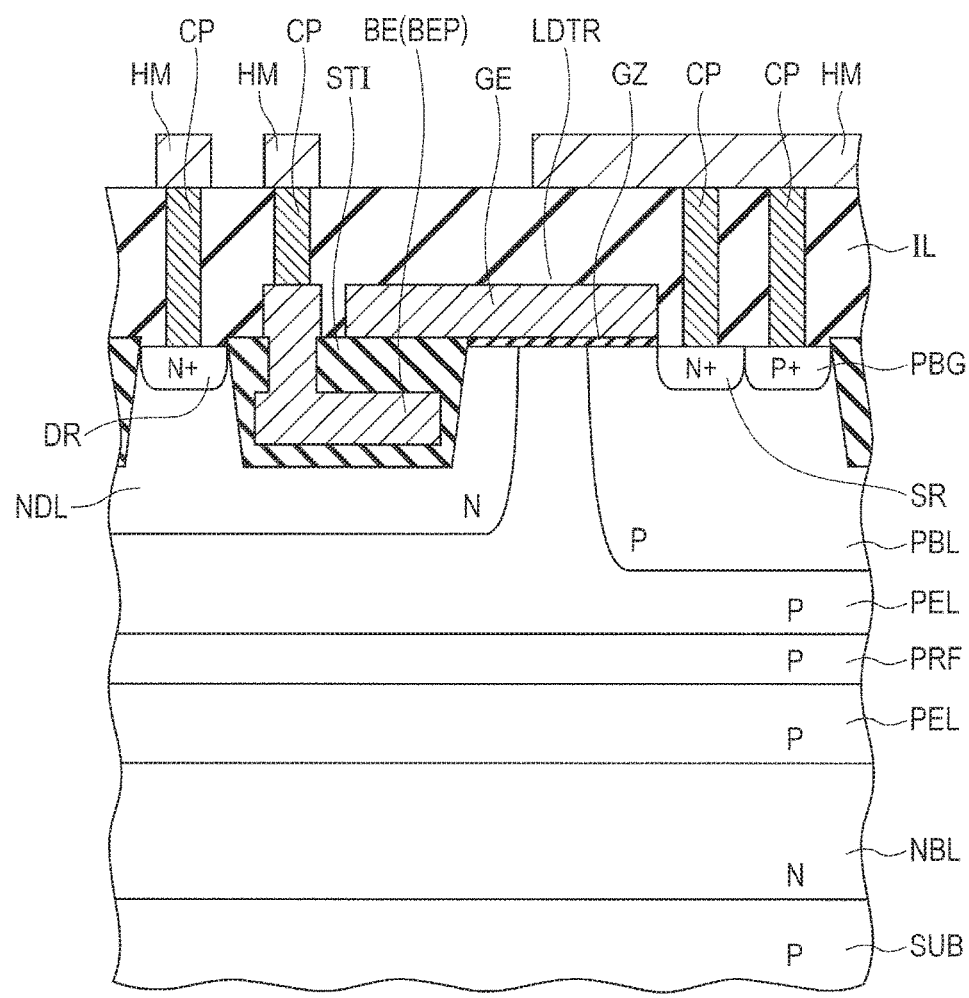
FIG. 60 is a cross-sectional view of a semiconductor device according to a third example in the sixth embodiment.

As shown in FIG. 60, in a semiconductor device according to a third example, a buried electrode BE is formed from a part of an isolation insulating film STI on the drain region DR side to a part of the isolation insulating film STI on the channel side. It should be noted that the other configurations are the same as those of the semiconductor device shown in FIG. 18 or the like. Accordingly, the same signs are given to the same members, and the explanations thereof will not be repeated except where absolutely necessary.

The above-described semiconductor device can be manufactured by the manufacturing method of the semiconductor device according to the first example by mainly changing the patterning shape of the buried electrode BE. In the above-described semiconductor device, the effect same as that of the first example can be obtained by the buried electrode BE.

Seventh Embodiment

As the base structure of the semiconductor device in which the lateral MOS transistor and the like are formed, an example in which the n-type buried layer NBL and the p-type RESURF layer PRF are formed in the p-type epitaxial layer PEL formed on the surface of the p-type semiconductor substrate SUB has been described in each of the above-described embodiments. Here, a variation of the structure of the semiconductor device such as a base will be described. It should be noted that the buried electrode and the lateral MOS transistor according to the first embodiment are representatively shown in each drawing as a buried electrode and a lateral MOS transistor. However, the buried electrode and the lateral MOS transistor described in the second embodiment may be applied.

Figure 61:
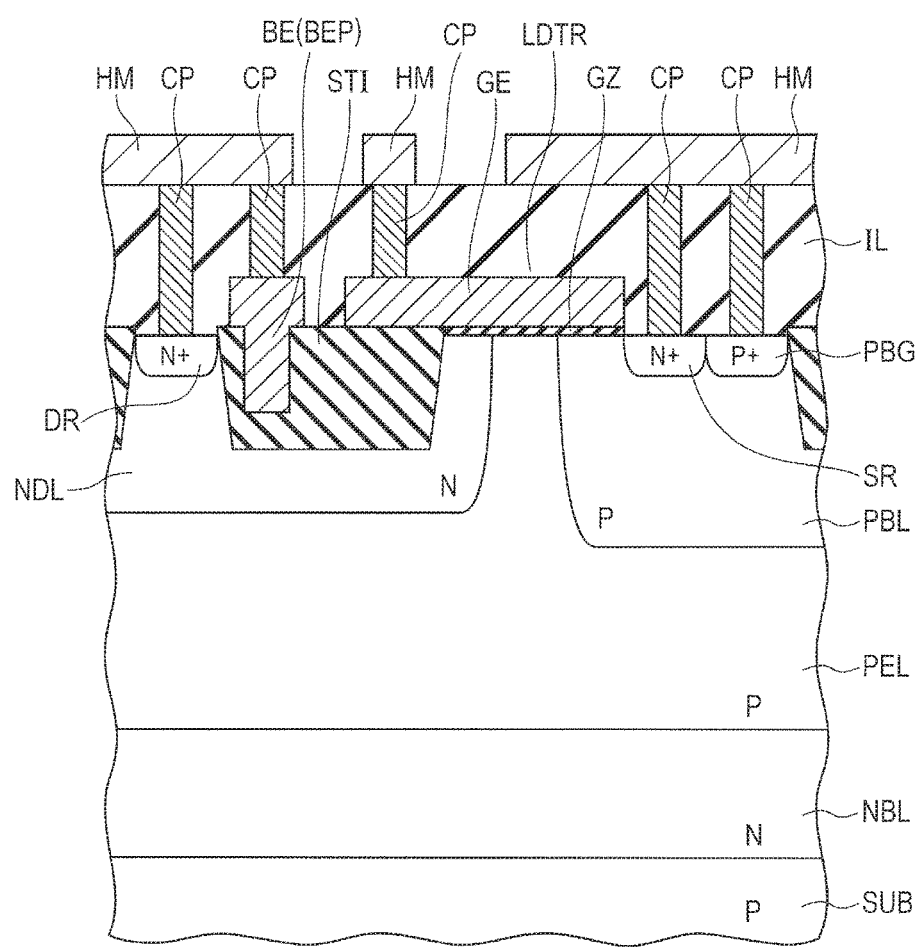
FIG. 61 is a first cross-sectional view for showing a variation of a structure of a semiconductor device according to a seventh embodiment.
Figure 62:
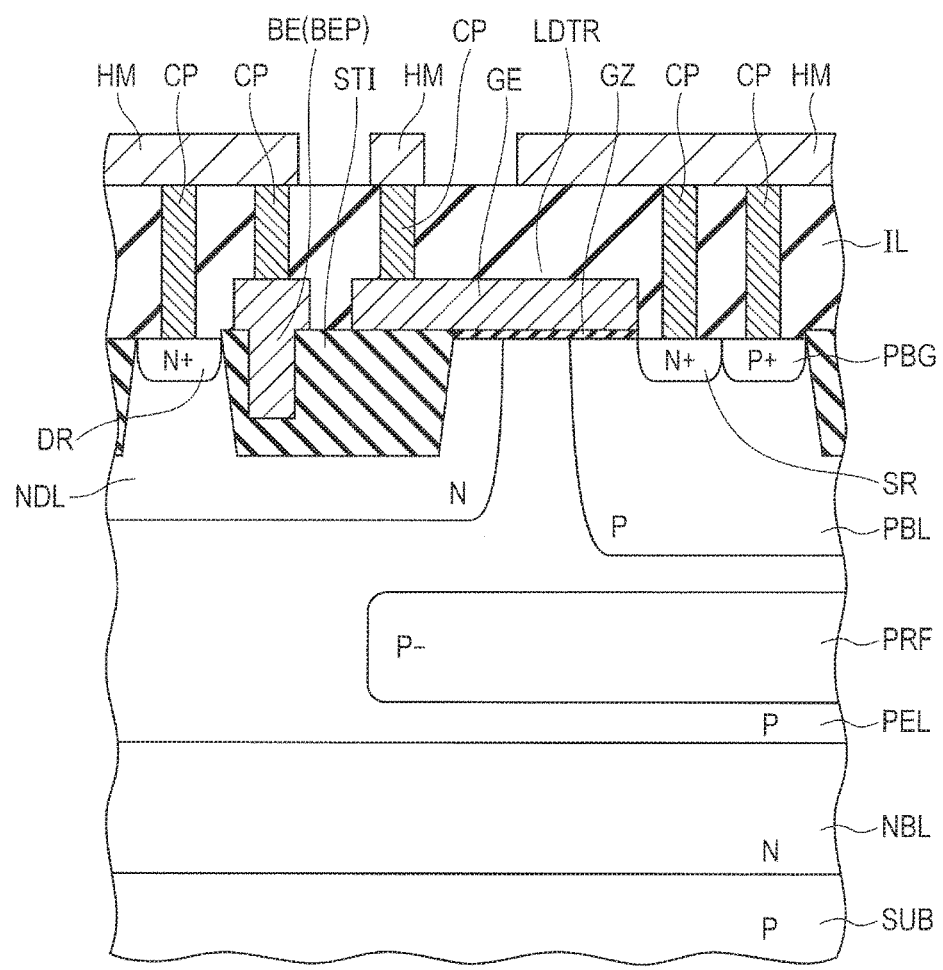
FIG. 62 is a second cross-sectional view for showing a variation of the structure of the semiconductor device in the seventh embodiment.
Figure 63:
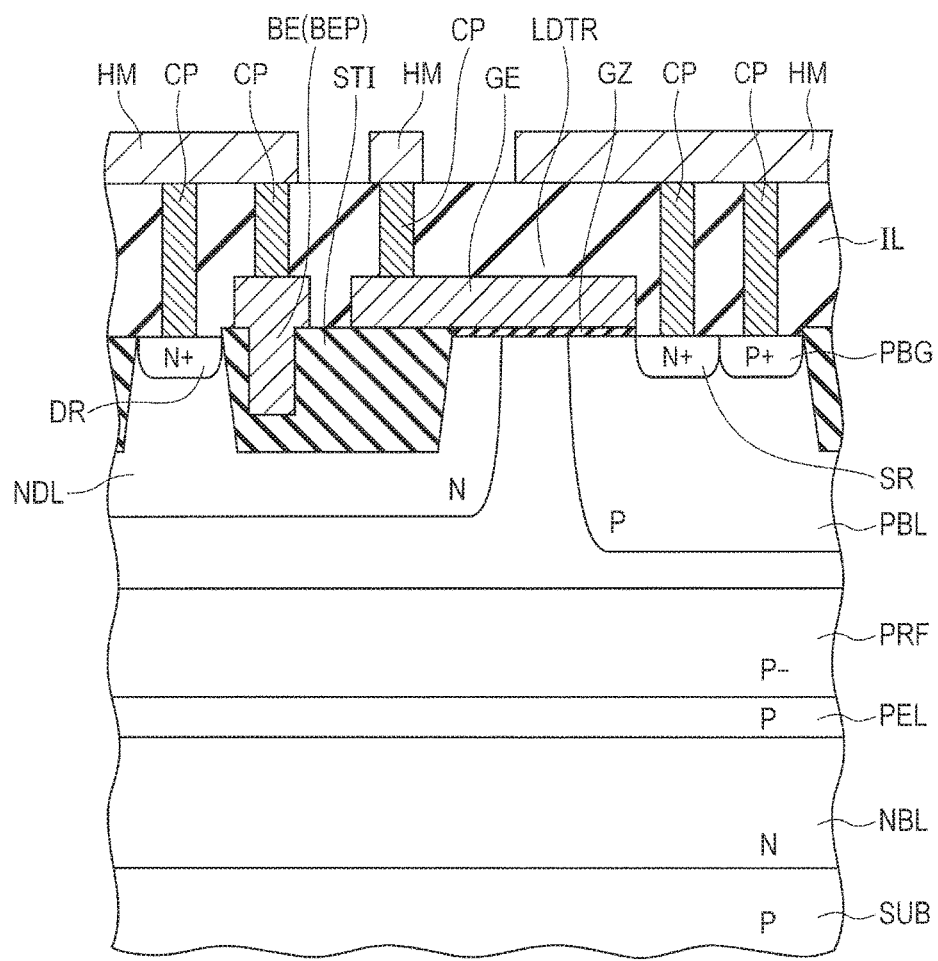
FIG. 63 is a third cross-sectional view for showing a variation of the structure of the semiconductor device in the seventh embodiment.

In addition to such a base structure, as shown in, for example, FIG. 61, a semiconductor device having no p-type RESURF layer formed may be employed. Such a semiconductor device has the RESURF effect only by an n-type buried layer NBL. Further, as shown in FIG. 62, a p-type RESURF layer PRF may be partially formed, and further the p-type RESURF layer PRF may be formed throughout a region where a lateral MOS transistor LDTR is formed as shown in FIG. 63. In these cases, the RESURF effect can be obtained by the p-type RESURF layer PRF.

Figure 64:
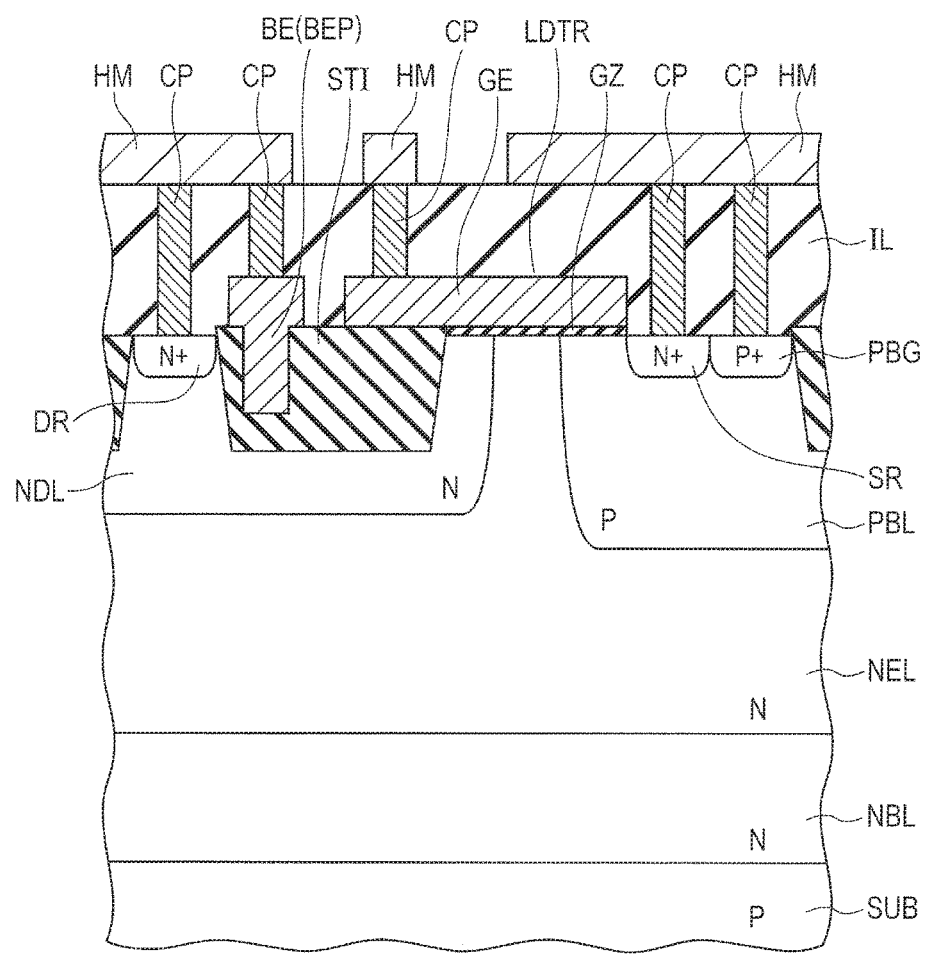
FIG. 64 is a fourth cross-sectional view for showing a variation of the structure of the semiconductor device in the seventh embodiment.
Figure 65:
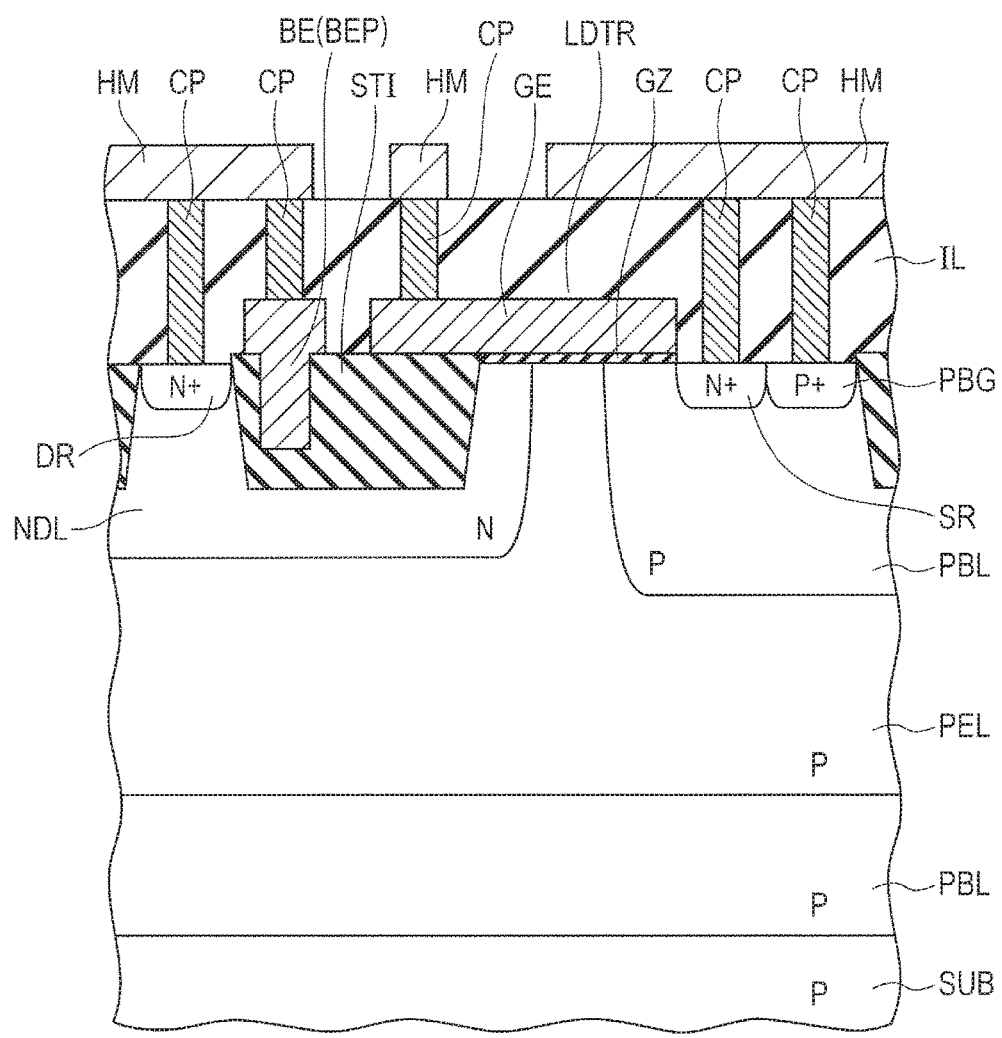
FIG. 65 is a fifth cross-sectional view for showing a variation of the structure of the semiconductor device in the seventh embodiment.

Further, as shown in FIG. 64, a semiconductor device having an n-type epitaxial layer NEL formed instead of a p-type epitaxial layer may be employed. In this case, low resistance can be expected. Further, as shown in FIG. 65, a semiconductor device having a p-type buried layer PBL formed instead of an n-type buried layer may be employed. In this case, it is possible to obtain the RESURF effect by the p-type buried layer PBL.

Figure 66:
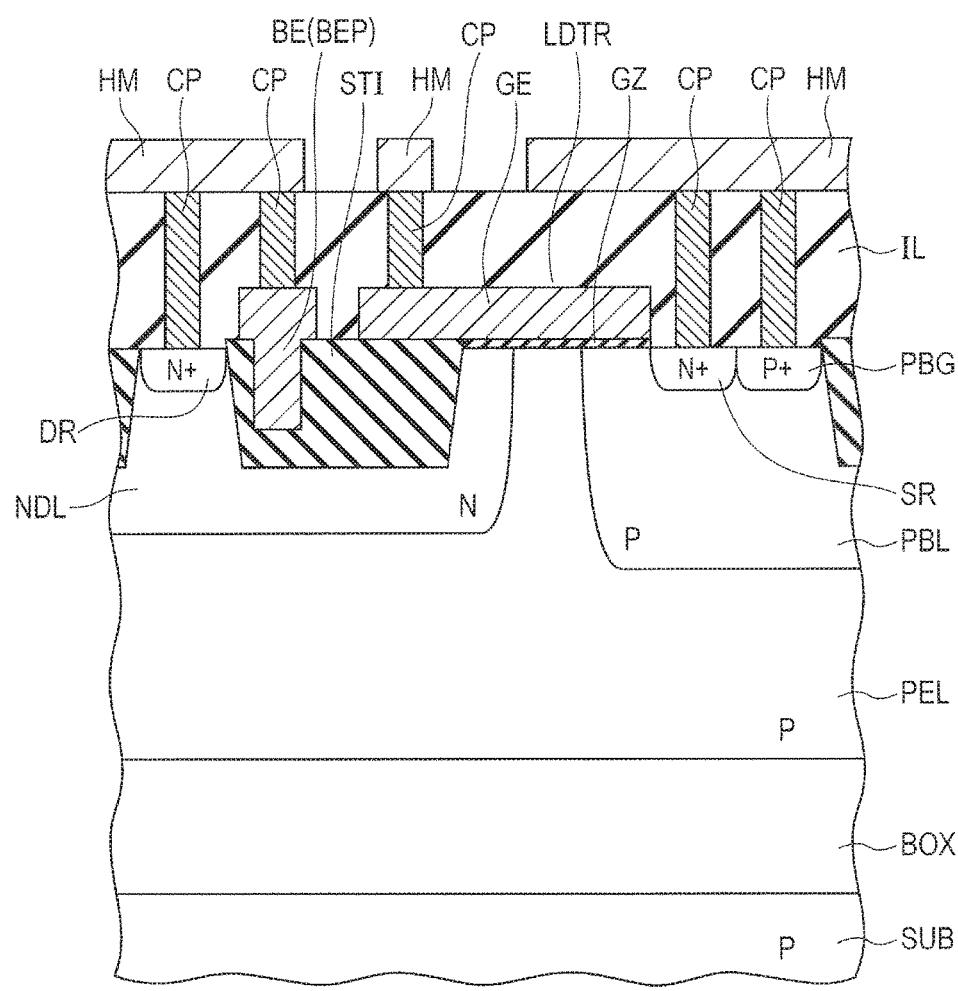
FIG. 66 is a sixth cross-sectional view for showing a variation of the structure of the semiconductor device in the seventh embodiment.
Figure 67:
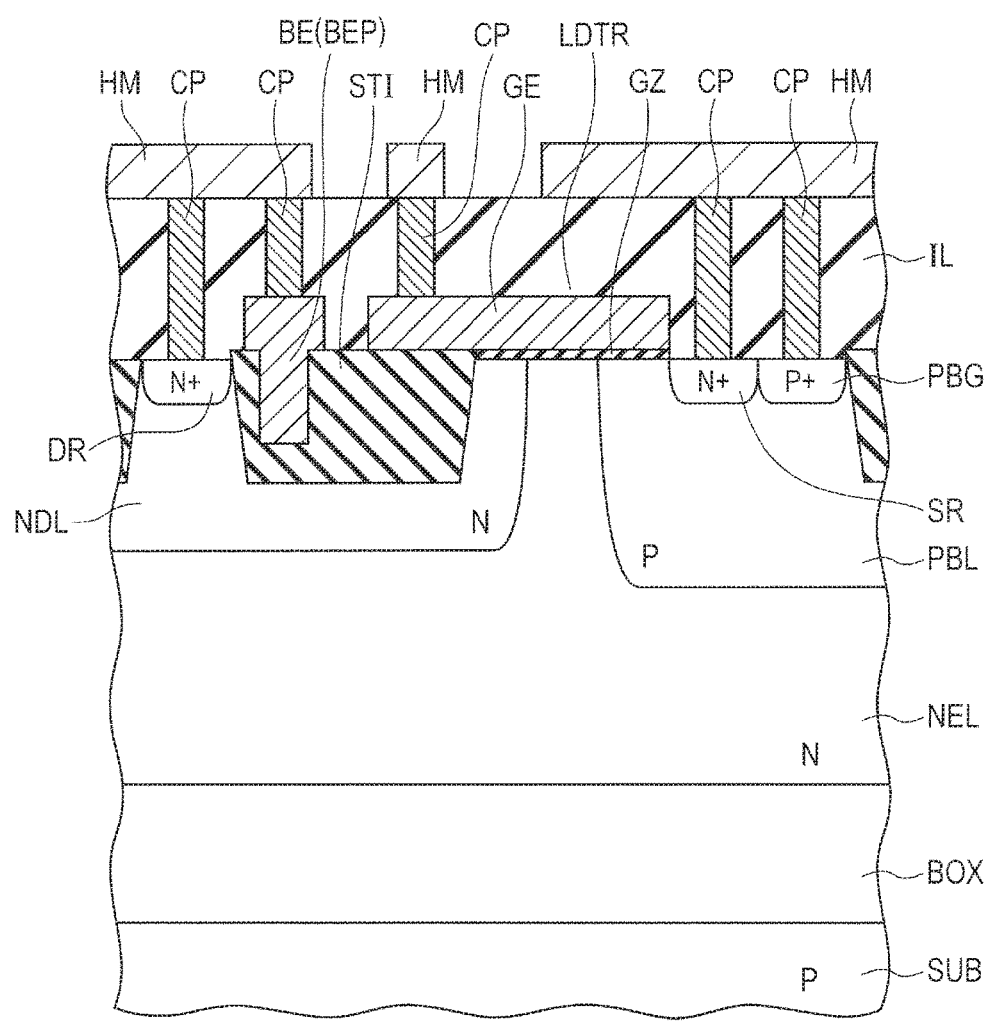
FIG. 67 is a seventh cross-sectional view for showing a variation of the structure of the semiconductor device in the seventh embodiment.
Figure 68:
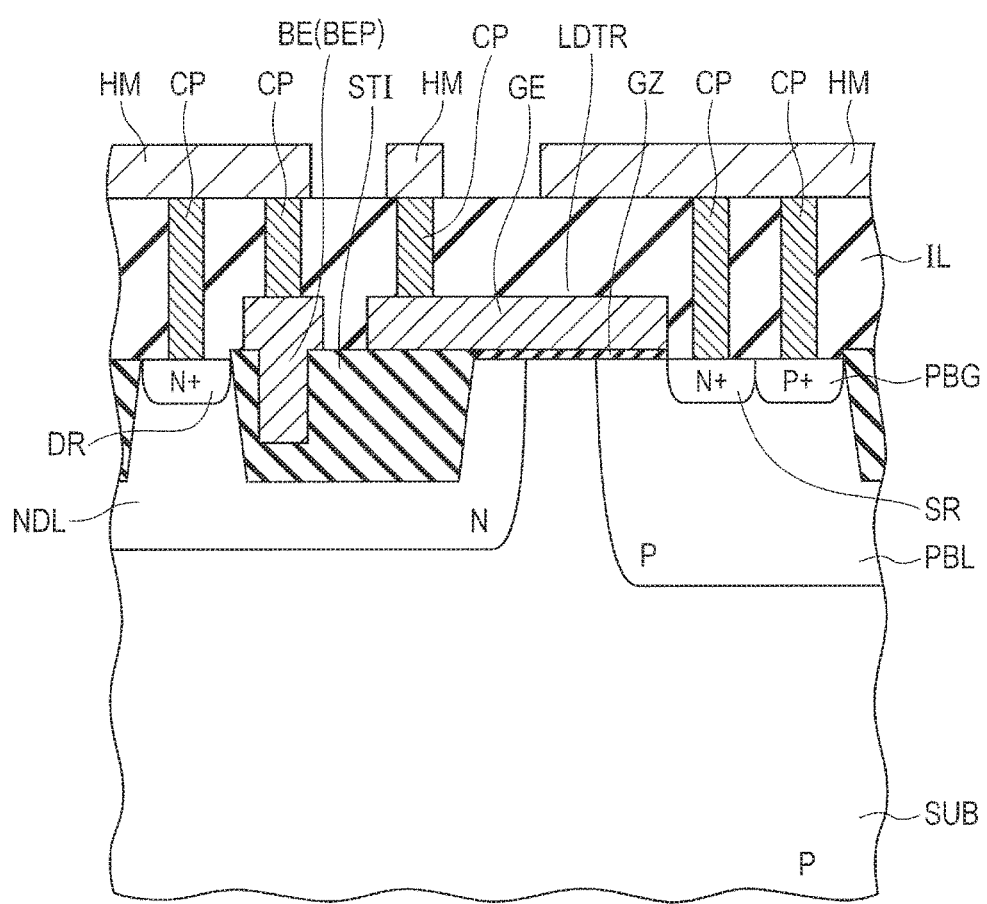
FIG. 68 is an eighth cross-sectional view for showing a variation of the structure of the semiconductor device in the seventh embodiment.

Further, as shown in FIG. 66, an SOI (Silicon On Insulator) substrate may be applied. In this case, a buried oxide film BOX is interposed between a semiconductor substrate SUB such as silicon and the p-type epitaxial layer PEL (silicon layer), and these can be completely and electrically isolated from each other by the buried oxide film BOX. Further, as shown in FIG. 67, a semiconductor device having the n-type epitaxial layer NEL formed instead of the p-type epitaxial layer may be employed. Further, as shown in FIG. 68, a semiconductor device in which the lateral MOS transistor LDTR is simply formed on a p-type semiconductor substrate SUB may be employed.

Figure 69:
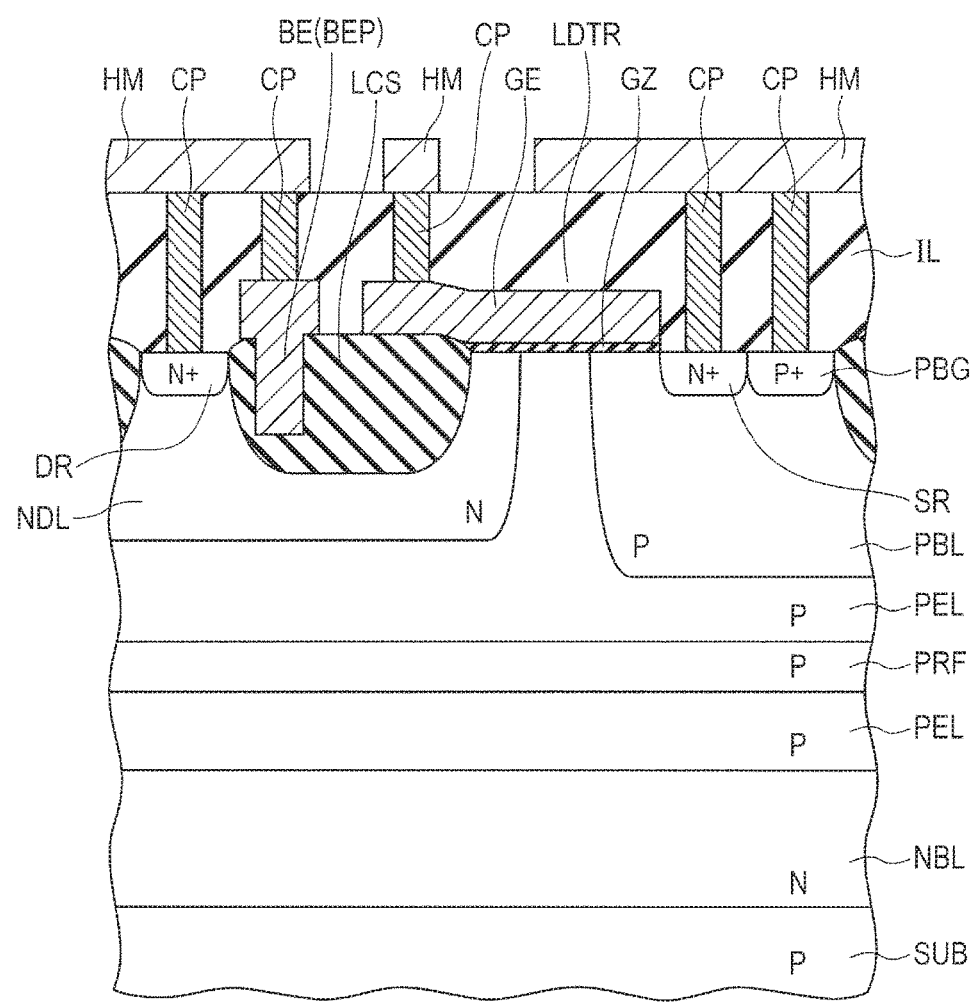
FIG. 69 is a ninth cross-sectional view for showing a variation of the structure of the semiconductor device in the seventh embodiment.

Further, as an isolation insulating film, an example of the isolation insulating film STI formed in the trench by the STI method has been described in each embodiment. However, as shown in FIG. 69, a semiconductor device in which a buried electrode BE is formed in an isolation insulating film LCS formed by the LOCOS (Local Oxidation Of Silicon) method may be employed.

Figure 70:
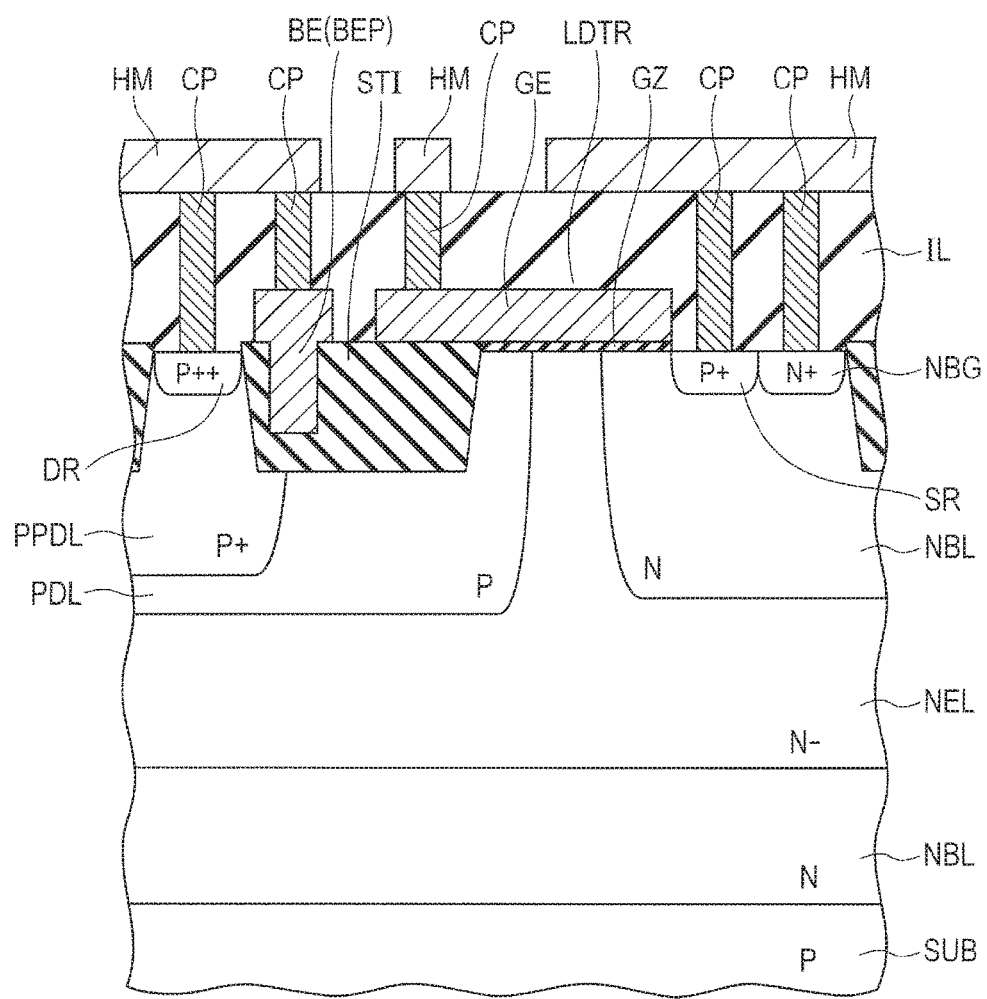
FIG. 70 is a tenth cross-sectional view for showing a variation of the structure of the semiconductor device in the seventh embodiment.

Further, as a lateral MOS transistor LDTR, an example of the n-channel-type lateral MOS transistor has been described in each embodiment. However, a p-channel-type lateral MOS transistor may be employed. In this case, as shown in FIG. 70, an n-type buried layer NBL and an n-type epitaxial layer NEL are formed on the surface of a p-type semiconductor substrate SUB. A p-type drain region DR and a p-type source region SR are formed in the n-type epitaxial layer NEL at a distance away from each other. An isolation insulating film STI is formed between the drain region DR and the source region SR. A buried electrode BE is formed in the isolation insulating film STI.

On the drain region DR side, formed are a p-type layer PPDL of P+ type and a p-type drift layer PDL of P+ type. On the source region SR side, formed are an n+ layer NBG and an n-type body layer NBL. It should be noted that the other configurations are the same as those of the semiconductor device shown in FIG. 2. Accordingly, the same signs are given to the same members, and the explanations thereof will not be repeated except where absolutely necessary.

Even in the case where the p-channel-type lateral MOS transistor is used as a lateral MOS transistor, the ON-breakdown voltage and the like can be improved by forming a desired buried electrode BE. Further, as similar to the case of the semiconductor device having the n-channel-type lateral MOS transistor formed, the base structure shown in each of FIG. 61 to FIG. 68 can be applied by, for example, applying an SOI substrate if necessary.

It should be noted that the semiconductor devices described in the respective embodiments can be variously combined with each other if necessary.

The invention achieved by the inventors has been described above in detail on the basis of the embodiments. However, it is obvious that the present invention is not limited to the embodiments, but can be variously changed without departing from the scope of the invention.

The above-described first and second embodiments include the following configurations.

(Additional Statement 1)

A semiconductor device including:
a semiconductor substrate having a primary surface;
a first-conductive-type first semiconductor layer that is formed over the primary surface of the semiconductor substrate;
a second-conductive-type drain region that is formed in the first semiconductor layer;
a second-conductive-type source region that is formed in the first semiconductor layer at a distance away from the drain region;
an isolation insulating film having a first thickness that is formed at a part of the first semiconductor layer located between the drain region and the source region;
a second-conductive-type drift layer that is formed from the surface of the first semiconductor layer up to a position deeper than the bottom of the isolation insulating film so as to surround the isolation insulating film and the drain region from the lateral and lower sides;
a gate electrode that is formed over a region located between the isolation insulating film and the source region and including a part serving as a channel;
an interlayer insulating film that is formed so as to cover the gate electrode; and
a contact plug that is formed to reach the inside of the isolation insulating film while penetrating the interlayer insulating film,
wherein the contact plug includes a buried part that is formed from the surface of the isolation insulating film up to a depth corresponding to a second thickness thinner than the first thickness.

(Additional Statement 2)

A manufacturing method of a semiconductor device including the steps of:
forming a first-conductive-type first semiconductor layer over the primary surface of a semiconductor substrate;
forming an isolation insulating film having a first thickness over the first semiconductor layer;
forming a second-conductive-type drift layer from the surface of the first semiconductor layer up to a position deeper than the bottom of the isolation insulating film so as to surround the isolation insulating film from the lateral and lower sides;
forming a gate electrode over the first semiconductor layer so as to extend from the isolation insulating film;
forming a second-conductive-type drain region at a part of the drift layer located on the side opposite to the buried electrode in the isolation insulating film and forming a second-conductive-type source region at a part of the first semiconductor layer located on the side opposite to the isolation insulating film in the gate electrode;
forming an interlayer insulating film so as to cover the gate electrode, the isolation insulating film, the drain region, and the source region;
forming a contact hole including an opening having a depth corresponding to a second thickness thinner than the first thickness from the surface of the isolation insulating film while penetrating the interlayer insulating film by etching the interlayer insulating film and the isolation insulating film; and
forming a contact plug in the contact hole,
wherein the step of forming a contact plug includes a step of forming a buried part in the opening.

Further, the sixth embodiment includes the following configuration.

(Additional Statement 3)

A manufacturing method of a semiconductor device including the steps of:
forming a first-conductive-type first semiconductor layer over the primary surface of a semiconductor substrate;
forming a first insulating film having a first thickness over the first semiconductor layer;
leaving and removing a part of the first insulating film having a thickness thinner than the first thickness located from the surface of the first insulating film up to the bottom of the first insulating film by etching the first insulating film;
forming a buried electrode at a part of the left first insulating film;
forming an isolation insulating film by forming a second insulating film over a part of the left first insulating film so as to cover the buried electrode;
forming a second-conductive-type drift layer from the surface of the first semiconductor layer up to a position deeper than the bottom of the isolation insulating film so as to surround the first insulating film from the lateral and lower sides;
forming a gate electrode over the first semiconductor layer so as to extend from the isolation insulating film; and
forming a second-conductive-type drain region at apart of the drift layer located on the side opposite to the gate electrode in the isolation insulating film and forming a second-conductive-type source region at a part of the first semiconductor layer located on the side opposite to the isolation insulating film in the gate electrode.

What is claimed is:
1. A semiconductor device including:
a semiconductor substrate having a primary surface;
a first-conductive-type first semiconductor layer that is formed over the primary surface of the semiconductor substrate;
a second-conductive-type drain region that is formed in the first semiconductor layer;
a second-conductive-type source region that is formed in the first semiconductor layer at a distance away from the drain region;
an isolation insulating film having a first thickness that is formed at a part of the first semiconductor layer located between the drain region and the source region;
a second-conductive-type drift layer that is formed from the surface of the first semiconductor layer up to a position deeper than the bottom of the isolation insulating film so as to surround the isolation insulating film and the drain region from the lateral and lower sides;
a gate electrode that is formed over a region located between the isolation insulating film and the source region and including a part serving as a channel;
an interlayer insulating film that is formed so as to cover the gate electrode; and
a contact plug that is formed to reach the inside of the isolation insulating film while penetrating the interlayer insulating film,
wherein the contact plug includes a buried part that is formed from the surface of the isolation insulating film up to a depth corresponding to a second thickness thinner than the first thickness.

2. The semiconductor device according to claim 1,
wherein the contact plug and the drain region are electrically coupled to each other, and
wherein a voltage same as that applied to the drain region is applied to the contact plug.

3. The semiconductor device according to claim 1,
wherein the contact plug is arranged in the isolation insulating film on the side where the part serving as the channel is located, and
wherein a voltage different from that applied to the drain region is applied to the contact plug.

4. The semiconductor device according to claim 3,
wherein provided is a voltage applying part that includes, at least, any one of a resistive element and a capacitive element and applies to the contact plug a voltage between a drain voltage applied to the drain region and a source voltage applied to the source region.

5. The semiconductor device according to claim 3,
wherein provided is a voltage applying part that includes, at least, any one of a resistive element and a capacitive element and applies to the contact plug a voltage between a gate voltage applied to the gate electrode and a voltage applied to the source region.

6. The semiconductor device according to claim 1,
wherein the drain region is formed so as to extend in a first direction over the surface of the first semiconductor layer,
wherein the isolation insulating film is formed so as to continuously surround the drain region over the surface of the first semiconductor layer; and
wherein the source region is formed so as to continuously surround the isolation insulating film over the surface of the first semiconductor layer.

7. The semiconductor device according to claim 6,
wherein the buried part of the contact plug is formed so as to continuously surround the drain region in the isolation insulating film.

8. The semiconductor device according to claim 6,
wherein the buried part of the contact plug is continuously formed along the first direction.

9. The semiconductor device according to claim 6,
wherein a plurality of buried parts of contact plugs is formed in the first direction at a distance away from each other.

10. The semiconductor device according to claim 6,
wherein a plurality of contact plugs is arranged in the first direction at a distance away from each other, and
wherein the gate electrode includes a part extending between the contact plugs that are adjacent to each other.

11. The semiconductor device according to claim 6,
wherein the contact plug includes a first contact part that applies a first voltage to the contact plug and is arranged at a part of the contact plug located on an end side of the drain region in the longitudinal direction, and
wherein a second contact part applies a second voltage to the gate electrode and is arranged at a part of the gate electrode located on another end side of the drain region in the longitudinal direction.

12. The semiconductor device according to claim 1,
wherein another gate electrode is formed over a part of the isolation insulating film located between the drain region and the contact plug and is electrically coupled to the gate electrode.

13. The semiconductor device according to claim 1,
wherein the contact plug includes:
a buried electrode first part; and
a buried electrode second part that is arranged on the side where the gate electrode is located relative to the buried electrode first part,
wherein a voltage same as a drain voltage applied to the drain region is applied to the buried electrode first part, and
wherein a voltage different from the drain voltage is applied to the buried electrode second part.

14. The semiconductor device according to claim 1,
wherein the buried part of the contact plug includes a part located immediately under the gate electrode.

15. The semiconductor device according to claim 1,
wherein a second-conductive-type buried layer is formed between the semiconductor substrate and the first semiconductor layer.

16. The semiconductor device according to claim 1,
wherein a first-conductive-type RESURF layer is formed in the first semiconductor layer.

17. The semiconductor device according to claim 1,
wherein a buried oxide film is formed between the semiconductor substrate and the first semiconductor layer.

18. The semiconductor device according to claim 1,
wherein the isolation insulating film is formed in a trench provided in the first semiconductor layer.

19. A manufacturing method of a semiconductor device including:
forming a first-conductive-type first semiconductor layer over a primary surface of a semiconductor substrate;
forming an isolation insulating film having a first thickness over the first semiconductor layer;
forming a second-conductive-type drift layer from a surface of the first semiconductor layer up to a position deeper than the bottom of the isolation insulating film so as to surround the isolation insulating film from the lateral and lower sides;
forming a gate electrode over the first semiconductor layer so as to extend from the isolation insulating film;
forming a second-conductive-type drain region at a part of the drift layer located in the isolation insulating film and forming a second-conductive-type source region at a part of the first semiconductor layer located on the side opposite to the isolation insulating film in the gate electrode;
forming an interlayer insulating film so as to cover the gate electrode, the isolation insulating film, the drain region, and the source region;
forming a contact hole including an opening having a depth corresponding to a second thickness thinner than the first thickness from a surface of the isolation insulating film while penetrating the interlayer insulating film by etching the interlayer insulating film and the isolation insulating film; and
forming a contact plug in the contact hole,
wherein the step of forming a contact plug includes a step of forming a buried part in the opening.

20. A manufacturing method of a semiconductor device including the steps of:
forming a first-conductive-type first semiconductor layer over a primary surface of a semiconductor substrate;
forming a first insulating film having a first thickness over the first semiconductor layer;
removing a part of the first insulating film to leave a part of the first insulating film having a thickness thinner than the first thickness located from a surface of the first insulating film up to the bottom of the first insulating film by etching the first insulating film;

forming a buried electrode at a part of the left first insulating film;

forming an isolation insulating film by forming a second insulating film over a part of the left first insulating film so as to cover the buried electrode;

forming a second-conductive-type drift layer from a surface of the first semiconductor layer up to a position deeper than the bottom of the isolation insulating film so as to surround the first insulating film from the lateral and lower sides;

forming a gate electrode over the first semiconductor layer so as to extend from the isolation insulating film; and forming a second-conductive-type drain region at a part of the drift layer located on the side opposite to the gate electrode in the isolation insulating film and forming a second-conductive-type source region at a part of the first semiconductor layer located on the side opposite to the isolation insulating film in the gate electrode.

* * * * *